(12) United States Patent
Koezuka et al.

(10) Patent No.: US 10,050,153 B2
(45) Date of Patent: Aug. 14, 2018

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Junichi Koezuka, Tochigi (JP);
Yukinori Shima, Tatebayashi (JP);
Suzunosuke Hiraishi, Tochigi (JP);
Kenichi Okazaki, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/704,070

(22) Filed: Sep. 14, 2017

(65) Prior Publication Data

US 2018/0026139 A1    Jan. 25, 2018

Related U.S. Application Data

(62) Division of application No. 14/154,799, filed on Jan. 14, 2014, now Pat. No. 9,768,314.

(30) Foreign Application Priority Data

Jan. 21, 2013   (JP) .................................. 2013-008628
Mar. 15, 2013   (JP) .................................. 2013-053192

(51) Int. Cl.
*H01L 29/786* (2006.01)
*H01L 29/66* (2006.01)
*H01L 29/423* (2006.01)

(52) U.S. Cl.
CPC .... *H01L 29/7869* (2013.01); *H01L 29/42384* (2013.01); *H01L 29/66969* (2013.01);
(Continued)

(58) Field of Classification Search
CPC ......... H01L 21/02123; H01L 21/02164; H01L 21/02205; H01L 21/02214; H01L 21/02219
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Mohammad Choudhry
(74) *Attorney, Agent, or Firm* — Robinson Intellectual Property Law Office; Eric J. Robinson

(57) ABSTRACT

To reduce defects in an oxide semiconductor film in a semiconductor device. To improve electrical characteristics of and reliability in the semiconductor device including an oxide semiconductor film. A method for manufacturing a semiconductor device includes the steps of forming a gate electrode and a gate insulating film over a substrate, forming an oxide semiconductor film over the gate insulating film, forming a pair of electrodes over the oxide semiconductor film, forming a first oxide insulating film over the oxide semiconductor film and the pair of electrodes by a plasma CVD method in which a film formation temperature is 280° C. or higher and 400° C. or lower, forming a second oxide insulating film over the first oxide insulating film, and (Continued)

performing heat treatment at a temperature of 150° C. to 400° C. inclusive, preferably 300° C. to 400° C. inclusive, further preferably 320° C. to 370° C. inclusive.

20 Claims, 53 Drawing Sheets

(52) U.S. Cl.
CPC .. *H01L 29/78606* (2013.01); *H01L 29/78618* (2013.01); *H01L 29/78633* (2013.01); *H01L 29/78696* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,012,794 B2 | 9/2011 | Ye |
| 8,101,949 B2 | 1/2012 | Ye |
| 8,241,949 B2 | 8/2012 | Miyanaga |
| 8,258,511 B2 | 9/2012 | Ye |
| 8,349,669 B2 | 1/2013 | Ye |
| 8,435,843 B2 | 5/2013 | Ye |
| 8,461,007 B2 | 6/2013 | Yamazaki |
| 8,530,289 B2 | 9/2013 | Yamazaki |
| 8,546,225 B2 | 10/2013 | Yamazaki |
| 8,637,347 B2 | 1/2014 | Oikawa et al. |
| 8,709,922 B2 | 4/2014 | Koezuka et al. |
| 8,723,176 B2 | 5/2014 | Yamazaki |
| 8,748,240 B2 | 6/2014 | Yamazaki |
| 8,809,132 B2 | 8/2014 | Ye |
| 8,809,154 B2 | 8/2014 | Koezuka et al. |
| 8,828,811 B2 | 9/2014 | Yamazaki |
| 8,865,534 B2 | 10/2014 | Yamazaki |
| 8,916,424 B2 | 12/2014 | Isobe et al. |
| 8,936,963 B2 | 1/2015 | Ohara et al. |
| 8,945,982 B2 | 2/2015 | Yamazaki |
| 8,952,378 B2 | 2/2015 | Miyanaga |
| 8,956,912 B2 | 2/2015 | Yamazaki |
| 8,999,773 B2 | 4/2015 | Hanaoka et al. |
| 9,006,024 B2 | 4/2015 | Akimoto |
| 9,006,733 B2 | 4/2015 | Yamazaki |
| 9,012,913 B2 | 4/2015 | Noda et al. |
| 9,048,265 B2 | 6/2015 | Hondo et al. |
| 9,059,295 B2 | 6/2015 | Yamazaki |
| 9,153,436 B2 | 10/2015 | Yamazaki et al. |
| 9,240,492 B2 | 1/2016 | Yamazaki |
| 9,263,259 B2 | 2/2016 | Yamazaki et al. |
| 9,276,121 B2 | 3/2016 | Yamazaki |
| 9,287,117 B2 | 3/2016 | Yamazaki et al. |
| 9,287,411 B2 | 3/2016 | Koezuka et al. |
| 9,293,589 B2 | 3/2016 | Yamazaki et al. |
| 9,330,909 B2 | 5/2016 | Yamazaki et al. |
| 9,349,593 B2 | 5/2016 | Yamazaki |
| 9,349,849 B2 | 5/2016 | Tanaka |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0233847 A1 | 9/2010 | Ohara et al. |
| 2011/0003427 A1* | 1/2011 | Sasaki ............... H01L 29/78606 438/104 |
| 2011/0079778 A1 | 4/2011 | Yamazaki et al. |
| 2011/0092017 A1 | 4/2011 | Akimoto et al. |
| 2011/0101335 A1 | 5/2011 | Yamazaki et al. |

(56) References Cited

U.S. PATENT DOCUMENTS

| | | |
|---|---|---|
| 2011/0217815 A1 | 9/2011 | Honda et al. |
| 2011/0233542 A1 | 9/2011 | Yamazaki et al. |
| 2011/0240991 A1 | 10/2011 | Yamazaki |
| 2011/0240994 A1 | 10/2011 | Yamazaki |
| 2011/0281394 A1 | 11/2011 | Yamazaki |
| 2011/0303914 A1 | 12/2011 | Yamazaki |
| 2012/0001170 A1 | 1/2012 | Yamazaki |
| 2012/0175608 A1 | 7/2012 | Yamazaki |
| 2012/0175610 A1 | 7/2012 | Yamazaki |
| 2012/0231580 A1 | 9/2012 | Yamazaki et al. |
| 2012/0231581 A1 | 9/2012 | Yamazaki et al. |
| 2012/0248433 A1 | 10/2012 | Nakano et al. |
| 2012/0286261 A1 | 11/2012 | Sasagawa et al. |
| 2012/0319175 A1 | 12/2012 | Endo et al. |
| 2013/0075735 A1 | 3/2013 | Watanabe et al. |
| 2013/0092929 A1 | 4/2013 | Okazaki et al. |
| 2013/0119373 A1 | 5/2013 | Yamazaki |
| 2013/0126861 A1 | 5/2013 | Tanaka et al. |
| 2013/0157422 A1 | 6/2013 | Yamazaki |
| 2013/0161610 A1 | 6/2013 | Yamazaki |
| 2013/0187150 A1 | 7/2013 | Yamazaki et al. |
| 2013/0187153 A1 | 7/2013 | Yamazaki et al. |
| 2013/0200365 A1 | 8/2013 | Yamazaki |
| 2013/0200375 A1 | 8/2013 | Yamazaki |
| 2013/0264563 A1 | 10/2013 | Okazaki et al. |
| 2013/0267068 A1 | 10/2013 | Hanaoka et al. |
| 2013/0270549 A1 | 10/2013 | Okazaki et al. |
| 2013/0270563 A1 | 10/2013 | Yamazaki |
| 2014/0001466 A1 | 1/2014 | Sasaki et al. |
| 2014/0001467 A1 | 1/2014 | Yamazaki et al. |
| 2014/0021467 A1 | 1/2014 | Koezuka et al. |
| 2014/0042433 A1 | 2/2014 | Yamazaki |
| 2014/0042434 A1 | 2/2014 | Yamazaki |
| 2014/0103337 A1 | 4/2014 | Yamazaki et al. |
| 2014/0106504 A1 | 4/2014 | Yamazaki et al. |
| 2014/0110705 A1 | 4/2014 | Koezuka et al. |
| 2014/0110707 A1 | 4/2014 | Koezuka et al. |
| 2014/0110708 A1 | 4/2014 | Koezuka et al. |
| 2014/0113405 A1 | 4/2014 | Tsubuku et al. |
| 2014/0175435 A1 | 6/2014 | Yamazaki et al. |
| 2014/0175436 A1 | 6/2014 | Yamazaki |
| 2015/0144947 A1 | 5/2015 | Miyanaga |
| 2015/0311347 A1 | 10/2015 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2010-239131 A | 10/2010 |
| JP | 2011-040731 A | 2/2011 |
| JP | 2011-527108 | 10/2011 |
| JP | 2011-228689 A | 11/2011 |
| WO | WO-2004/114391 | 12/2004 |
| WO | WO-2010/002608 | 1/2010 |
| WO | WO-2010/002803 | 1/2010 |
| WO | WO-2010/002807 | 1/2010 |
| WO | WO-2011/007682 | 1/2011 |
| WO | WO-2011/122363 | 10/2011 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Tehnical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

(56) References Cited

OTHER PUBLICATIONS

Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.
Kikuchi.H et al., "39.1:Invited Paper:Optically Isotropic Nanostructured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide $InGaO_3(ZnO)_m$ (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO ($Ga_2O_3$—$In_2O_3$—ZnO)TFT", SID Digest '08 : SID International Symposium Digest of Technical Papers, May 20, 2008, vol. 39, pp. 633-636.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

(56) References Cited

OTHER PUBLICATIONS

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Taiwanese Office Action (Application No. 103101162) dated Jun. 22, 2017.

\* cited by examiner

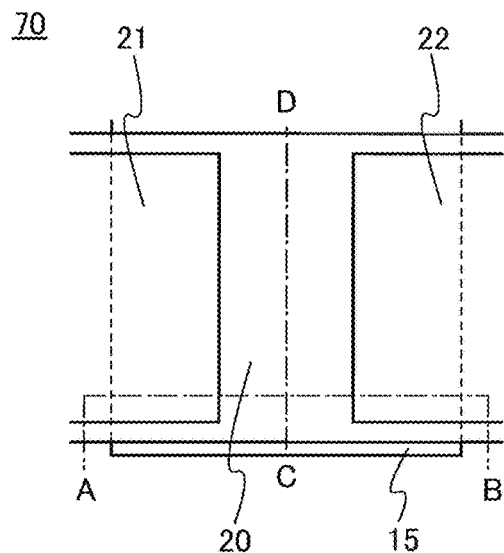
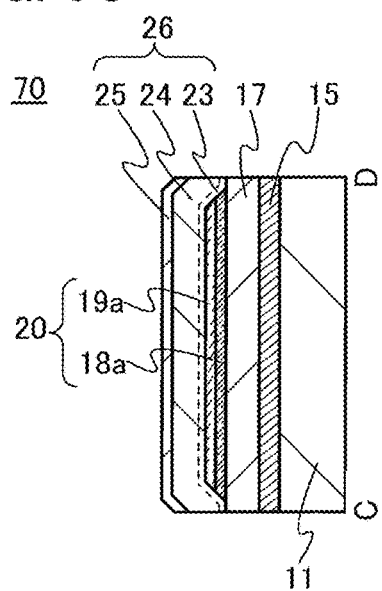
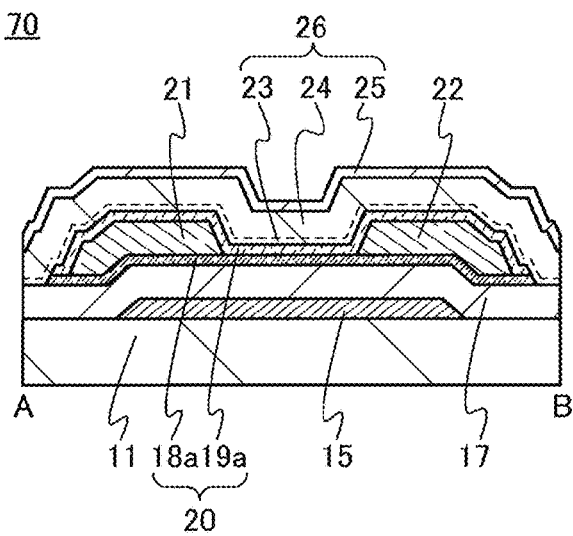

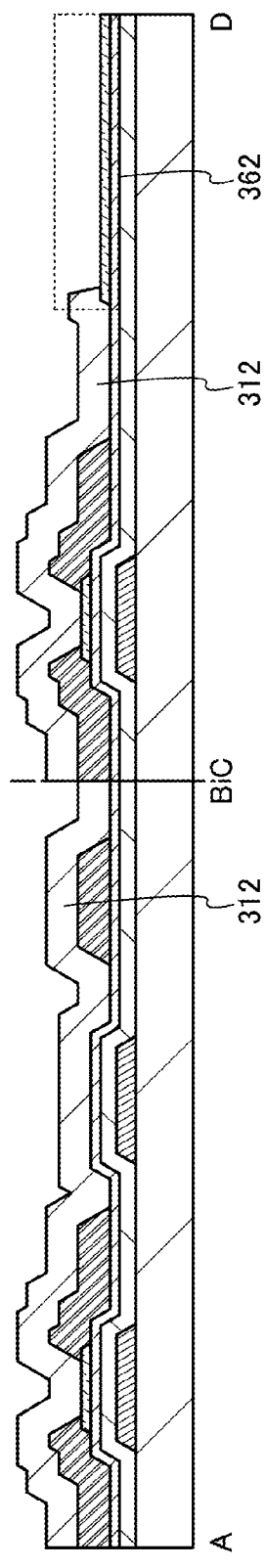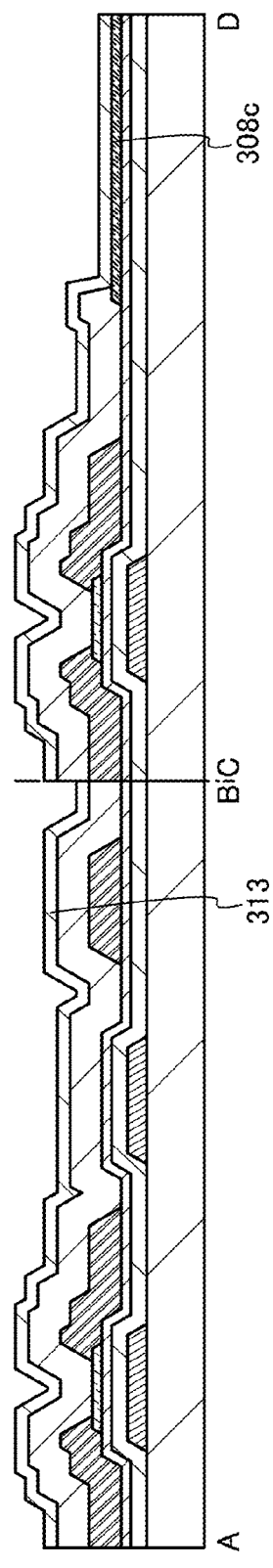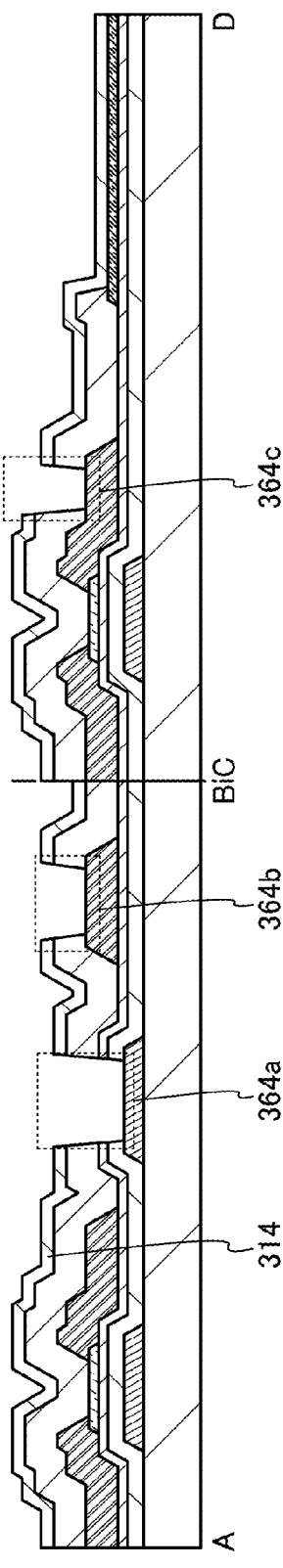

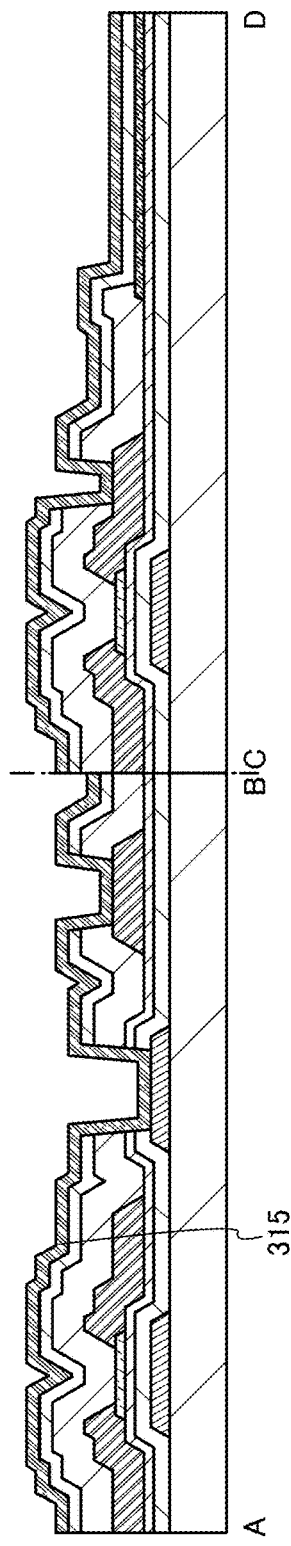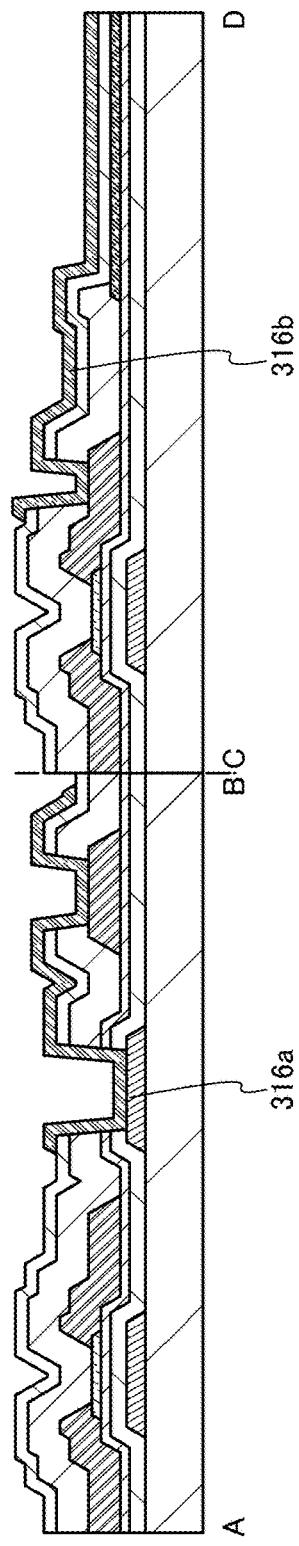

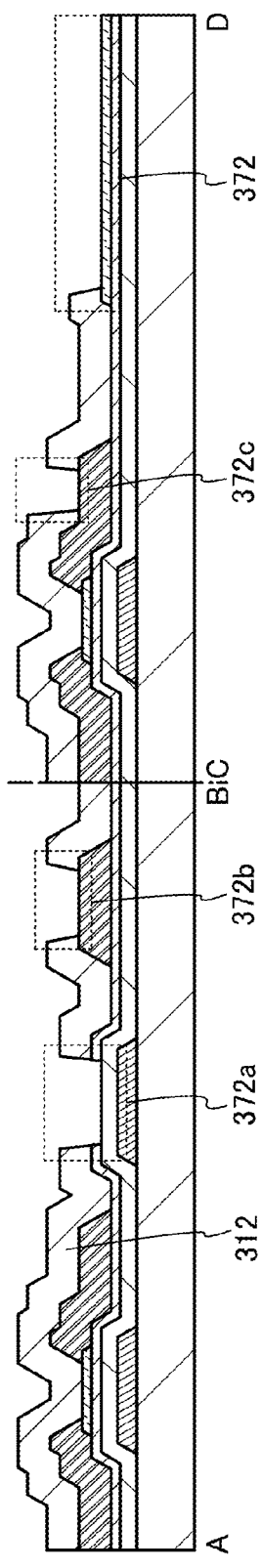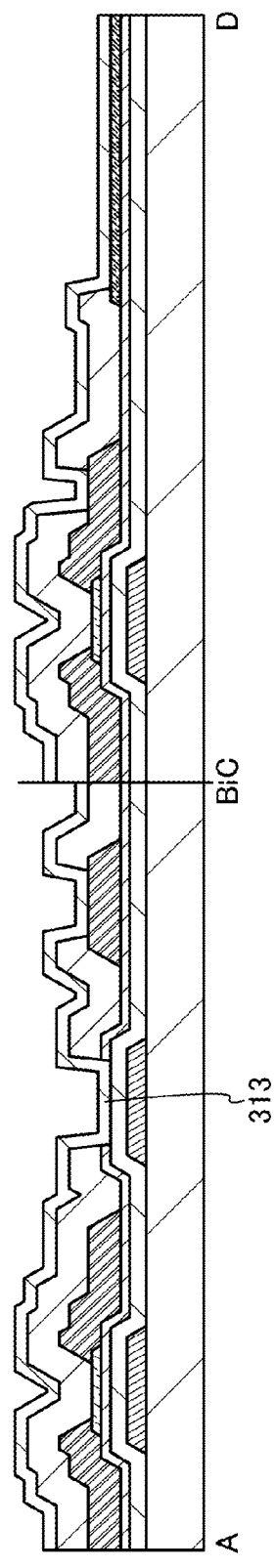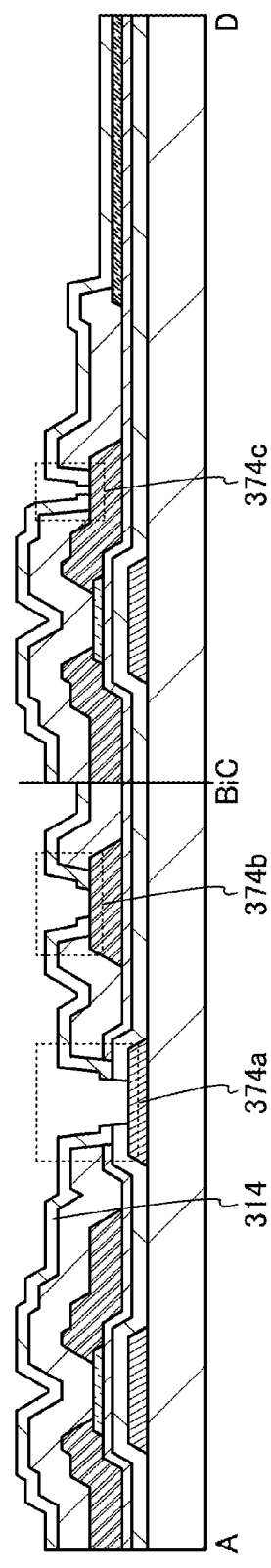

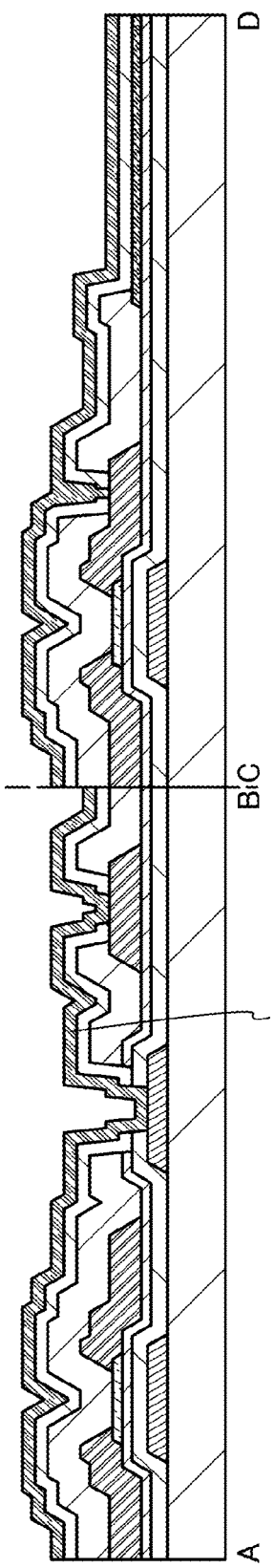
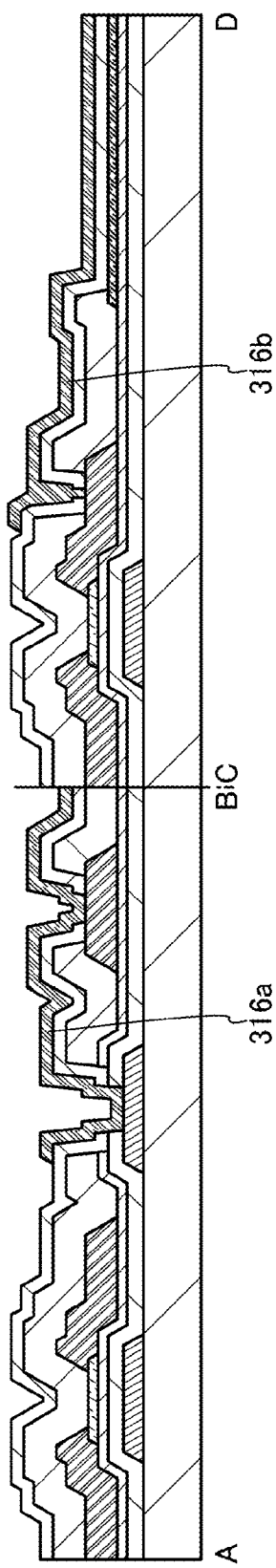
FIG. 26A
FIG. 26B

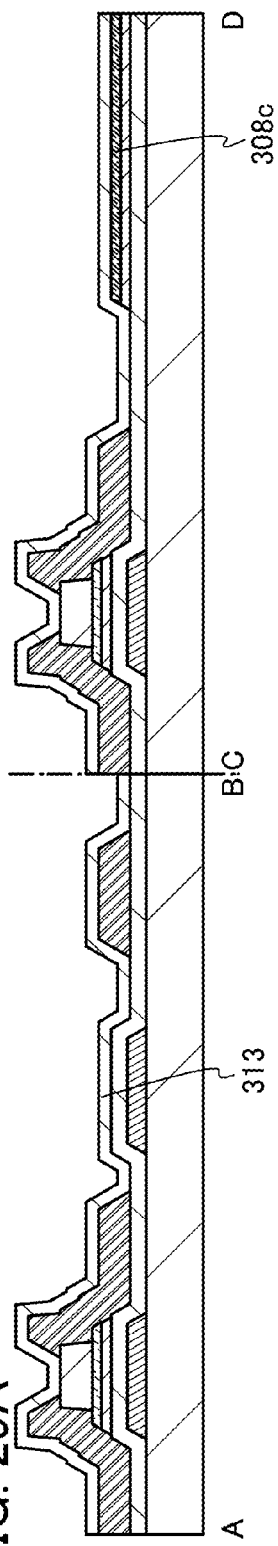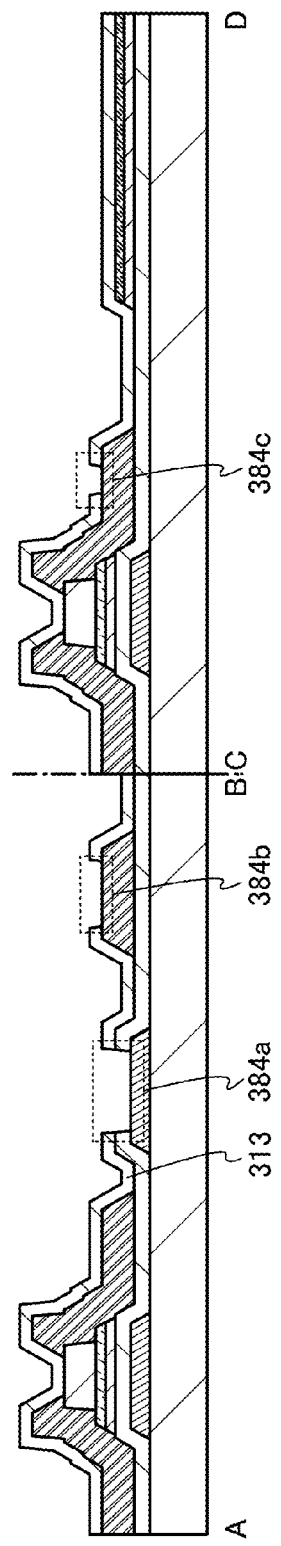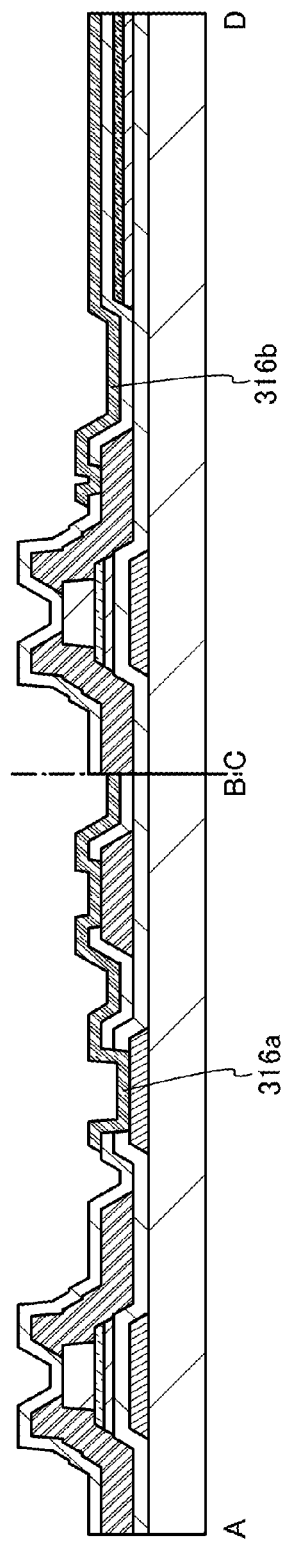

nc-OS

In case of non-touching input voltage waveform output current waveform

In case of touching input voltage waveform output current waveform writing period detecting period FIG. 39A
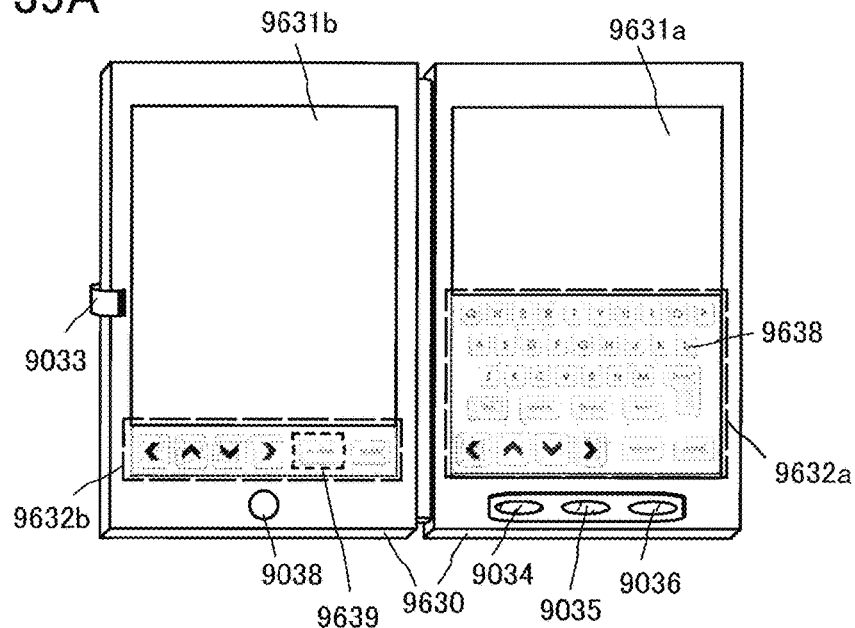
FIG. 39B
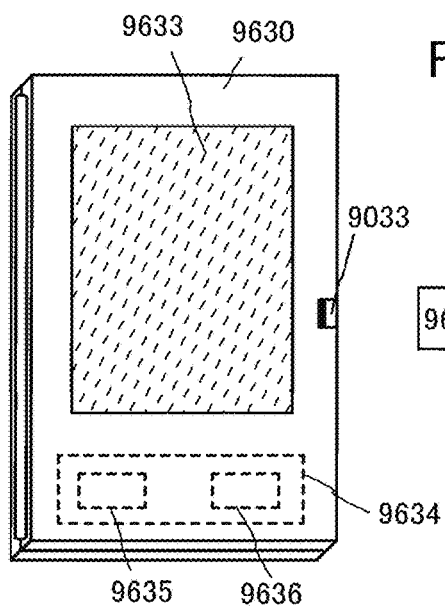
FIG. 39C Determinate quantity of OS, before heating treatment Determinate quantity of OS, after heating treatment Determinate quantity of P1, before heating treatment Determinate quantity of P1, after heating treatment

METHOD FOR MANUFACTURING SEMICONDUCTOR DEVICE

BACKGROUND OF THE INVENTION

1. Field of the Invention

The present invention relates to an object, a method, or a manufacturing method. The present invention relates to a process, a machine, manufacture, or a composition of matter. In particular, the present invention relates to, for example, a semiconductor device, a display device, a light-emitting device, a power storage device, a driving method thereof, or a manufacturing method thereof. In particular, the present invention relates to a semiconductor device including an oxide semiconductor, a display device including an oxide semiconductor, or a light-emitting device including an oxide semiconductor, for example. In particular, the present invention relates to, for example, a semiconductor device including a transistor and a method for manufacturing the semiconductor device.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

In recent years, attention has been drawn to a technique in which, instead of a silicon semiconductor, a metal oxide exhibiting semiconductor characteristics is used for transistors. Note that in this specification, a metal oxide exhibiting semiconductor characteristics is referred to as an oxide semiconductor.

For example, a technique is disclosed in which a transistor is manufactured using zinc oxide or an In—Ga—Zn-based oxide as an oxide semiconductor and the transistor is used as a switching element or the like of a pixel of a display device (see Patent Documents 1 and 2).

REFERENCES

Patent Documents

[Patent Document 1] Japanese Published Patent Application No. 2007-123861
[Patent Document 2] Japanese Published Patent Application No. 2007-096055

SUMMARY OF THE INVENTION

In a transistor including an oxide semiconductor film, a large amount of oxygen vacancies in the oxide semiconductor film cause poor electrical characteristics of the transistor and cause an increase in the amount of change in electrical characteristics of the transistor, typically the threshold voltage due to a change over time or a stress test (e.g., a bias-temperature (BT) stress test).

Further, not only vacancies but also impurities, typically impurities such as silicon or carbon which is a constituent element of the insulating film, cause poor electrical characteristics of the transistor when a large amount of the impurities is included in the oxide semiconductor film.

Thus, an object of one embodiment of the present invention is to reduce defects in an oxide semiconductor film of a semiconductor device or the like including the oxide semiconductor film. Another object of one embodiment of the present invention is to reduce the impurity concentration in an oxide semiconductor film of a semiconductor device or the like including the oxide semiconductor film. Another object of one embodiment of the present invention is to improve electrical characteristics of a semiconductor device or the like including an oxide semiconductor film. Another object of one embodiment of the present invention is to improve reliability of a semiconductor device or the like including an oxide semiconductor film. Another object of one embodiment of the present invention is to provide a semiconductor device or the like with low off-state current. Another object of one embodiment of the present invention is to provide a semiconductor device or the like with low power consumption. Another object of one embodiment of the present invention is to provide a display device or the like capable of causing less eyestrain. Another object of one embodiment of the present invention is to provide a semiconductor device or the like including a transparent semiconductor film. Another object of one embodiment of the present invention is to provide a novel semiconductor device or the like. Another object of one embodiment of the present invention is to provide a semiconductor device or the like having excellent characteristics. Note that the descriptions of these problems do not disturb the existence of other problems. Note that in one embodiment of the present invention, there is no need to achieve all the objects. Other objects will be apparent from and can be derived from the description of the specification, the drawings, the claims, and the like.

One embodiment of the present invention is a method for manufacturing a semiconductor device which includes the steps of forming a gate electrode and a gate insulating film over a substrate, forming an oxide semiconductor film over the gate insulating film, forming a pair of electrodes in contact with the oxide semiconductor film without performing heat treatment, forming a first oxide insulating film over the oxide semiconductor film and the pair of electrodes by a plasma CVD method in which a film formation temperature is higher than or equal to 280° C. and lower than or equal to 400° C., forming a second oxide insulating film over the first oxide insulating film, and performing heat treatment at a temperature higher than or equal to 150° C. and lower than or equal to 400° C., preferably higher than or equal to 300° C. and lower than or equal to 400° C., more preferably higher than or equal to 320° C. and lower than or equal to 370° C.

Note that the first oxide insulating film can be formed in such a manner that the pressure in a treatment chamber is set to be greater than or equal to 100 Pa and less than or equal to 250 Pa with introduction of a source gas into the treatment chamber and a high-frequency power is supplied to an electrode provided in the treatment chamber.

Further, the second oxide insulating film can be formed in such a manner that the substrate placed in the treatment chamber which is vacuum-evacuated is held at a temperature higher than or equal to 180° C. and lower than or equal to 280° C., the pressure in the treatment chamber is set to be greater than or equal to 100 Pa and less than or equal to 250 Pa with introduction of a source gas into the treatment chamber, and a high-frequency power greater than or equal to 0.17 W/cm$^2$ and less than or equal to 0.5 W/cm$^2$ is supplied to the electrode provided in the treatment chamber.

Further, a silicon oxide film or a silicon oxynitride film is formed as each of the first oxide insulating film and the second oxide insulating film with a deposition gas containing silicon and an oxidizing gas as a source gas.

In one embodiment of the present invention, defects in an oxide semiconductor film of a semiconductor device including the oxide semiconductor film can be reduced. Further, in one embodiment of the present invention, impurities in an oxide semiconductor film of a semiconductor device or the like including the oxide semiconductor film can be reduced. Further, in one embodiment of the present invention, the electrical characteristics of a semiconductor device including an oxide semiconductor film can be improved. Further, in one embodiment of the present invention, reliability of a semiconductor device or the like including an oxide semiconductor film can be improved. Further, in one embodiment of the present invention, a semiconductor device or the like with low off-state current can be provided. Further, in one embodiment of the present invention, a semiconductor device or the like with low power consumption can be provided. Further, in one embodiment of the present invention, a display device or the like capable of causing less eyestrain can be provided. Further, in one embodiment of the present invention, a semiconductor device or the like including a transparent semiconductor film can be provided. Further, in one embodiment of the present invention, a novel semiconductor device or the like can be provided. Further, in one embodiment of the present invention, a semiconductor device or the like having excellent characteristics can be provided.

BRIEF DESCRIPTION OF THE DRAWINGS

FIGS. 9A to 9C are a top view and cross-sectional views illustrating one embodiment of a transistor.

FIGS. 20A to 20C are cross-sectionals views illustrating one embodiment of a method for manufacturing a semiconductor device.

FIGS. 21A and 21B are cross-sectionals views illustrating one embodiment of a method for manufacturing a semiconductor device.

FIGS. 25A to 25C are cross-sectionals views illustrating one embodiment of a method for manufacturing a semiconductor device.

FIGS. 26A and 26B are cross-sectional views illustrating one embodiment of a method for manufacturing a semiconductor device.

FIGS. 29A to 29C are cross-sectionals views illustrating one embodiment of a method for manufacturing a semiconductor device.

FIGS. 39A to 39C illustrate an electronic device including a semiconductor device of one embodiment of the present invention;

DETAILED DESCRIPTION OF THE INVENTION

Figure 1A:
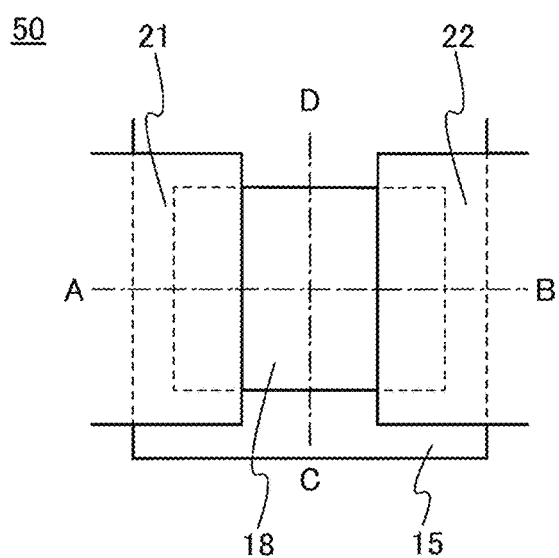
FIGS. 1A to 1C are a top view and cross-sectional views illustrating one embodiment of a transistor.

Embodiments of the present invention will be described in detail below with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography process, a mask formed in the photolithography process is removed after the etching step.

[Embodiment 1]

In this embodiment, a semiconductor device which is one embodiment of the present invention and a manufacturing method thereof are described with reference to drawings.

In a transistor including an oxide semiconductor film, oxygen vacancies are given as an example of a defect which leads to poor electrical characteristics of the transistor. For example, the threshold voltage of a transistor including an oxide semiconductor film which contains oxygen vacancies in the film easily shifts in the negative direction, and such a transistor tends to have normally-on characteristics. This is because electric charges are generated owing to oxygen vacancies in the oxide semiconductor film and the resistance is thus reduced. The transistor having normally-on characteristics causes various problems in that malfunction is likely to be caused when in operation and that power consumption is increased when not in operation. Further, there is a problem in that the amount of change in electrical characteristics, typically in threshold voltage, of the transistor is increased by change over time or a stress test.

One factor in generating oxygen vacancies is damage caused in a manufacturing process of a transistor. For example, when an insulating film, a conductive film, or the like is formed over an oxide semiconductor film by a plasma CVD method or a sputtering method, the oxide semiconductor film might be damaged depending on formation conditions thereof.

Another factor in generating oxygen vacancies is release of oxygen from the oxide semiconductor film due to heat treatment. For example, there is a case where heat treatment is performed to remove impurities such as hydrogen, water, or the like contained in the oxide semiconductor film. However, when the heat treatment is performed with the oxide semiconductor film exposed, oxygen is released from the oxide semiconductor film, thereby forming an oxygen vacancy.

Further, not only oxygen vacancies but also impurities such as silicon or carbon which is a constituent element of the insulating film cause poor electrical characteristics of a transistor. Therefore, there is a problem in that mixing of the impurities into an oxide semiconductor film reduces the resistance of the oxide semiconductor film and the amount of change in electrical characteristics, typically in threshold voltage, of the transistor is increased by change over time or a stress test.

Thus, an object of this embodiment is to reduce oxygen vacancies in an oxide semiconductor film having a channel region and the concentration of impurities in the oxide semiconductor film, in a semiconductor device including a transistor having the oxide semiconductor film.

Moreover, there is a trend in a commercially available display device toward a larger screen, e.g., a 60-inch diagonal screen, and further, the development of a display device is aimed even at a screen size of a diagonal of 120 inches or more. Hence, a glass substrate for a display device has grown in size, e.g., to the 8th generation or more. However, in the case of using a large-sized substrate, because heat treatment is performed at high temperatures, e.g., at 450° C. or higher, an expensive, large-sized heating apparatus is needed. Accordingly, the manufacturing cost is increased. Further, high-temperature heat treatment causes a warp or a shrink of the substrate, which leads to a reduction in yield.

Thus, one object of this embodiment is to manufacture a semiconductor device using heat treatment at a temperature which allows the use of a large-sized substrate and using a small number of heat treatment steps.

Figure 1C:
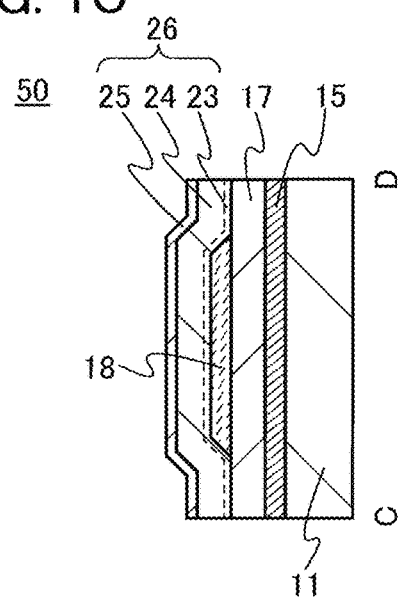
Figure 1B:
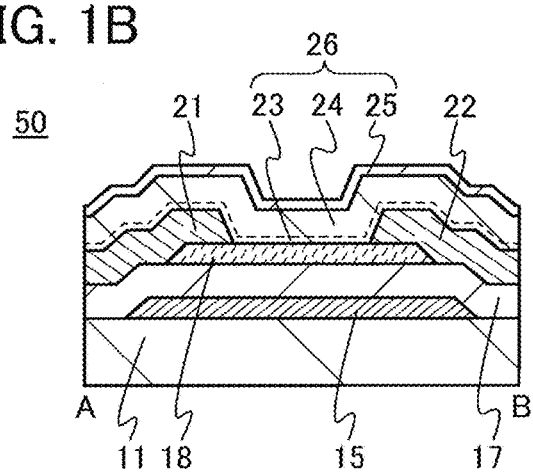

FIGS. 1A to 1C are a top view and cross-sectional views of a transistor 50 of a semiconductor device. The transistor 50 shown in FIGS. 1A to 1C is a channel-etched transistor. FIG. 1A is a top view of the transistor 50, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a substrate 11, one or more of components of the transistor 50 (e.g., a gate insulating film 17), an oxide insulating film 23, an oxide insulating film 24, a nitride insulating film 25, and the like are not illustrated for clarity.

The transistor 50 shown in FIGS. 1B and 1C includes a gate electrode 15 provided over the substrate 11. Moreover, the gate insulating film 17 over the substrate 11 and the gate electrode 15, an oxide semiconductor film 18 overlapping with the gate electrode 15 with the gate insulating film 17 provided therebetween, and a pair of electrodes 21 and 22 being in contact with the oxide semiconductor film 18 are included. Furthermore, a protective film 26 including the oxide insulating film 23, the oxide insulating film 24, and the nitride insulating film 25 is formed over the gate insulating film 17, the oxide semiconductor film 18, and the pair of electrodes 21 and 22.

The transistor 50 described in this embodiment includes the oxide semiconductor film 18. Further, part of the oxide semiconductor film 18 serves as a channel region. Furthermore, the oxide insulating film 23 is formed in contact with the oxide semiconductor film 18, and the oxide insulating film 24 is formed in contact with the oxide insulating film 23.

The oxide semiconductor film 18 is typically an In—Ga oxide film, an In—Zn oxide film, or an In-M-Zn oxide film (M represents Al, Ti, Ga, Y, Zr, La, Ce, Nd, or Hf).

Note that in the case where the oxide semiconductor film 18 is an In-M-Zn oxide film, the proportions of In and M when summation of In and M is assumed to be 100 atomic % are preferably as follows: the atomic percentage of In is greater than or equal to 25 atomic % and the atomic percentage of M is less than 75 atomic %; further preferably, the atomic percentage of In is greater than or equal to 34 atomic % and the atomic percentage of M is less than 66 atomic %.

The energy gap of the oxide semiconductor film 18 is 2 eV or more, preferably 2.5 eV or more, more preferably 3 eV or more. With the use of an oxide semiconductor having such a wide energy gap, the off-state current of the transistor 50 can be reduced.

The thickness of the oxide semiconductor film 18 is greater than or equal to 3 nm and less than or equal to 200 nm, preferably greater than or equal to 3 nm and less than or equal to 100 nm, more preferably greater than or equal to 3 nm and less than or equal to 50 nm.

In the case where the oxide semiconductor film 18 is In-M-Zn oxide film (M represents Al, Ti, Ga, Y, Zr, La, Ce, Nd, or Hf), it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1 and In:M:Zn=3:1:2 are preferable. Note that the proportion of the atomic ratio of the oxide semiconductor film 18 formed using the above-described sputtering target varies within a range of ±20% as an error.

An oxide semiconductor film with low carrier density is used as the oxide semiconductor film 18. For example, an oxide semiconductor film whose carrier density is $1\times10^{17}/cm^3$ or lower, preferably $1\times10^{15}/cm^3$ or lower, more preferably $1\times10^{13}/cm^3$ or lower, much more preferably $1\times10^{11}/cm^3$ or lower is used as the oxide semiconductor film 18.

Note that, without limitation to that described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 18 be set to be appropriate.

Note that it is preferable to use, as the oxide semiconductor film 18, an oxide semiconductor film in which the impurity concentration is low and density of defect states is low, in which case the transistor can have more excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor film in which a channel region is formed rarely has a negative threshold voltage (is rarely normally-on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. Examples of the impurities include hydrogen, nitrogen, alkali metal, and alkaline earth metal.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Further, in some cases, bonding of part of hydrogen to oxygen bonded to a metal element causes generation of an electron serving as a carrier. Thus, a transistor including an oxide semiconductor which contains hydrogen is likely to be normally on.

Accordingly, it is preferable that hydrogen be reduced as much as possible in the oxide semiconductor film 18. Specifically, the hydrogen concentration of the oxide semiconductor film 18, which is measured by secondary ion mass spectrometry (SIMS), is lower than or equal to $5\times10^{19}$ atoms/cm$^3$, preferably lower than or equal to $1\times10^{19}$ atoms/cm$^3$, more preferably lower than or equal to $5\times10^{18}$ atoms/cm$^3$, even more preferably lower than or equal to $1\times10^{18}$ atoms/cm$^3$, still more preferably lower than or equal to $5\times10^{17}$ atoms/cm$^3$, yet still more preferably lower than or equal to $1\times10^{16}$ atoms/cm$^3$.

When silicon or carbon which is one of elements belonging to Group 14 is contained in the oxide semiconductor film 18, oxygen vacancies are increased, and the oxide semiconductor film 18 becomes an n-type film. Thus, the concentration of silicon or carbon (the concentration is measured by SIMS) of the oxide semiconductor film 18 is lower than or equal to $2\times10^{18}$ atoms/cm$^3$, preferably lower than or equal to $2\times10^{17}$ atoms/cm$^3$.

Further, the concentration of alkali metal or alkaline earth metal of the oxide semiconductor film 18, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 18.

Further, when containing nitrogen, the oxide semiconductor film 18 easily has n-type conductivity by generation of electrons serving as carriers and an increase of carrier density. Thus, a transistor including an oxide semiconductor which contains nitrogen is likely to be normally on. For this reason, nitrogen in the oxide semiconductor film is preferably reduced as much as possible; the concentration of nitrogen which is measured by SIMS is preferably set to, for example, lower than or equal to $5\times10^{18}$ atoms/cm$^3$.

The oxide semiconductor film 18 may have a non-single-crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect levels, whereas CAAC-OS has the lowest density of defect levels.

The oxide semiconductor film 18 may have an amorphous structure, for example. An oxide semiconductor film having an amorphous structure has, for example, disordered atomic arrangement and no crystalline component. Alternatively, an oxide film having an amorphous structure has, for example, an absolutely amorphous structure and has no crystal part.

Note that the oxide semiconductor film 18 may be a mixed film including two or more of the following: a region having an amorphous structure, a region having a microcrystalline structure, a region having a polycrystalline structure, a CAAC-OS region, and a region having a single-crystal structure. The mixed film includes, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases.

Furthermore, in the transistor 50 described in this embodiment, the oxide insulating film 23 is formed in contact with the oxide semiconductor film 18, and the oxide insulating film 24 in contact with the oxide insulating film 23 is formed.

The oxide insulating film 23 is an oxide insulating film through which oxygen is permeated. Note that the oxide insulating film 23 also serves as a film which relieves damage to the oxide semiconductor film 18 at the time of forming the oxide insulating film 24 later.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating film 23. Note that in this specification, a "silicon oxynitride film" refers to a film that contains oxygen at a higher proportion than nitrogen, and a "silicon nitride oxide film" refers to a film that contains nitrogen at a higher proportion than oxygen.

Further, it is preferable that the amount of defects in the oxide insulating film 23 be small, typically the spin density of a signal which appears at g=2.001 due to a dangling bond of silicon, be lower than or equal to $3\times10^{17}$ spins/cm$^3$ by ESR measurement. This is because if the density of defects in the oxide insulating film 23 is high, oxygen is bonded to the defects and the amount of oxygen that passes through the oxide insulating film 23 is decreased.

Further, it is preferable that the amount of defects at the interface between the oxide insulating film 23 and the oxide semiconductor film 18 be small, typically the spin density of a signal which appears at g=1.93 due to an oxygen vacancy in the oxide semiconductor film 18 be lower than or equal to $1\times10^{17}$ spins/cm$^3$, more preferably lower than or equal to the lower limit of detection by ESR measurement.

Note that in the oxide insulating film 23, all oxygen entering the oxide insulating film 23 from the outside does not move to the outside of the oxide insulating film 23 and some oxygen remains in the oxide insulating film 23. Further, movement of oxygen occurs in the oxide insulating film 23 in some cases in such a manner that oxygen enters the oxide insulating film 23 and oxygen contained in the oxide insulating film 23 is moved to the outside of the oxide insulating film 23.

When the oxide insulating film through which oxygen is permeated is formed as the oxide insulating film 23, oxygen released from the oxide insulating film 24 provided over the oxide insulating film 23 can be moved to the oxide semiconductor film 18 through the oxide insulating film 23.

The oxide insulating film 24 is formed in contact with the oxide insulating film 23. The oxide insulating film 24 is formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film containing oxygen at a higher proportion than the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis.

A silicon oxide film, a silicon oxynitride film, or the like with a thickness greater than or equal to 30 nm and less than or equal to 500 nm, preferably greater than or equal to 50 nm and less than or equal to 400 nm can be used as the oxide insulating film 24.

Further, it is preferable that the amount of defects in the oxide insulating film 24 be small, typically the spin density of a signal which appears at g=2.001 originating from a dangling bond of silicon, be lower than $1.5\times10^{18}$ spins/cm$^3$, more preferably lower than or equal to $1\times10^{18}$ spins/cm$^3$ by ESR measurement. Note that the oxide insulating film 24 is provided more apart from the oxide semiconductor film 18 than the oxide insulating film 23 is; thus, the oxide insulating film 24 may have higher defect density than the oxide insulating film 23.

Other details of the transistor 50 are described below.

There is no particular limitation on a material and the like of the substrate 11 as long as the material has heat resistance high enough to withstand at least heat treatment performed later. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used. Still alternatively, any of these substrates provided with a semiconductor element may be used as the substrate 11. In the case where a glass substrate is used as the substrate 11, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 11, and the transistor 50 may be provided directly on the flexible substrate. Alternatively, a separation layer may be provided between the substrate 11 and the transistor 50. The separation layer can be used when part or the whole of a semiconductor device formed over the separation layer is completed and separated from the substrate 11 and transferred to another substrate. In such a case, the transistor 50 can be transferred to a substrate having low heat resistance or a flexible substrate as well.

The gate electrode 15 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese or zirconium may be used. The gate electrode 15 may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The gate electrode 15 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Further, an In—Ga—Zn-based oxynitride film, an In—Sn-based oxynitride film, an In—Ga-based oxynitride film, an In—Zn-based oxynitride film, a Sn-based oxynitride film, an In-based oxynitride film, a film of a metal nitride (such as InN or ZnN), or the like may be provided between the gate electrode 15 and the gate insulating film 17. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, in the case of using an In—Ga—Zn-based oxynitride film, an In—Ga—Zn-based oxynitride film whose nitrogen concentration is higher than at least the nitrogen concentration of the oxide semiconductor film 18, specifically, an In—Ga—Zn-based oxynitride film whose nitrogen concentration is higher than or equal to 7 at. % is used.

The gate insulating film 17 can be formed to have a single-layer structure or a stacked-layer structure using, for example, any of silicon oxide, silicon oxynitride, silicon nitride oxide, silicon nitride, aluminum oxide, hafnium oxide, gallium oxide, and Ga—Zn-based metal oxide.

The gate insulating film 17 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

The thickness of the gate insulating film 17 is greater than or equal to 5 nm and less than or equal to 400 nm, preferably greater than or equal to 10 nm and less than or equal to 300 nm, further preferably greater than or equal to 50 nm and less than or equal to 250 nm.

The pair of electrodes 21 and 22 is formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

Further, it is possible to prevent outward diffusion of oxygen from the oxide semiconductor film 18 and entry of hydrogen, water, or the like into the oxide semiconductor film 18 from the outside by providing the nitride insulating film 25 having a blocking effect against oxygen, hydrogen, water, alkali metal, alkaline earth metal, and the like over the oxide insulating film 24. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, aluminum oxide, aluminum oxynitride, gallium oxide, gallium oxynitride, yttrium oxide, yttrium oxynitride, hafnium oxide, and hafnium oxynitride can be given.

Next, a method for manufacturing the transistor 50 illustrated in FIGS. 1A to 1C is described with reference to FIGS. 2A to 2D.

Figure 2A:
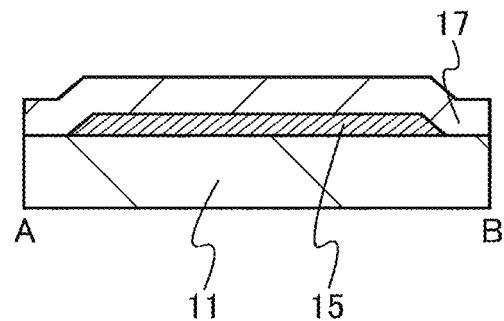
FIGS. 2A to 2D are cross-sectional views illustrating one embodiment of a method for manufacturing a transistor.

As illustrated in FIG. 2A, the gate electrode 15 is formed over the substrate 11, and the gate insulating film 17 is formed over the gate electrode 15.

Here, a glass substrate is used as the substrate 11.

A method for forming the gate electrode 15 is described below. First, a conductive film is formed by a sputtering method, a CVD method, an evaporation method, or the like. Then, a mask is formed over the conductive film by a photolithography process. Next, part of the conductive film is etched with the use of the mask to form the gate electrode 15. After that, the mask is removed.

Note that the gate electrode 15 may be formed by an electrolytic plating method, a printing method, an inkjet method, or the like instead of the above formation method.

Here, a 100-nm-thick tungsten film is formed by a sputtering method. Next, a mask is formed by a photolithography process, and the tungsten film is subjected to dry etching with the use of the mask to form the gate electrode 15.

The gate insulating film 17 is formed by a sputtering method, a CVD method, an evaporation method, or the like.

In the case where a silicon oxide film, a silicon oxynitride film, or a silicon nitride oxide film is formed as the gate insulating film 17, a deposition gas containing silicon and an oxidizing gas are preferred to be used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

Moreover, in the case of forming a gallium oxide film as the gate insulating film 17, a metal organic chemical vapor deposition (MOCVD) method can be employed.

Figure 2B:
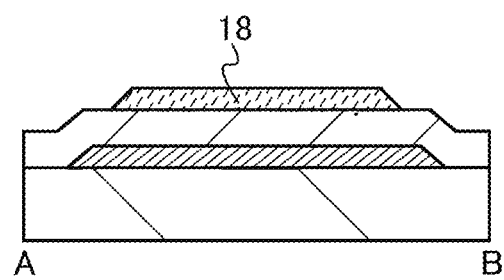

Next, as illustrated in FIG. 2B, the oxide semiconductor film 18 is formed over the gate insulating film 17.

A formation method of the oxide semiconductor film 18 is described below. An oxide semiconductor film which is to be the oxide semiconductor film 18 is formed over the gate insulating film 17. Then, after a mask is formed over the oxide semiconductor film by a photolithography process, the oxide semiconductor film is partly etched using the mask. Thus, the oxide semiconductor film 18 subjected to element isolation as illustrated in FIG. 2B is formed. After that, the mask is removed.

The oxide semiconductor film which is to be the oxide semiconductor film 18 can be formed by a sputtering method, a coating method, a pulsed laser deposition method, a laser ablation method, or the like.

In the case where the oxide semiconductor film is formed by a sputtering method, a power supply device for generating plasma can be an RF power supply device, an AC power supply device, a DC power supply device, or the like as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of a rare gas.

Further, a target may be appropriately selected in accordance with the composition of the oxide semiconductor film to be formed.

In order to obtain an intrinsic or substantially intrinsic oxide semiconductor film, besides the high vacuum evacuation of the chamber, a highly purification of a sputtering gas is also needed. As an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film can be prevented as much as possible.

Here, a 35-nm-thick In—Ga—Zn oxide film is formed as the oxide semiconductor film by a sputtering method using an In—Ga—Zn oxide target (In:Ga:Zn=1:1:1). Next, a mask is formed over the oxide semiconductor film, and part of the oxide semiconductor film is selectively etched. Thus, the oxide semiconductor film 18 is formed.

Figure 2C:
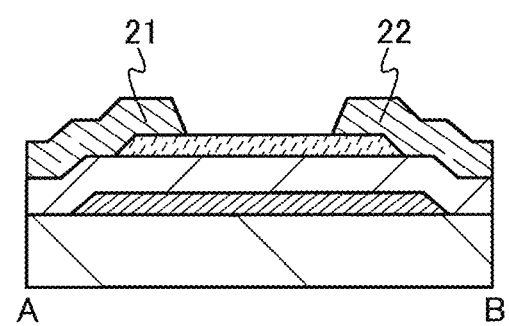

Next, as shown in FIG. 2C, the pair of electrodes 21 and 22 is formed without heat treatment after the formation of the oxide semiconductor film 18.

A method for forming the pair of electrodes 21 and 22 is described below. First, a conductive film is formed by a sputtering method, a CVD method, an evaporation method, or the like. Then, a mask is formed over the conductive film by a photolithography process. Next, the conductive film is etched with the use of the mask to form the pair of electrodes 21 and 22. After that, the mask is removed.

Here, a 50-nm-thick tungsten film, a 400-nm-thick aluminum film, and a 100-nm-thick titanium film are sequentially stacked by a sputtering method. Next, a mask is formed over the titanium film by a photolithography process and the tungsten film, the aluminum film, and the titanium film are dry-etched with use of the mask to form the pair of electrodes 21 and 22.

Figure 2D:
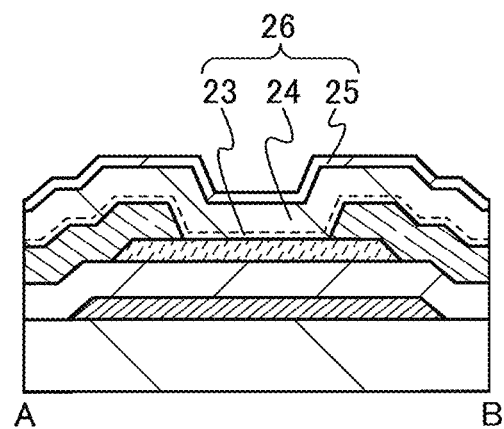

Next, as shown in FIG. 2D, the oxide insulating film 23 is formed over the oxide semiconductor film 18 and the pair of electrodes 21 and 22. Next, the oxide insulating film 24 is formed over the oxide insulating film 23.

Note that after the oxide insulating film 23 is formed, the oxide insulating film 24 is preferably formed in succession without exposure to the air. After the oxide insulating film 23 is formed, the oxide insulating film 24 is formed in succession by adjusting at least one of the flow rate of a source gas, pressure, a high-frequency power, and a substrate temperature without exposure to the air, whereby the concentration of impurities attributed to the atmospheric component at the interface between the oxide insulating film 23 and the oxide insulating film 24 can be reduced and oxygen in the oxide insulating film 24 can be moved to the oxide semiconductor film 18; accordingly, the amount of oxygen vacancies in the oxide semiconductor film 18 can be reduced.

As the oxide insulating film 23, a silicon oxide film or a silicon oxynitride film can be formed under the following conditions: the substrate placed in a treatment chamber of a plasma CVD apparatus that is vacuum-evacuated is held at a temperature higher than or equal to 280° C. and lower than or equal to 400° C., the pressure is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as the source gas of the oxide insulating film 23. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

With the use of the above conditions, an oxide insulating film through which oxygen is permeated can be formed as the oxide insulating film 23. Further, by providing the oxide film 19 and the oxide insulating film 23, damage to the oxide semiconductor film 18 can be reduced in a step of forming the oxide insulating film 24 which is formed later.

As for the oxide insulating film 23, a silicon oxide film or a silicon oxynitride film can be formed as the oxide insulating film 23 under the following conditions: the substrate placed in a treatment chamber of a plasma CVD apparatus that is vacuum-evacuated is held at a temperature higher than or equal to 280° C. and lower than or equal to 400° C., the pressure is greater than or equal to 100 Pa and less than or equal to 250 Pa with introduction of a source gas into the treatment chamber, and a high-frequency power is supplied to an electrode provided in the treatment chamber.

Under the above film formation conditions, the bonding strength of silicon and oxygen becomes strong in the above substrate temperature range. Thus, as the oxide insulating film 23, a dense and hard oxide insulating film through which oxygen is permeated, typically, a silicon oxide film or a silicon oxynitride film of which etching using hydrofluoric acid of 0.5 wt % at 25° C. is performed at a rate of lower than or equal to 10 nm/min, preferably lower than or equal to 8 nm/min can be formed.

The oxide insulating film 23 is formed while heating is performed; thus, hydrogen, water, or the like contained in the oxide semiconductor film 18 can be released in the step. Hydrogen contained in the oxide semiconductor film 18 is bonded to an oxygen radical formed in plasma to form water. Since the substrate is heated in the step of forming the oxide insulating film 23, water formed by bonding of oxygen and hydrogen is released from the oxide semiconductor film. That is, when the oxide insulating film 23 is formed by a plasma CVD method, the amount of water and hydrogen contained in the oxide semiconductor film can be reduced.

Further, time for heating in a state where the oxide semiconductor film 18 is exposed can be shortened because heating is performed in a step of forming the oxide insulating film 23. Thus, the amount of oxygen released from the oxide semiconductor film by heat treatment can be reduced. That is, the amount of oxygen vacancies in the oxide semiconductor film can be reduced.

Note that by setting the pressure in the treatment chamber to be greater than or equal to 100 Pa and less than or equal to 250 Pa, the amount of water contained in the oxide insulating film 23 is reduced; thus, variation in electrical characteristics of the transistor 50 can be reduced and change in threshold voltage can be inhibited.

Further, by setting the pressure in the treatment chamber to be greater than or equal to 100 Pa and less than or equal to 250 Pa, damage to the oxide semiconductor film 18 can be reduced when the oxide insulating film 23 is formed, so that the amount of oxygen vacancies contained in the oxide semiconductor film 18 can be reduced. In particular, when the film formation temperature of the oxide insulating film 23 or the oxide insulating film 24 which is formed later is set to be high, typically higher than 220° C., part of oxygen contained in the oxide semiconductor film 18 is released and oxygen vacancies are easily formed. Further, when the film formation conditions for reducing the amount of defects in the oxide insulating film 24 which is formed later are used to increase reliability of the transistor, the amount of released oxygen is easily reduced. Thus, it is difficult to reduce oxygen vacancies in the oxide semiconductor film 18 in some cases. However, by setting the pressure in the treatment chamber to be greater than or equal to 100 Pa and less than or equal to 250 Pa to reduce damage to the oxide semiconductor film 18 at the time of forming the oxide insulating film 23, oxygen vacancies in the oxide semiconductor film 18 can be reduced even when the amount of oxygen released from the oxide insulating film 24 is small.

Note that when the ratio of the amount of the oxidizing gas to the amount of the deposition gas containing silicon is 100 or higher, the hydrogen content in the oxide insulating film 23 can be reduced. Consequently, the amount of hydrogen entering the oxide semiconductor film 18 can be reduced; thus, the negative shift in the threshold voltage of the transistor can be inhibited.

Here, as the oxide insulating film 23, a 50-nm-thick silicon oxynitride film is formed by a plasma CVD method in which silane with a flow rate of 30 sccm and dinitrogen monoxide with a flow rate of 4000 sccm are used as a source gas, the pressure in the treatment chamber is 200 Pa, the substrate temperature is 220° C., and a high-frequency power of 150 W is supplied to parallel-plate electrodes with the use of a 27.12 MHz high-frequency power source. Under the above conditions, a silicon oxynitride film through which oxygen is permeated can be formed.

As the oxide insulating film 24, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

A deposition gas containing silicon and an oxidizing gas are preferably used as the source gas of the oxide insulating film 24. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

As the film formation conditions of the oxide insulating film 24, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content in the oxide insulating film 24 becomes higher than that in the stoichiometric composition. On the other hand, in the film formed at a substrate temperature within the above temperature range, the bond between silicon and oxygen is weak, and accordingly, part of oxygen in the film is released by heat treatment in the later step. Thus, it is possible to form an oxide insulating film which contains oxygen at a higher proportion than the stoichiometric composition and from which part of oxygen is released by heating. Further, the oxide insulating film 23 is provided over the oxide semiconductor film 18. Accordingly, in the step of forming the oxide insulating film 24, the oxide insulating film 23 serves as a protective film of the oxide semiconductor film 18. Consequently, the oxide insulating film 24 can be formed using the high-frequency power having a high power density while damage to the oxide semiconductor film 18 is reduced.

Note that in the film formation conditions of the oxide insulating film 24, the flow rate of the deposition gas containing silicon relative to the oxidizing gas can be increased, whereby the amount of defects in the oxide insulating film 24 can be reduced. Typically, it is possible to form an oxide insulating film in which the amount of defects is small, i.e. the spin density of a signal which appears at g=2.001 originating from a dangling bond of silicon is lower than $6\times10^{17}$ spins/cm$^3$, preferably lower than or equal to $3\times10^{17}$ spins/cm$^3$, more preferably lower than or equal to $1.5\times10^{17}$ spins/cm$^3$ by ESR measurement. As a result, the reliability of the transistor can be improved.

Here, as the oxide insulating film 24, a 400-nm-thick silicon oxynitride film is formed by a plasma CVD method in which silane with a flow rate of 200 sccm and dinitrogen monoxide with a flow rate of 4000 sccm are used as the source gas, the pressure in the treatment chamber is 200 Pa, the substrate temperature is 220° C., and the high-frequency power of 1500 W is supplied to the parallel-plate electrodes with the use of a 27.12 MHz high-frequency power source. Note that a plasma CVD apparatus used here is a parallel-plate plasma CVD apparatus in which the electrode area is 6000 cm$^2$, and the power per unit area (power density) into which the supplied power is converted is 0.25 W/cm$^2$.

Next, heat treatment is performed. The heat treatment is performed typically at a temperature of higher than or equal to 150° C. and lower than or equal to 400° C., preferably higher than or equal to 300° C. and lower than or equal to 400° C., more preferably higher than or equal to 320° C. and lower than or equal to 370° C.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the oxide insulating film 24 can be moved to the oxide semiconductor film 18, so that the amount of oxygen vacancies contained in the oxide semiconductor film 18 can be further reduced.

Further, in the case where water, hydrogen, or the like is contained in the oxide insulating film 23 and the oxide insulating film 24, when the nitride insulating film 25 having a function of blocking water, hydrogen, and the like is formed later and heat treatment is performed, water, hydrogen, or the like contained in the oxide insulating film 23 and the oxide insulating film 24 are moved to the oxide semiconductor film 18, so that defects are generated in the oxide semiconductor film 18. However, by the heating, water, hydrogen, or the like contained in the oxide insulating film 23 and the oxide insulating film 24 can be released; thus, variation in electrical characteristics of the transistor 50 can be reduced, and change in threshold voltage can be inhibited.

Note that when the oxide insulating film 24 is formed over the oxide insulating film 23 while being heated, oxygen can be moved to the oxide semiconductor film 18 to compensate the oxygen vacancies in the oxide semiconductor film 18; thus, the heat treatment is not necessarily performed.

Here, heat treatment is performed at 350° C. for one hour in an atmosphere of nitrogen and oxygen.

Further, when the pair of electrodes 21 and 22 is formed, the oxide semiconductor film 18 is damaged by the etching of the conductive film, so that oxygen vacancies are generated on the back channel side (the side of the oxide semiconductor film 18 which is opposite to the side facing to the gate electrode 15) of the oxide semiconductor film 18. However, with the use of the oxide insulating film containing oxygen at a higher proportion than the stoichiometric composition as the oxide insulating film 24, the oxygen vacancies generated on the back channel side can be repaired by heat treatment. By this, defects contained in the oxide semiconductor film 18 can be reduced, and thus, the reliability of the transistor 50 can be improved.

Next, the nitride insulating film 25 is formed by a sputtering method, a CVD method, or the like.

Note that in the case where the nitride insulating film 25 is formed by a plasma CVD method, the substrate placed in the treatment chamber of the plasma CVD apparatus that is vacuum-evacuated is preferably set to be higher than or equal to 300° C. and lower than or equal to 400° C., more preferably, higher than or equal to 320° C. and lower than or equal to 370° C., so that a dense nitride insulating film can be formed.

In the case where a silicon nitride film is formed by the plasma CVD method as the nitride insulating film 25, a deposition gas containing silicon, nitrogen, and ammonia are preferably used as a source gas. As the source gas, a small amount of ammonia compared to the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which a bond between silicon and nitrogen is promoted and a bond between silicon and hydrogen is few can be formed. On the other hand, when the amount of ammonia with respect to nitrogen is large in a source gas, cleavage of a deposition gas containing silicon and cleavage of nitrogen are not promoted, so that a sparse silicon nitride film in which a bond between silicon and hydrogen remains and defects are increased is formed. Therefore, in a source gas, a flow ratio of the nitrogen to the ammonia is set to be greater than or equal to 5 and less than or equal to 50, preferably greater than or equal to 10 and less than or equal to 50.

Here, in the treatment chamber of a plasma CVD apparatus, a 50-nm-thick silicon nitride film is formed by a plasma CVD method in which silane with a flow rate of 50 sccm, nitrogen with a flow rate of 5000 sccm, and ammonia with a flow rate of 100 sccm are used as the source gas, the pressure in the treatment chamber is 100 Pa, the substrate temperature is 350° C., and high-frequency power of 1000 W is supplied to parallel-plate electrodes with a high-frequency power supply of 27.12 MHz. Note that the plasma CVD apparatus is a parallel-plate plasma CVD apparatus in which the electrode area is 6000 cm$^2$, and the power per unit area (power density) into which the supplied power is converted is $1.7 \times 10^{-1}$ W/cm$^2$.

By the above-described steps, the protective film 26 including the oxide insulating film 23, the oxide insulating film 24, and the nitride insulating film 25 can be formed.

Next, heat treatment may be performed. The heat treatment is performed typically at a temperature of higher than or equal to 150° C. and lower than or equal to 400° C., preferably higher than or equal to 300° C. and lower than or equal to 400° C., more preferably higher than or equal to 320° C. and lower than or equal to 370° C.

Through the above-described process, the transistor 50 can be manufactured.

In this embodiment, the oxide insulating film is formed by a plasma CVD method in which heating is performed at a temperature of higher than or equal to 280° C. and lower than or equal to 400° C. Thus, hydrogen, water, or the like contained in the oxide semiconductor film 18 can be released. Further, in the step, the length of heating time in a state where the oxide semiconductor film is exposed is short, and even when the temperature of the oxide semiconductor film with heat treatment is lower than or equal to 400° C., it is possible to manufacture a transistor in which the amount of change in threshold voltage is equivalent to that of a transistor subjected to heat treatment at a high temperature. Consequently, the manufacturing cost of a semiconductor device can be reduced.

Further, the oxide insulating film containing oxygen at a higher proportion than the stoichiometric composition is formed to overlap with the oxide semiconductor film which serves as a channel region, and thus, oxygen in the oxide insulating film can be moved to the oxide semiconductor film. Consequently, the amount of oxygen vacancies in the oxide semiconductor film can be reduced.

In particular, the oxide insulating film through which oxygen is permeated is formed between the oxide semiconductor film serving as a channel region and the oxide insulating film which contains oxygen at a higher proportion than the stoichiometric composition. Thus, damage to the oxide semiconductor film at the time of forming the oxide insulating film which contains oxygen at a higher proportion than the stoichiometric composition can be suppressed. Consequently, the amount of oxygen vacancies in the oxide semiconductor film can be reduced.

From the above, as for a semiconductor device including an oxide semiconductor film, a semiconductor device in which the amount of defects is reduced can be obtained. Further, as for a semiconductor device including an oxide semiconductor film, a semiconductor device with improved electrical characteristics can be obtained.

<Reaction Between Hydrogen Contained in Oxide Semiconductor Film and Excess Oxygen>

Described below is a reaction between an oxygen radical formed at the time of forming the oxide insulating film by a plasma CVD method and hydrogen contained in the oxide semiconductor film.

First, a source gas for forming an oxygen radical is described.

A dinitrogen monoxide atmosphere and an oxygen atmosphere are typical examples of an atmosphere in which an oxygen radical can be formed.

Reaction enthalpy of a reaction in which an oxygen radical is formed in plasma generated in a dinitrogen monoxide atmosphere is calculated. Gaussian 09 is used for the calculation. As a calculation method, a 2nd order Moller-Plesset perturbation (MP2) is used. As a basis function, cc-pVDZ for electron correlation is used. The calculation results are shown in Formula 1.

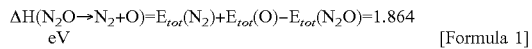

Reaction enthalpy of a reaction in which an oxygen radical is formed in plasma generated in an oxygen atmosphere is calculated. Gaussian 09 is used for the calculation. As a calculation method, a 2nd order Moller-Plesset perturbation (MP2) is used. As a basis function, cc-pVDZ for electron correlation is used. The calculation results are shown in Formula 2.

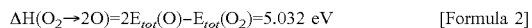

The calculation results shown in Formulae 1 and 2 indicate that an oxygen radical is formed more easily in plasma generated in a dinitrogen monoxide atmosphere than in plasma generated in an oxygen atmosphere.

Next, a process of releasing $H_2O$ with the use of excess oxygen (hereinafter referred to as exO) bonded to Ga atom or oxygen atom located on the surface of the oxide semiconductor film is examined. As the oxide semiconductor film, $InGaZnO_4$ is used.

Figure 47A:
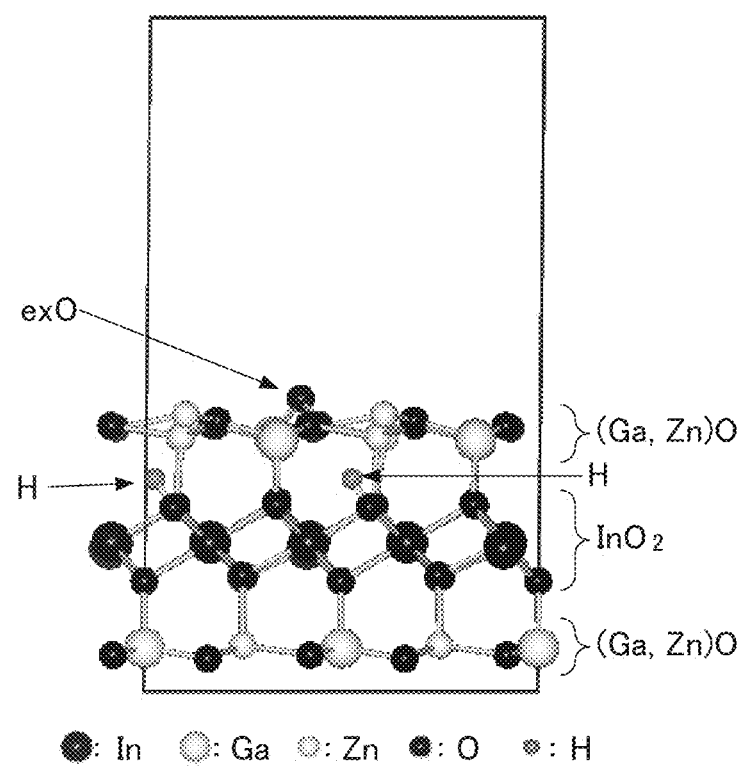
FIGS. 47A and 47B are model diagrams regarding a process of the release of $H_2O$.
Figure 47B:
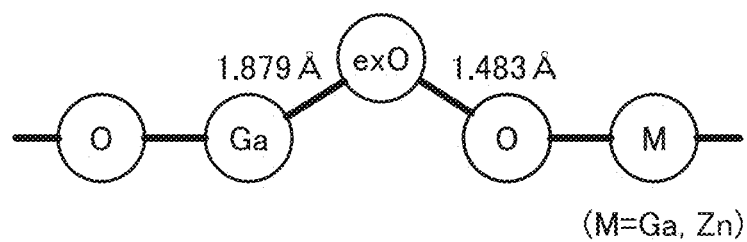

Here, a calculation regarding a process of the release of $H_2O$ is performed using a plane model (112 atoms) having a vacuum region in a c-axis direction. The plane model is obtained in the following manner: a crystal structure formed by doubling a primitive cell of an $InGaZnO_4$ crystal in an a-axis direction and a b-axis direction is cut along the (001) plane to have three layers including a (Ga,Zn)O layer on the outermost surface, an $InO_2$ layer, and an (Ga,Zn)O layer. FIG. 47A illustrates a model used for the calculation. In FIG. 47A, excess oxygen bonded to a surface of $InGaZnO_4$ is denoted by exO. Further, two H atoms are arranged in positions apart from exO. Note that as shown in FIG. 47B, exO on the surface of the $InGaZnO_4$ is stable in terms of energy when Ga-exO-O is formed. Hence, the structure shown in FIG. 47A is used as an initial structure of a reaction pathway. The calculation conditions are shown in Table 1.

TABLE 1

| Software | VASP* |
|---|---|
| Functional | PAW |
| Pseudopotential | GGA/PBE |
| Cut-off energy | 500 eV |
| K-point | 2 × 2 × 1 |

*Vienna Ab initio Simulation Package

Figure 48:
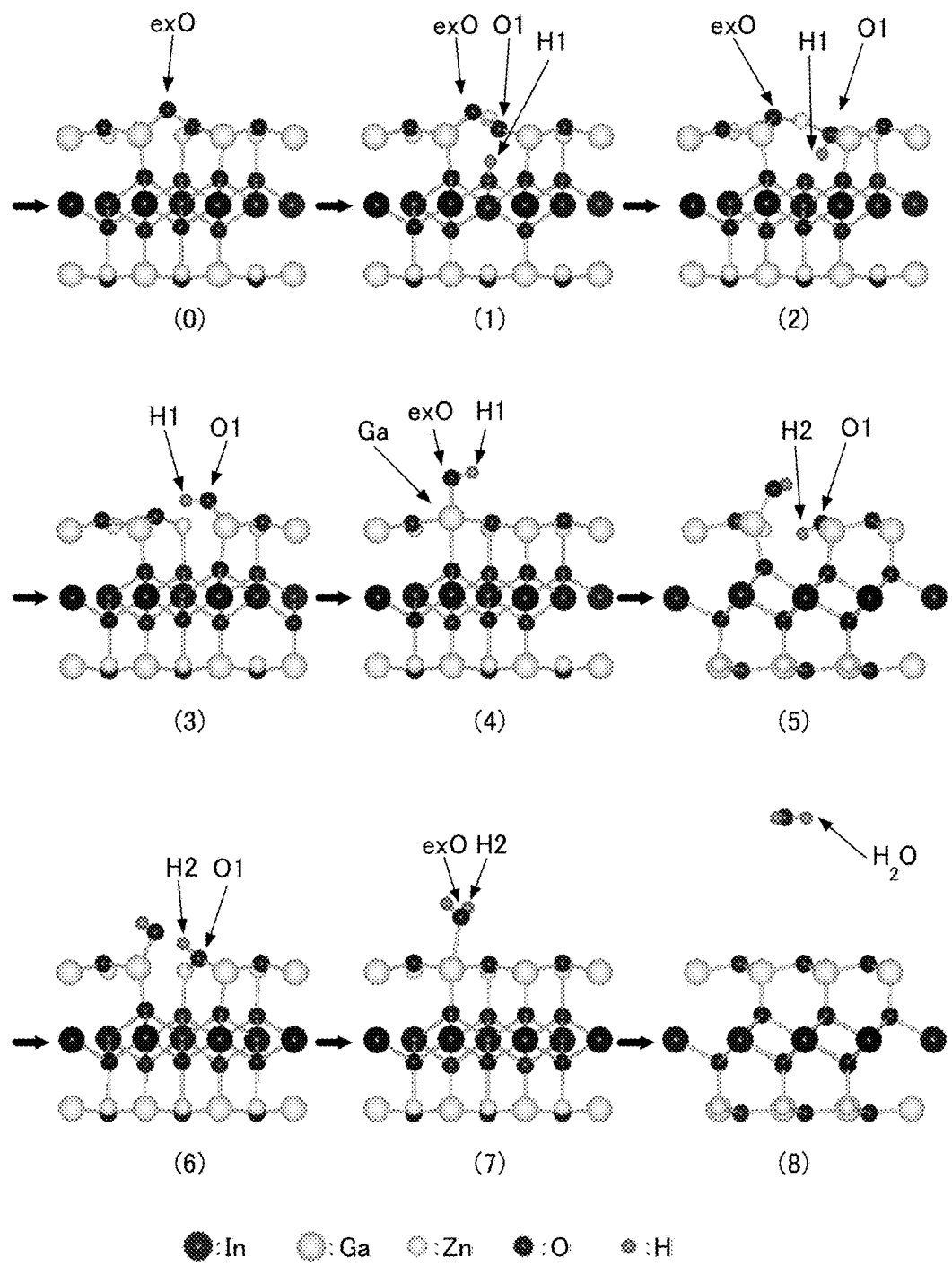
FIG. 48 is a model diagram regarding a process of the release of $H_2O$.

FIG. 48 shows the $InGaZnO_4$ structure in each step from (0) to (8). Note that two H atoms are denoted by H1 and H2 in the order in which they come close to exO.

In steps from (0) to (1), H1 is diffused in the vicinity of exO.

In steps from (1) to (2), H1 is bonded to O (O1) bonded to exO.

In steps from (2) to (3), H1 moves beyond O1.

In steps from (3) to (4), H1 is bonded to exO to form Ga-exO-H1.

In steps from (4) to (5), H2 is bonded to O1.

In steps from (5) to (6), H2 moves beyond O1.

In steps from (6) to (7), H2 is bonded to exO.

In steps from (7) to (8), $H_2O$ formed with H1, exO, and H2 is released.

Figure 49:
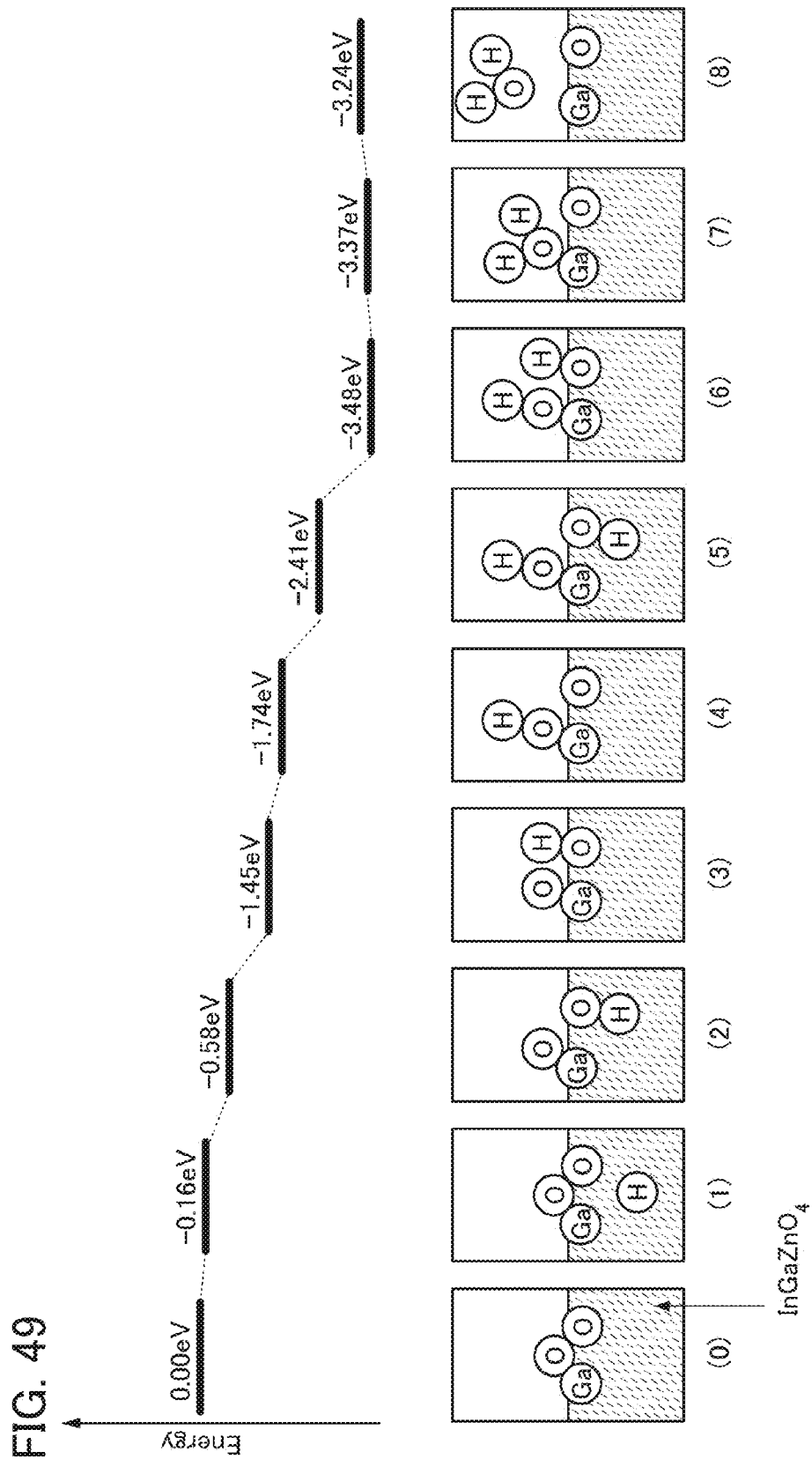
FIG. 49 shows an energy diagram and a schematic diagram regarding the process of the release of $H_2O$.

FIG. 49 shows an energy diagram obtained by calculating energy change from the step (1) to the step (8). In the calculation, the structure of the step (0) is regarded as a reference of energy (0.00 eV) of the reaction pathway. FIG. 49 also shows a schematic diagram of a reaction among Ga, O, and H in each step.

It is shown from FIG. 49 that, in the case where exO is bonded to the surface of $InGaZnO_4$, energy largely decreases by a reaction that forms $H_2O$ from the exO and H in the $InGaZnO_4$ and a reaction in which the $H_2O$ is released. That is, the reactions are exothermic reactions.

Thus, in the case where an oxygen radical included in plasma is bonded to the surface of In—Ga—Zn oxide and exists as exO, an oxygen vacancy is not formed in the In—Ga—Zn oxide, and H in the In—Ga—Zn oxide reacts with exO, whereby $H_2O$ can be formed. Further, the $H_2O$ can be released. Consequently, the concentration of hydrogen contained in the oxide semiconductor film is reduced.

<Modification Example 1: Regarding Base Insulating Film>

In the transistor 50 described in this embodiment, a base insulating film can be provided between the substrate 11 and the gate electrode 15 as necessary. As a material of the base insulating film, silicon oxide, silicon oxynitride, silicon nitride, silicon nitride oxide, gallium oxide, hafnium oxide, yttrium oxide, aluminum oxide, aluminum oxynitride, and the like can be given as examples. Note that when silicon nitride, gallium oxide, hafnium oxide, yttrium oxide, aluminum oxide, or the like is used as a material of the base insulating film, it is possible to suppress diffusion of impurities such as alkali metal, water, and hydrogen into the oxide semiconductor film 18 from the substrate 11.

The base insulating film can be formed by a sputtering method, a CVD method, or the like.

<Modification Example 2: Regarding Gate Insulating Film>

In the transistor 50 described in this embodiment, the gate insulating film 17 can have a stacked-layer structure as necessary. Here, structures of the gate insulating film 17 are described with reference to FIGS. 3A to 3C.

Figure 3A:
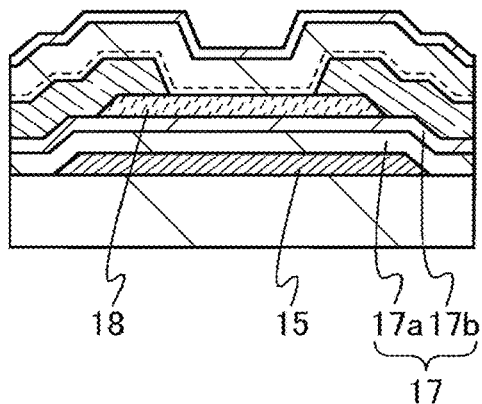
FIGS. 3A to 3C are cross-sectional views each illustrating one embodiment of a transistor.

As shown in FIG. 3A, the gate insulating film 17 can have a stacked-layer structure in which a nitride insulating film 17a and an oxide insulating film 17b are stacked in that order over the gate electrode 15. When the nitride insulating film 17a is provided over the gate electrode 15, an impurity, typically hydrogen, nitrogen, alkali metal, alkaline earth metal, or the like, can be prevented from moving from the gate electrode 15 to the oxide semiconductor film 18.

Further, when the oxide insulating film 17b is provided on the oxide semiconductor film 18 side, density of defect states at the interface between the gate insulating film 17 and the oxide semiconductor film 18 can be reduced. Consequently, a transistor whose electrical characteristics are hardly degraded can be obtained. Note that it is preferable to form, as the oxide insulating film 17b, an oxide insulating film containing oxygen at a higher proportion than the stoichiometric composition like the oxide insulating film 24. This is because density of defect states at the interface between the gate insulating film 17 and the oxide semiconductor film 18 can be further reduced.

Figure 3B:
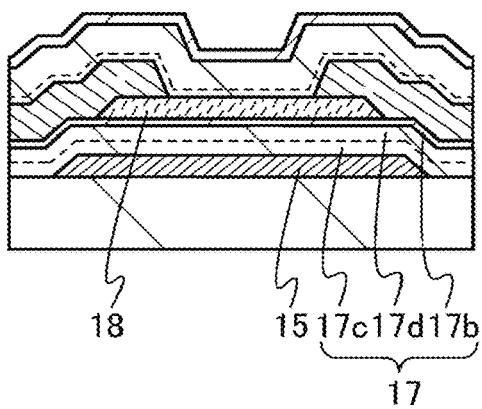

As shown in FIG. 3B, the gate insulating film 17 can have a stacked-layer structure in which a nitride insulating film 17c with few defects, a nitride insulating film 17d with a high blocking property against hydrogen, and the oxide insulating film 17b are stacked in that order from the gate electrode 15 side. When the nitride insulating film 17c with few defects is provided in the gate insulating film 17, the withstand voltage of the gate insulating film 17 can be improved. Further, when the nitride insulating film 17d with a high blocking property against hydrogen is provided, hydrogen can be prevented from moving from the gate electrode 15 and the nitride insulating film 17c to the oxide semiconductor film 18.

An example of a method for forming the nitride insulating films 17c and 17d shown in FIG. 3B is described below. First, as the nitride insulating film 17c, a silicon nitride film with few defects is formed by a plasma CVD method in which a mixed gas of silane, nitrogen, and ammonia is used as a source gas. Then, as the nitride insulating film 17d, a silicon nitride film in which the hydrogen concentration is low and hydrogen can be blocked is formed by switching the source gas to a mixed gas of silane and nitrogen. By such a formation method, the gate insulating film 17 having a stacked-layer structure of nitride insulating films with few defects and a blocking property against hydrogen can be formed.

Figure 3C:
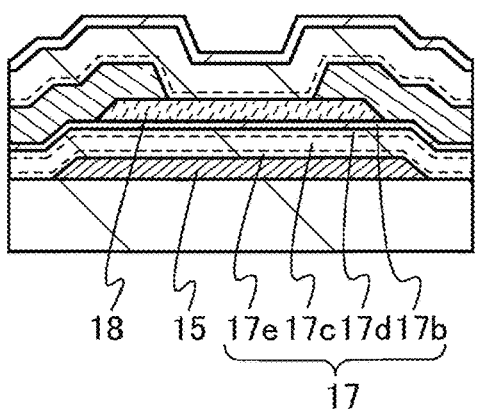

As shown in FIG. 3C, the gate insulating film 17 can have a stacked-layer structure in which a nitride insulating film 17e with a high blocking property against an impurity, the nitride insulating film 17c with few defects, the nitride insulating film 17d with a high blocking property against hydrogen, and the oxide insulating film 17b are stacked in that order from the gate electrode 15 side. When the nitride insulating film 17e with a high blocking property against an impurity is provided in the gate insulating film 17, an impurity, typically hydrogen, nitrogen, alkali metal, alkaline earth metal, or the like, can be prevented from moving from the gate electrode 15 to the oxide semiconductor film 18.

An example of a method for forming the nitride insulating films 17e, 17c, and 17d shown in FIG. 3C is described below. First, as the nitride insulating film 17e, a silicon nitride film with a high blocking property against an impurity is formed by a plasma CVD method in which a mixed gas of silane, nitrogen, and ammonia is used as a source gas. Then, a silicon nitride film with few defects is formed as the nitride insulating film 17c by increasing the flow rate of ammonia. Then, as the nitride insulating film 17d, a silicon nitride film in which the hydrogen concentration is low and hydrogen can be blocked is formed by switching the source gas to a mixed gas of silane and nitrogen. By such a formation method, the gate insulating film 17 having a stacked-layer structure of nitride insulating films with few defects and a blocking property against an impurity can be formed.

<Modification Example 3: Regarding Pair of Electrodes>

Figure 4:
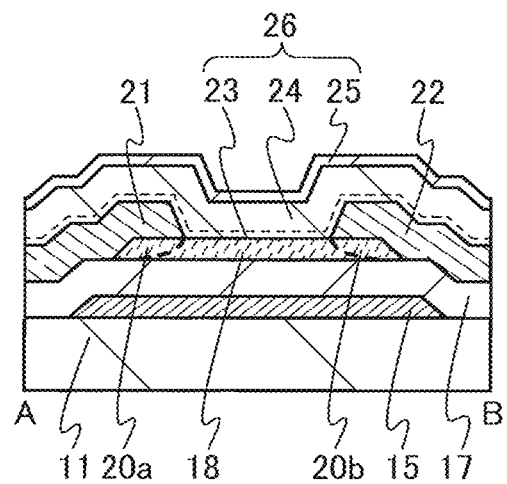
FIG. 4 is a cross-sectional view illustrating one embodiment of a transistor.

As for the pair of electrodes 21 and 22 provided in the transistor 50 described in this embodiment, it is preferable to use a conductive material which is easily bonded to oxygen, such as tungsten, titanium, aluminum, copper, molybdenum, chromium, or tantalum, or an alloy thereof. Thus, oxygen contained in the oxide semiconductor film 18 and the conductive material contained in the pair of electrodes 21 and 22 are bonded to each other, so that an oxygen deficient region is formed in the oxide semiconductor film 18. Further, in some cases, part of constituent elements of the conductive material that forms the pair of electrodes 21 and 22 is mixed into the oxide semiconductor film 18. Consequently, as shown in FIG. 4, low-resistance regions 20a and 20b are formed in the vicinity of regions of the oxide semiconductor film 18 which are in contact with the pair of electrodes 21 and 22. The low-resistance regions 20a and 20b are formed between the gate insulating film 17 and the pair of electrodes 21 and 22 so as to be in contact with the pair of electrodes 21 and 22. Since the low-resistance regions 20a and 20b have high conductivity, contact resistance between the oxide semiconductor film 18 and the pair of electrodes 21 and 22 can be reduced, and thus, the on-state current of the transistor can be increased.

Further, the pair of electrodes 21 and 22 may each have a stacked-layer structure of the conductive material which is easily bonded to oxygen and a conductive material which is not easily bonded to oxygen, such as titanium nitride, tantalum nitride, or ruthenium. With such a stacked-layer structure, oxidization of the pair of electrodes 21 and 22 can be prevented at the interface between the pair of electrodes 21 and 22 and the oxide insulating film 23, so that the increase of the resistance of the pair of electrodes 21 and 22 can be inhibited.

<Modification Example 4: Regarding Oxide Semiconductor Film>

In the method for manufacturing the transistor 50 in this embodiment, a compound formed by reaction of the oxide semiconductor film 18 can be provided on the side surface of the oxide semiconductor film 18. Here, description is made with reference to FIGS. 5A and 5B each of which is an enlarged view of the vicinity of the oxide semiconductor film 18 of the transistor 50 shown in FIG. 1B.

Figure 5A:
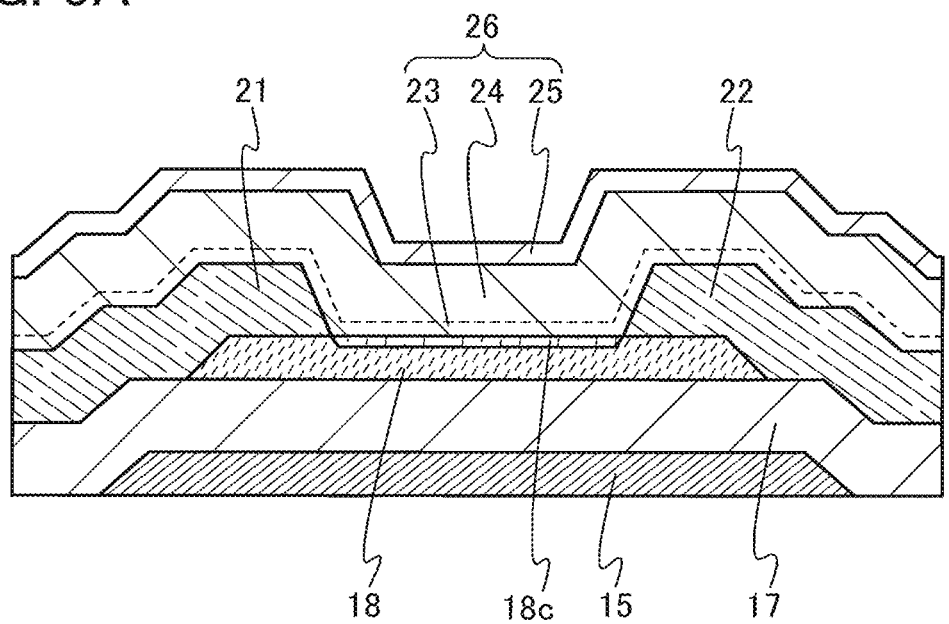
FIGS. 5A and 5B are cross-sectional views each illustrating one embodiment of a transistor.

For example, as shown in FIG. 5A, a compound 18c formed by reaction of the oxide semiconductor film 18 can be provided on the back channel side of the oxide semiconductor film 18. The compound 18c can be formed by exposure of the oxide semiconductor film 18 to an alkaline solution such as tetramethylammonium hydroxide (TMAH) solution or an acidic solution such as phosphoric acid, nitric acid, hydrofluoric acid, hydrochloric acid, sulfuric acid, acetic acid, or oxalic acid after the pair of electrodes 21 and 22 is formed.

Note that in the step, part of the oxide semiconductor film 18 is etched and reacts with the alkaline solution or the acidic solution, and thus, a reactant remains. In the case where the oxide semiconductor film 18 is formed using an In—Ga oxide or an In-M-Zn oxide (M represents Al, Ti, Ga, Y, Zr, La, Ce, Nd, or Hf), In (indium oxide) contained in the oxide semiconductor film 18 is preferentially removed in the step. Thus, the compound 18c is formed in which the proportion of Ga or M to In is higher than the proportion of Ga or M to In in the oxide semiconductor film 18.

The compound 18c in which the proportion of Ga or M is higher than the proportion of In includes Al, Ti, Ga, Y, Zr, La, Ce, Nd, or Hf as M and the proportion of Al, Ti, Ga, Y, Zr, La, Ce, Nd, or Hf in the atomic ratio is higher than the proportion of In in the atomic ratio. Thus, an impurity from the outside can be blocked, and accordingly, the amount of impurities which move from the outside to the oxide semiconductor film 18 can be reduced. Consequently, a transistor whose threshold voltage hardly fluctuates can be manufactured.

Further, by the above-described treatment, an etching residue between the pair of electrodes 21 and 22 can be removed. Thus, occurrence of leakage current flowing between the pair of electrodes 21 and 22 can be inhibited.

Figure 5B:
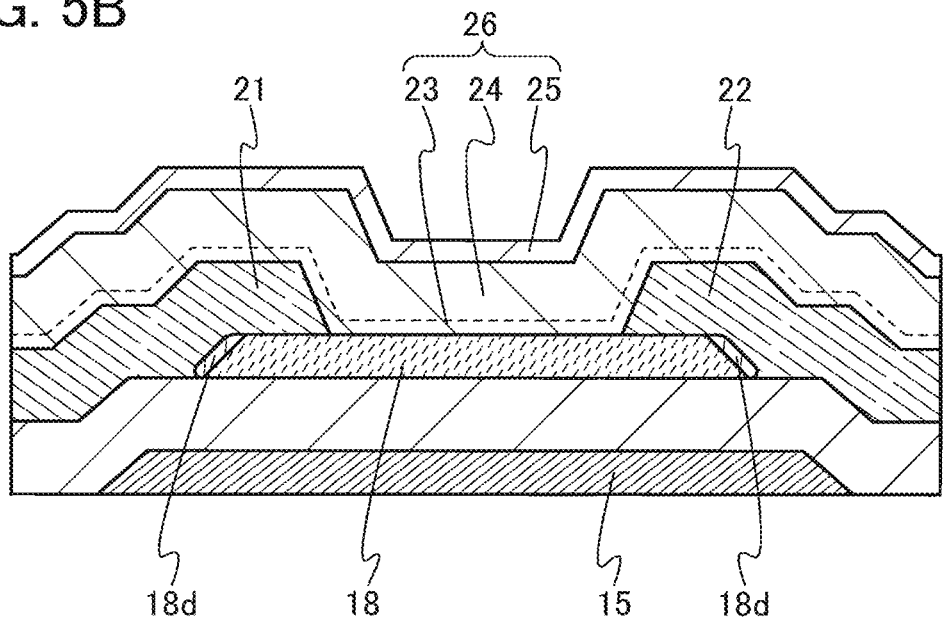

Further, as shown in FIG. 5B, a compound 18d can be provided on the side surface of the oxide semiconductor film 18. The compound 18d can be formed by performing wet etching treatment using an alkaline solution such as a TMAH solution or an acidic solution such as phosphoric acid, nitric acid, hydrofluoric acid, hydrochloric acid, sulfuric acid, acetic acid, or oxalic acid at the time of forming the oxide semiconductor film 18. Alternatively, a compound 18d can be formed by performing dry etching treatment using a boron trichloride gas and a chlorine gas as an etching gas. Further alternatively, the compound 18d can be formed by exposure of the oxide semiconductor film 18 to the above-described solution after the oxide semiconductor film 18 is formed.

The compound 18d has a proportion of Ga or M higher than a proportion of In, in a manner similar to that of the compound 18c. Thus, an impurity from the outside can be blocked by the compound 18d, and accordingly, the amount of impurities which move from the outside to the oxide semiconductor film 18 can be reduced. Consequently, a transistor whose threshold voltage hardly fluctuates can be manufactured.

<Modification Example 5: Regarding Oxide Semiconductor Film>

In the method for manufacturing the transistor 50 described in this embodiment, after the pair of electrodes 21 and 22 is formed, the oxide semiconductor film 18 may be exposed to plasma generated in an oxygen atmosphere, so that oxygen may be supplied to the oxide semiconductor film 18. Atmospheres of oxygen, ozone, dinitrogen monoxide, nitrogen dioxide, and the like can be given as examples of oxidizing atmospheres. Further, in the plasma treatment, the oxide semiconductor film 18 is preferably exposed to plasma generated with no bias applied to the substrate 11 side. Consequently, the oxide semiconductor film 18 can be supplied with oxygen without being damaged; accordingly, the amount of oxygen vacancies in the oxide semiconductor film 18 can be reduced. Moreover, impurities, e.g., halogen such as fluorine or chlorine remaining on the surface of the oxide semiconductor film 18 due to the etching treatment can be removed. The plasma treatment is preferably performed while heating is performed at a temperature higher than or equal to 300° C. Oxygen in the plasma is bonded to hydrogen contained in the oxide semiconductor film 18 to form water. Since the substrate is heated, the water is released from the oxide semiconductor film 18. Consequently, the amount of hydrogen and water in the oxide semiconductor film 18 can be reduced.

Note that the structures, methods, and the like described in this embodiment can be used as appropriate in combination with any of the structures, methods, and the like described in the other embodiments and examples.

[Embodiment 2]

In this embodiment, a semiconductor device having a transistor in which the amount of defects in an oxide semiconductor film can be further reduced as compared to Embodiment 1 is described with reference to drawings. The transistor described in this embodiment is different from that in Embodiment 1 in that a multilayer film having an oxide semiconductor film and oxide in contact with the oxide semiconductor film is included.

Figure 6A:
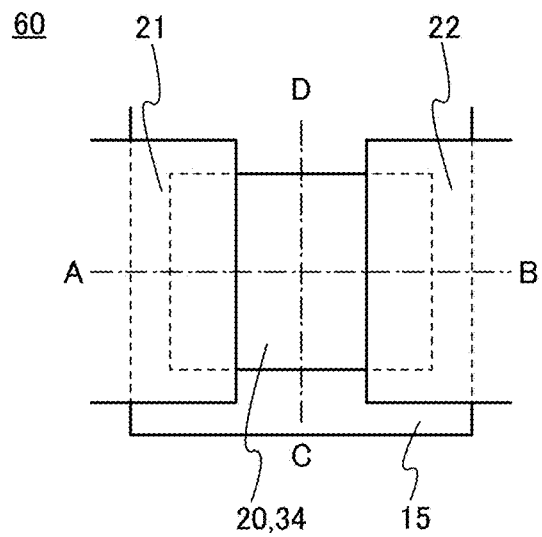
FIGS. 6A and 6B are a top view and cross-sectional views illustrating one embodiment of a transistor.
Figure 6C:
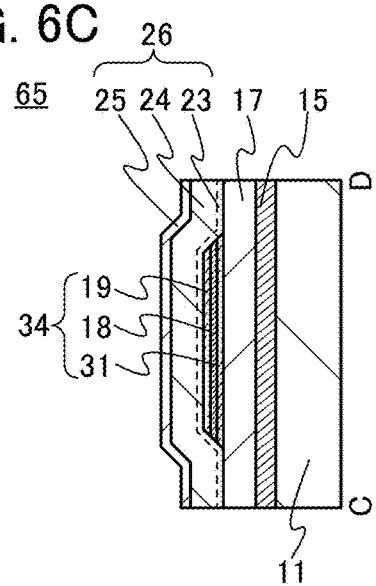
FIGS. 6C and 6D are cross-sectional views illustrating another embodiment of a transistor.
Figure 6B:
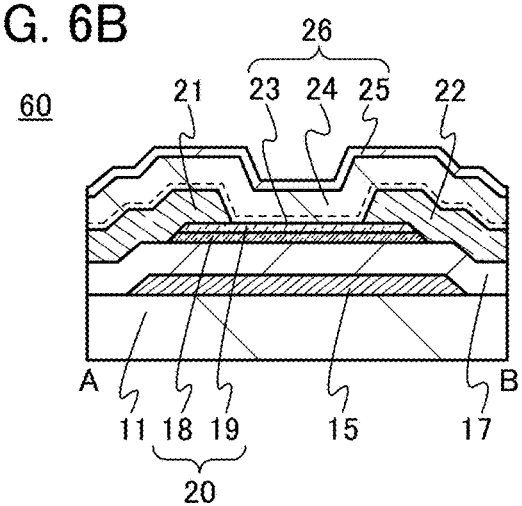

FIGS. 6A and 6B are a top view and cross-sectional views of a transistor 60 included in the semiconductor device. FIG. 6A is a top view of the transistor 60 and FIG. 6B is a cross-sectional view taken along dashed-dotted line A-B of FIG. 6A. Note that in FIG. 6A, the substrate 11, one or more of components of the transistor 60 (e.g., the gate insulating film 17), the oxide insulating film 23, the oxide insulating film 24, the nitride insulating film 25, and the like are not illustrated for clarity.

The transistor 60 shown in FIGS. 6A and 6B includes the gate electrode 15 provided over the substrate 11. Further, a multilayer film 20 overlapping with the gate electrode 15 with the gate insulating film 17 provided therebetween, and the pair of electrodes 21 and 22 being in contact with the multilayer film 20 are included. Furthermore, the protective film 26 including the oxide insulating film 23, the oxide insulating film 24, and the nitride insulating film 25 is formed over the gate insulating film 17, the multilayer film 20, and the pair of electrodes 21 and 22.

In the transistor 60 described in this embodiment, the multilayer film 20 includes the oxide semiconductor film 18 and the oxide film 19. That is, the multilayer film 20 has a two-layer structure. Further, part of the oxide semiconductor film 18 serves as a channel region. Furthermore, the oxide insulating film 23 is formed in contact with the multilayer film 20, and the oxide insulating film 24 is formed in contact with the oxide insulating film 23. That is, the oxide film 19 is provided between the oxide semiconductor film 18 and the oxide insulating film 23.

The oxide film 19 is an oxide film containing one or more elements which form the oxide semiconductor film 18. Since the oxide film 19 contains one or more elements which form the oxide semiconductor film 18, interface scattering is unlikely to occur at the interface between the oxide semiconductor film 18 and the oxide film 19. Thus, the transistor can have a high field-effect mobility because the movement of carriers is not hindered at the interface.

The oxide film 19 is typically In—Ga oxide, In—Zn oxide, or In-M-Zn oxide (M represents Al, Ti, Ga, Y, Zr, La, Ce, Nd, or Hf). The energy at the conduction band bottom of the oxide film 19 is closer to a vacuum level than that of the oxide semiconductor film 18 is, and typically, the difference between the energy at the conduction band bottom of the oxide film 19 and the energy at the conduction band bottom of the oxide semiconductor film 18 is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide film 19 and the electron affinity of the oxide semiconductor film 18 is any one of 0.05 eV or more, 0.07 eV or more, 0.1 eV or more, and 0.15 eV or more, and any one of 2 eV or less, 1 eV or less, 0.5 eV or less, and 0.4 eV or less.

The oxide film 19 preferably contains In because carrier mobility (electron mobility) can be increased.

When the oxide film 19 contains a larger amount of Al, Ti, Ga, Y, Zr, La, Ce, Nd, or Hf in an atomic ratio than the amount of In in an atomic ratio, any of the following effects may be obtained: (1) the energy gap of the oxide film 19 is widened; (2) the electron affinity of the oxide film 19 decreases; (3) an impurity from the outside is blocked; (4) an insulating property increases as compared to the oxide semiconductor film 18; and (5) oxygen vacancies are less likely to be generated in the oxide film 19 containing a larger amount of Al, Ti, Ga, Y, Zr, La, Ce, Nd, or Hf in an atomic ratio than the amount of In in an atomic ratio because Al, Ti, Ga, Y, Zr, La, Ce, Nd, or Hf is a metal element which is strongly bonded to oxygen.

In the case where the oxide film 19 is In-M-Zn oxide film, the proportions of In and M when summation of In and M is assumed to be 100 atomic % are preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %.

Further, in the case where each of the oxide semiconductor film 18 and the oxide film 19 is In-M-Zn oxide film (M represents Al, Ti, Ga, Y, Zr, La, Ce, Nd, or Hf), the proportion of M atoms (M represents Al, Ti, Ga, Y, Zr, La, Ce, Nd, or Hf) in the oxide film 19 is higher than that in the oxide semiconductor film 18. Typically, the proportion of M in each of the films is 1.5 or more times, preferably twice or more, more preferably three or more times as high as that in the oxide semiconductor film 18.

Furthermore, in the case where each of the oxide semiconductor film 18 and the oxide film 19 is In-M-Zn-based oxide film (M represents Al, Ti, Ga, Y, Zr, La, Ce, Nd, or Hf), when In:M:Zn=$x_1$:$y_1$:$z_1$ [atomic ratio] is satisfied in the oxide film 19 and In:M:Zn=$x_2$:$y_2$:$z_2$ [atomic ratio] is satisfied in the oxide semiconductor film 18, $y_1/x_1$ is higher than $y_2/x_2$. It is preferable that $y_1/x_1$ be 1.5 or more times as high as $y_2/x_2$. It is further preferable that $y_1/x_1$ be twice or more as high as $y_2/x_2$. It is still further preferable that $y_1/x_1$ be three or more times as high as $y_2/x_2$. In this case, it is preferable that in the oxide semiconductor film, $y_2$ be higher than or equal to $x_2$ because a transistor including the oxide semiconductor film can have stable electric characteristics. However, when $y_2$ is larger than or equal to three or more times $x_2$, the field-effect mobility of the transistor including the oxide semiconductor film is reduced. Accordingly, $y_2$ is preferably smaller than three times $x_2$.

In the case where the oxide semiconductor film 18 is an In-M-Zn oxide film (M represents Al, Ti, Ga, Y, Zr, La, Ce, Nd, or Hf), it is preferable that the atomic ratio of metal elements of a sputtering target used for forming the In-M-Zn oxide film satisfy In≥M and Zn≥M. As the atomic ratio of metal elements of such a sputtering target, In:M:Zn=1:1:1 and In:M:Zn=3:1:2 are preferable.

Further, in the case where the oxide film 19 is an In-M-Zn oxide film (M represents Al, Ti, Ga, Y, Zr, La, Ce, Nd, or Hf), the atomic ratio of metal elements of a sputtering target used for forming the In-M-Zn oxide film preferably satisfies M>In and Zn>0.5×M, and more preferably, Zn also satisfies Zn>M. As the atomic ratio of metal elements of such a sputtering target, In:Ga:Zn=1:3:2, In:Ga:Zn=1:3:4, In:Ga:Zn=1:3:5, In:Ga:Zn=1:3:6, In:Ga:Zn=1:3:7, In:Ga:Zn=1:3:8, In:Ga:Zn=1:3:9, In:Ga:Zn=1:3:10, In:Ga:Zn=1:6:4, In:Ga:Zn=1:6:5, In:Ga:Zn=1:6:6, In:Ga:Zn=1:6:7, In:Ga:Zn=1:6:8, In:Ga:Zn=1:6:9, and In:Ga:Zn=1:6:10 are preferable.

Note that a proportion of each atom in the atomic ratio of the oxide semiconductor film 18 and the oxide film 19 varies within a range of ±20% as an error.

The oxide film 19 also serves as a film which relieves damage to the oxide semiconductor film 18 at the time of forming the oxide insulating film 24 later.

The thickness of the oxide film 19 is greater than or equal to 3 nm and less than or equal to 100 nm, preferably greater than or equal to 3 nm and less than or equal to 50 nm.

The oxide film 19 may have a non-single-crystal structure, for example, like the oxide semiconductor film 18. The non-single crystal structure includes a c-axis aligned crystalline oxide semiconductor (CAAC-OS) which is described later, a polycrystalline structure, a microcrystalline structure described later, or an amorphous structure, for example.

The oxide film 19 may have an amorphous structure, for example. An amorphous oxide semiconductor film, for example, has disordered atomic arrangement and no crystalline component. Alternatively, an amorphous oxide film is, for example, absolutely amorphous and has no crystal part.

Note that the oxide semiconductor film 18 and the oxide film 19 may each be a mixed film including two or more of the following: a region having an amorphous structure, a region having a microcrystalline structure, a region having a polycrystalline structure, a CAAC-OS region, and a region having a single-crystal structure. The mixed film includes, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases.

Here, the oxide film 19 is provided between the oxide semiconductor film 18 and the oxide insulating film 23. Hence, if trap states are formed between the oxide film 19 and the oxide insulating film 23 owing to impurities and defects, electrons flowing in the oxide semiconductor film 18 are less likely to be captured by the trap states because there is a distance between the trap states and the oxide semiconductor film 18. Accordingly, the amount of on-state current of the transistor can be increased, and the field-effect mobility can be increased. When the electrons are captured by the trap states, the electrons become negative fixed charges. As a result, a threshold voltage of the transistor varies. However, by the distance between the oxide semiconductor film 18 and the trap states, capture of the electrons by the trap states can be reduced, and accordingly a fluctuation of the threshold voltage can be reduced.

Further, impurities from the outside can be blocked by the oxide film 19, and accordingly, the amount of impurities which move from the outside to the oxide semiconductor film 18 can be reduced. Further, an oxygen vacancy is less likely to be formed in the oxide film 19. Consequently, the impurity concentration and the amount of oxygen vacancies in the oxide semiconductor film 18 can be reduced.

Note that the oxide semiconductor film 18 and the oxide film 19 are not formed by simply stacking each film, but are formed to form a continuous junction (here, in particular, a structure in which the energy of the bottom of the conduction band is changed continuously between each film). In other words, a stacked-layer structure in which there exist no impurity which forms a defect level such as a trap center or a recombination center at each interface is provided. If an impurity exists between the oxide semiconductor film 18 and the oxide film 19 which are stacked, a continuity of the energy band is damaged, and the carrier is captured or recombined at the interface and then disappears.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

Figure 6D:
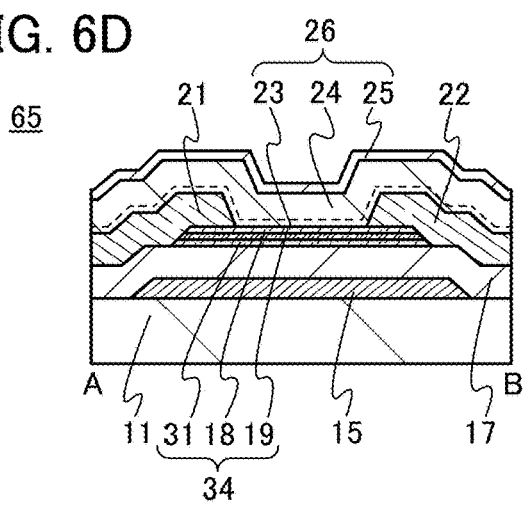

As in a transistor 65 shown in FIG. 6D, a multilayer film 34 overlapping with the gate electrode 15 with the gate insulating film 17 provided therebetween, and the pair of electrodes 21 and 22 in contact with the multilayer film 34 may be included.

The multilayer film 34 includes an oxide film 31, the oxide semiconductor film 18, and the oxide film 19. That is, the multilayer film 34 has a three-layer structure. The oxide semiconductor film 18 serves as a channel region.

Further, the gate insulating film 17 and the oxide film 31 are in contact with each other. That is, the oxide film 31 is provided between the gate insulating film 17 and the oxide semiconductor film 18.

The multilayer film 34 and the oxide insulating film 23 are in contact with each other. The oxide insulating film 23 and the oxide insulating film 24 are in contact with each other. That is, the oxide film 19 is provided between the oxide semiconductor film 18 and the oxide insulating film 23.

The oxide film 31 can be formed using a material and a formation method of the oxide film 19 described in Embodiment 1.

It is preferable that the thickness of the oxide film 31 be smaller than that of the oxide semiconductor film 18. When the thickness of the oxide film 31 is greater than or equal to 1 nm and less than or equal to 5 nm, preferably greater than or equal to 1 nm and less than or equal to 3 nm, the amount of change in threshold voltage of the transistor can be reduced.

In the case where the oxide film 19 is In-M-Zn oxide, the proportions of In and M when summation of In and M is assumed to be 100 atomic % are preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %.

In the transistor described in this embodiment, the oxide film 19 is provided between the oxide semiconductor film 18 and the oxide insulating film 23. Hence, if trap states are formed between the oxide film 19 and the oxide insulating film 23 owing to impurities and defects, electrons flowing in the oxide semiconductor film 18 are less likely to be captured by the trap states because there is a distance between the trap states and the oxide semiconductor film 18. Accordingly, the amount of on-state current of the transistor can be increased, and the field-effect mobility can be increased. When the electrons are captured by the trap states, the electrons become negative fixed charges. As a result, a threshold voltage of the transistor varies. However, by the distance between the oxide semiconductor film 18 and the trap states, capture of the electrons by the trap states can be reduced, and accordingly a fluctuation of the threshold voltage can be reduced.

Further, impurities from the outside can be blocked by the oxide film 19, and accordingly, the amount of impurities which move from the outside to the oxide semiconductor film 18 can be reduced. Further, an oxygen vacancy is less likely to be formed in the oxide film 19. Consequently, the impurity concentration and the amount of oxygen vacancies in the oxide semiconductor film 18 can be reduced.

Further, the oxide film 31 is provided between the gate insulating film 17 and the oxide semiconductor film 18, and the oxide film 19 is provided between the oxide semiconductor film 18 and the oxide insulating film 23. Thus, it is possible to reduce the concentration of silicon or carbon in the vicinity of the interface between the oxide film 31 and the oxide semiconductor film 18, the concentration of silicon or carbon in the oxide semiconductor film 18, or the concentration of silicon or carbon in the vicinity of the interface between the oxide film 19 and the oxide semiconductor film 18. Consequently, in the multilayer film 34, the absorption coefficient derived from a constant photocurrent method is lower than $1\times10^{-3}$/cm, preferably lower than $1\times10^{-4}$/cm, and thus density of localized levels is extremely low.

Since the transistor 65 having such a structure includes very few defects in the multilayer film 34 including the oxide semiconductor film 32, the electrical characteristics of the transistor can be improved, and typically, the on-state current can be increased and the field-effect mobility can be improved. Further, in a BT stress test and a BT photostress test which are examples of a stress test, the amount of change in threshold voltage is small, and thus, reliability is high.

<Band Structure of Transistor>

Next, a band structure of the multilayer film 20 provided in the transistor 60 shown in FIG. 6B is described with reference to FIGS. 7A and 7B.

Here, for example, In—Ga—Zn oxide having an energy gap of 3.15 eV is used as the oxide semiconductor film 18, and In—Ga—Zn oxide having an energy gap of 3.5 eV is used as the oxide film 19. The energy gaps can be measured using a spectroscopic ellipsometer (UT-300 manufactured by HORIBA JOBIN YVON SAS.).

The energy difference between the vacuum level and the top of the valence band (also called ionization potential) of the oxide semiconductor film 18 and the energy difference between the vacuum level and the top of the valence band of the oxide film 19 were 8 eV and 8.2 eV, respectively. Note that the energy difference between the vacuum level and the valence band top can be measured using an ultraviolet photoelectron spectroscopy (UPS) device (VersaProbe manufactured by ULVAC-PHI, Inc.).

Thus, the energy difference between the vacuum level and the bottom of the conduction band (also called electron affinity) of the oxide semiconductor film 18 and the energy gap therebetween of the oxide film 19 were 4.85 eV and 4.7 eV, respectively.

Figure 7A:
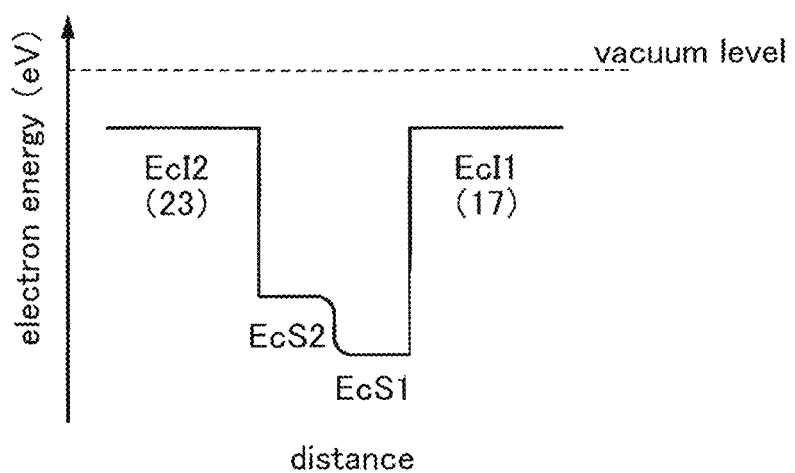
FIGS. 7A and 7B are diagrams each illustrating a band structure of a transistor.

FIG. 7A schematically illustrates a part of the band structure of the multilayer film 20. Here, the case where a silicon oxide film is provided in contact with the multilayer film 20 will be described. In FIG. 7A, EcI1 denotes the energy of the bottom of the conduction band in the silicon oxide film; EcS1 denotes the energy of the bottom of the conduction band in the oxide semiconductor film 18; EcS2 denotes the energy of the bottom of the conduction band in the oxide film 19; and EcI2 denotes the energy of the bottom of the conduction band in the silicon oxide film. Further, EcI1 and EcI2 correspond to the gate insulating film 17 and the oxide insulating film 23 in FIG. 1B, respectively.

As illustrated in FIG. 7A, there is no energy barrier between the oxide semiconductor film 18 and the oxide film 19, and the energy level of the bottom of the conduction band gradually changes therebetween. In other words, the energy level of the bottom of the conduction band is continuously changed. This is because the multilayer film 20 contains an element contained in the oxide semiconductor film 18 and oxygen is transferred between the oxide semiconductor film 18 and the oxide film 19, so that a mixed layer is formed.

As shown in FIG. 7A, the oxide semiconductor film 18 in the multilayer film 20 serves as a well and a channel region of the transistor including the multilayer film 20 is formed in the oxide semiconductor film 18. Note that since the energy of the bottom of the conduction band of the multilayer film 20 is continuously changed, it can be said that the oxide semiconductor film 18 and the oxide film 19 are continuous.

Although trap states due to impurities or defects might be formed in the vicinity of the interface between the oxide film 19 and the oxide insulating film 23 as shown in FIG. 7A, the oxide semiconductor film 18 can be distanced from the trap states owing to existence of the oxide film 19. However, when the energy difference between EcS1 and EcS2 is small, an electron in the oxide semiconductor film 18 might reach the trap state by passing over the energy difference. By being trapped in the trap state, a negative fixed charge is generated at the interface with the insulating film, whereby the threshold voltage of the transistor is shifted in the positive direction. Therefore, it is preferable that the energy difference between EcS1 and EcS2 be 0.1 eV or more, more preferably 0.15 eV or more, because a change in the threshold voltage of the transistor is reduced and stable electrical characteristics are obtained.

Figure 7B:
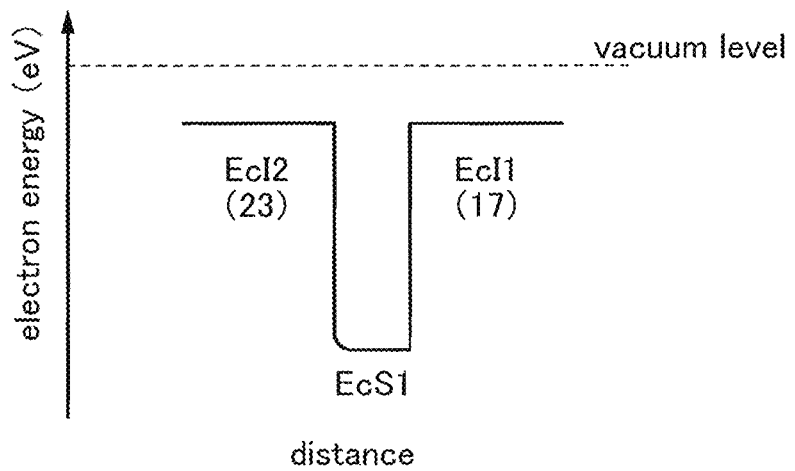

FIG. 7B schematically illustrates a part of the band structure of the multilayer film 20, which is a variation of the band structure shown in FIG. 7A. Here, a structure where silicon oxide films provided in contact with the multilayer film 20 is described. In FIG. 7B, EcI1 denotes the energy of the bottom of the conduction band in the silicon oxide film; EcS1 denotes the energy of the bottom of the conduction band in the oxide semiconductor film 18; and EcI2 denotes the energy of the bottom of the conduction band in the silicon oxide film. Further, EcI1 corresponds to the gate insulating film 17 in FIG. 1B, and EcI2 corresponds to the oxide insulating film 23 in FIG. 1B.

In the transistor illustrated in FIG. 6B, an upper portion of the multilayer film 20, that is, the oxide film 19 might be etched in formation of the pair of electrodes 21 and 22. Further, a mixed layer of the oxide semiconductor film 18 and the oxide film 19 is likely to be formed on the top surface of the oxide semiconductor film 18 in formation of the oxide film 19.

For example, when the oxide semiconductor film 18 is an oxide semiconductor film formed with use of, as a sputtering target, In—Ga—Zn oxide whose atomic ratio of In to Ga and Zn is 1:1:1 or In—Ga—Zn oxide whose atomic ratio of In to Ga and Zn is 3:1:2, and an oxide film 19 is an oxide film formed with use of, as a sputtering target, In—Ga—Zn oxide whose atomic ratio of In to Ga and Zn is 1:3:2 or In—Ga—Zn oxide whose atomic ratio of In to Ga and Zn is 1:6:4, the Ga content in the oxide film 19 is higher than that in the oxide semiconductor film 18. Thus, a GaOx layer or a mixed layer whose Ga content is higher than that in the oxide semiconductor film 18 can be formed on the top surface of the oxide semiconductor film 18.

For that reason, even in the case where the oxide film 19 is etched, the energy of the bottom of the conduction band of EcS1 on the EcI2 side is increased and the band structure shown in FIG. 7B can be obtained in some cases.

As in the band structure shown in FIG. 7B, in observation of a cross section of a channel region, only the oxide semiconductor film 18 in the multilayer film 20 is apparently observed in some cases. However, a mixed layer that contains Ga more than the oxide semiconductor film 18 does is formed over the oxide semiconductor film 18 in fact, and thus the mixed layer can be regarded as a 1.5-th layer. Note that the mixed layer can be confirmed by analyzing a composition in the upper portion of the oxide semiconductor film 18, when the elements contained in the multilayer film 20 are measured by an EDX analysis, for example. The mixed layer can be confirmed, for example, in such a manner that the Ga content in the composition in the upper portion of the oxide semiconductor film 18 is larger than the Ga content in the oxide semiconductor film 18.

[Embodiment 3]

In this embodiment, a semiconductor device having a transistor in which the amount of defects in an oxide semiconductor film can be further reduced and the amount of on-state current of the transistor can be increased as compared to Embodiments 1 and 2 is described with reference to drawings. The transistor described in this embodiment is different from that in Embodiment 1 in that an oxide film is provided between the oxide insulating film 23 and the pair of electrodes 21 and 22. Note that in this embodiment, description is made using Embodiment 1; however, this embodiment can also be applied to Embodiment 2 as appropriate.

FIGS. 9A to 9C are a top view and cross-sectional views of a transistor 70 included in the semiconductor device. A top view of the transistor 70 is shown in FIG. 9A. A cross-sectional view taken along dashed-dotted line A-B in FIG. 9A is shown in FIG. 9B, and a cross-sectional view taken along dashed-dotted line C-D is shown in FIG. 9C. Note that in FIG. 9A, the substrate 11, one or more of components of the transistor 70 (e.g., the gate insulating film 17), the oxide insulating film 23, the oxide insulating film 24, the nitride insulating film 25, and the like are not illustrated for clarity.

The transistor 70 is different from the transistor 50 in that the pair of electrodes 21 and 22 is surrounded by an oxide semiconductor film 18a and an oxide film 19a. Specifically, the transistor 70 includes the oxide semiconductor film 18a provided over the gate insulating film 17, the pair of electrodes 21 and 22 provided over the oxide semiconductor film 18a, and the oxide film 19a provided over the oxide semiconductor film 18a and the pair of electrodes 21 and 22.

The transistor 70 is a transistor in which the contact resistance between the oxide semiconductor film 18a and the pair of electrodes 21 and 22 is lower than that of the transistor 60 and the on-state current is improved as compared to the transistor 60 because the pair of electrodes 21 and 22 is in contact with the oxide semiconductor film 18a.

Further, since the pair of electrode 21 and 22 is in contact with the oxide semiconductor film 18a in the transistor 70, the oxide film 19a can be thickened without increase of the contact resistance between the oxide semiconductor film 18a and the pair of electrodes 21 and 22. Thus, it is possible to inhibit formation of a trap state, which occurs due to plasma damage at the time of forming the protective film 26, mixing of a constituent element of the protective film 26, or the like, in the vicinity of the interface between the oxide semiconductor film 18a and the oxide film 19a. That is, the transistor 70 can achieve both improvement of on-state current and reduction of change in threshold voltage.

Figure 10A:
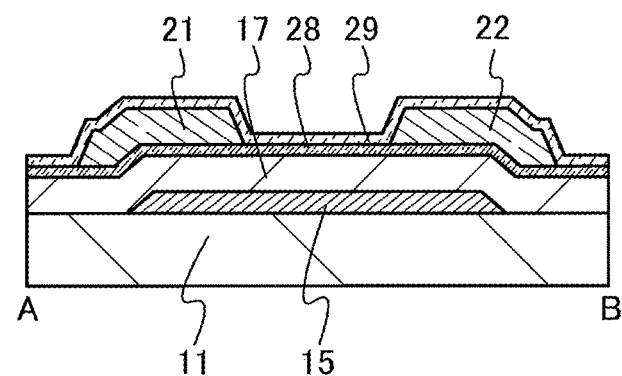
FIGS. 10A to 10C are cross-sectionals views illustrating one embodiment of a method for manufacturing a transistor.

A method for manufacturing the transistor 70 is described with reference to FIGS. 10A to 10C. First, in a manner similar to that of FIG. 2A, the gate electrode and the gate insulating film 17 are formed over the substrate 11.

Next, an oxide semiconductor film 28 which is to be the oxide semiconductor film 18a is formed, and then, the pair of electrodes 21 and 22 is formed. Next, an oxide film 29 which is to be the oxide film 19a is formed (see FIG. 10A).

A material and a formation method which are similar to those of the oxide semiconductor film 18 in Embodiment 1 can be used for the oxide semiconductor film 28. Further, the pair of electrodes 21 and 22 can be formed in a manner similar to that of FIG. 2B. Note that the pair of electrodes 21 and 22 is formed over the oxide semiconductor film 28. A material and a formation method which are similar to those of the oxide film 19 in Embodiment 1 can be used for the oxide film 29.

Figure 10B:
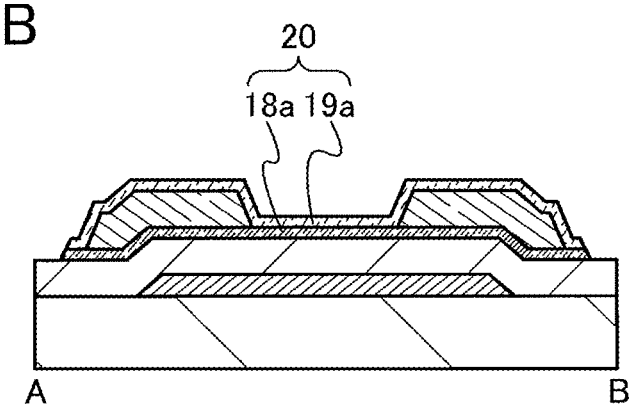

Next, part of the oxide semiconductor film 28 and part of the oxide film 29 are etched to form the multilayer film 20 including the oxide semiconductor film 18a and the oxide film 19a (see FIG. 10B). Note that the etching can be implemented with the use of a mask after the mask is formed by a photolithography process over the oxide film which is to be the oxide film 29. The oxide semiconductor film 28 and the oxide film 29 are concurrently etched; thus, the edge portion of the oxide semiconductor film 18a is roughly aligned with the edge portion of the oxide film 19a.

Figure 10C:
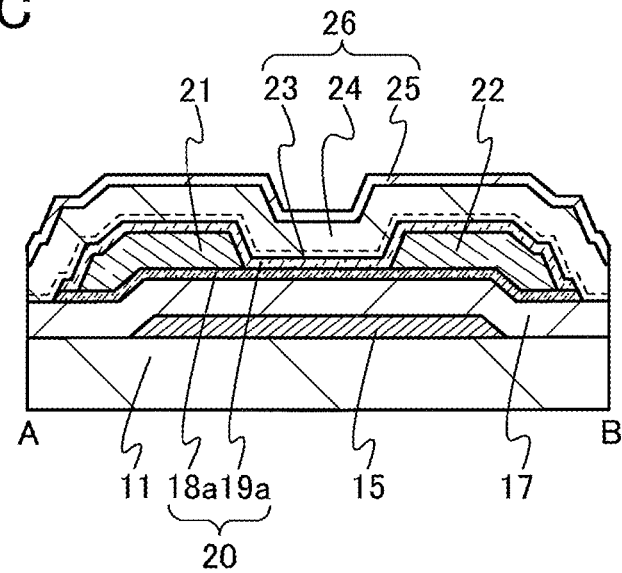

Next, the protective film 26 is formed to cover the gate insulating film 17, the multilayer film 20, and the pair of electrodes 21 and 22 (see FIG. 10C). The protective film 26 can be formed in a manner similar to Embodiment 1. Further, in the method for manufacturing the transistor 70, heat treatment can be performed with reference to Embodiment 1 as appropriate.

Further, by the etching for forming the pair of electrodes 21 and 22, defects such as oxygen vacancies are generated in the oxide semiconductor film 18a and the carrier density is increased in some cases; therefore, before the oxide film 29 is formed, the oxide semiconductor film 18a is preferably exposed to plasma generated in an oxygen atmosphere so that oxygen is supplied to the oxide semiconductor film 18a. Thus, in the transistor 70, formation of a trap state in the vicinity of the interface between the oxide semiconductor film 18a and the oxide film 19a can be inhibited, and change in threshold voltage can be reduced. Further, in the transistor 70, leakage current that flows in the vicinity of the side surface of the oxide semiconductor film 18a in the multilayer film 20 can be reduced, and increase of off-state current can be inhibited.

Although the etching for forming the pair of electrodes 21 and 22 damages the multilayer film 20 and generates oxygen vacancies on the back channel side of the multilayer film 20, part of oxygen contained in the oxide insulating film 24 can be moved to the oxide semiconductor film 18a, whereby the oxygen vacancies in the oxide semiconductor film 18a can be repaired. Accordingly, the reliability of the transistor 70 can be improved.

<Modification Example 1>

In the transistor 70 described in this embodiment, the stacked-layer structure of the multilayer film 20 and the pair of electrodes 21 and 22 may be changed as appropriate. For example, a transistor as shown in FIG. 11 can be given as a modification example.

Figure 11:
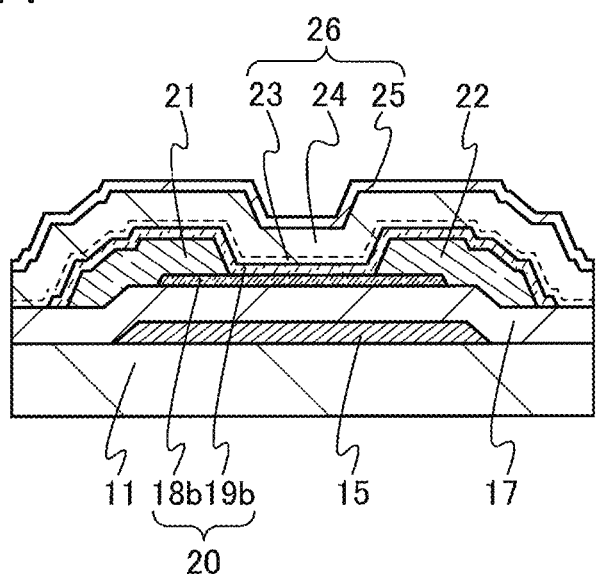
FIG. 11 is a cross-sectional view illustrating one embodiment of a transistor.

The transistor shown in FIG. 11 is different from the transistor 60 in that an oxide semiconductor film 18b and an oxide film 19b are formed in different steps. That is, the edge portion of the oxide semiconductor film 18b is covered with the pair of electrodes 21 and 22 and is not in contact with the oxide film 19b.

The transistor shown in FIG. 11 is a transistor in which the contact resistance between the multilayer film 20 and the pair of electrodes 21 and 22 is lower than that of the transistor 50 and the on-state current is improved as compared to the transistor 50 because the pair of electrodes 21 and 22 is in direct contact with the oxide semiconductor film 18b.

Further, since the pair of electrodes 21 and 22 is in direct contact with the oxide semiconductor film 18b in the transistor shown in FIG. 11, the oxide film 19b can be thickened without increase of the contact resistance between the multilayer film 20 and the pair of electrodes 21 and 22. Thus, it is possible to inhibit formation of a trap state, which occurs due to plasma damage at the time of forming the protective film 26, mixing of a constituent element of the protective film 26, or the like, in the vicinity of the interface between the oxide semiconductor film 18b and the oxide film 19b. That is, the transistor shown in FIG. 11 can achieve both improvement of on-state current and reduction of change in threshold voltage.

Note that the structures, methods, and the like described in this embodiment can be used as appropriate in combination with any of the structures, methods, and the like described in the other embodiments and examples.

[Embodiment 4]

In this embodiment, a transistor having a structure different from those of Embodiments 1 to 3 will be described with reference to FIG. 12. A transistor 80 described in this embodiment includes a plurality of gate electrodes facing each other with an oxide semiconductor film provided therebetween.

Figure 12:
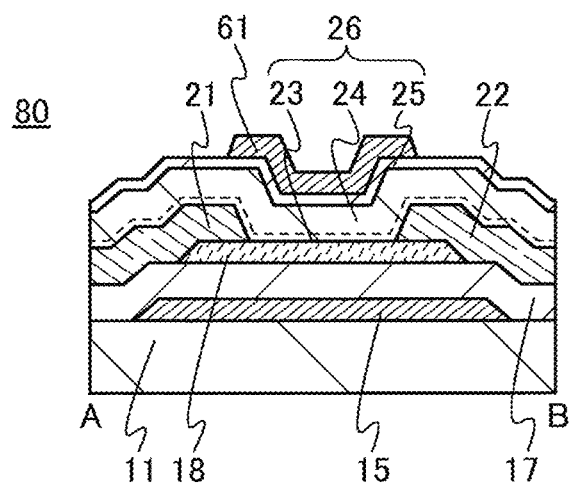
FIG. 12 is a cross-sectional view illustrating one embodiment of a transistor.

The transistor 80 shown in FIG. 12 includes the gate electrode 15 provided over the substrate 11. Moreover, the gate insulating film 17 over the substrate 11 and the gate electrode 15, the oxide semiconductor film 18 overlapping with the gate electrode 15 with the gate insulating film 17 provided therebetween, and the pair of electrodes 21 and 22 in contact with the oxide semiconductor film 18 are included. Furthermore, the protective film 26 including the oxide insulating film 23, the oxide insulating film 24, and the nitride insulating film 25 is formed over the gate insulating film 17, the oxide semiconductor film 18, and the pair of electrodes 21 and 22. Further, a gate electrode 61 overlapping with the oxide semiconductor film 18 with the protective film 26 provided therebetween is included.

The gate electrode 61 can be formed in a manner similar to that of the gate electrode 15.

The transistor 80 described in this embodiment has the gate electrode 15 and the gate electrode 61 facing each other with the oxide semiconductor film 18 provided therebetween. By applying different potentials to the gate electrode 15 and the gate electrode 61, the threshold voltage of the transistor 80 can be controlled.

Further, when the oxide semiconductor film 18 in which the amount of oxygen vacancies is reduced is included, the electrical characteristics of the transistor can be improved. Further, the transistor in which the amount of change in threshold voltage is small and which is highly reliable is obtained.

Note that the structures, methods, and the like described in this embodiment can be used as appropriate in combination with any of the structures, methods, and the like described in the other embodiments and examples.

[Embodiment 5]

In this embodiment, a transistor having a different structure from the transistors in Embodiments 1 to 4 will be described with reference to FIGS. 13A to 13C.

In this embodiment, a semiconductor device having a transistor in which the amount of defects in an oxide semiconductor film can be further reduced as compared to Embodiments 1 to 4 is described with reference to drawings. The transistor described in this embodiment is different from those in Embodiments 1 to 4 in that the back channel side of the oxide semiconductor film 18 is covered with the protective film and is not exposed to plasma generated in the etching treatment for forming the pair of electrodes.

Figure 13A:
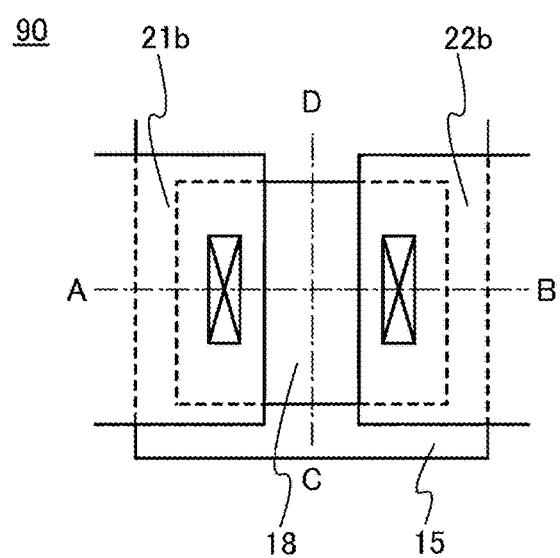
FIGS. 13A to 13C are a top view and cross-sectional views illustrating one embodiment of a transistor.
Figure 13C:
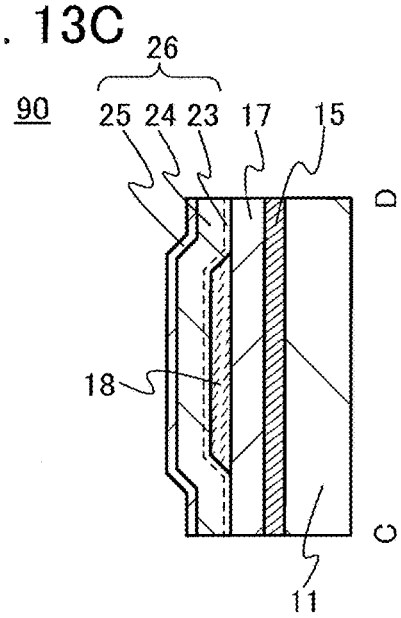
Figure 13B:
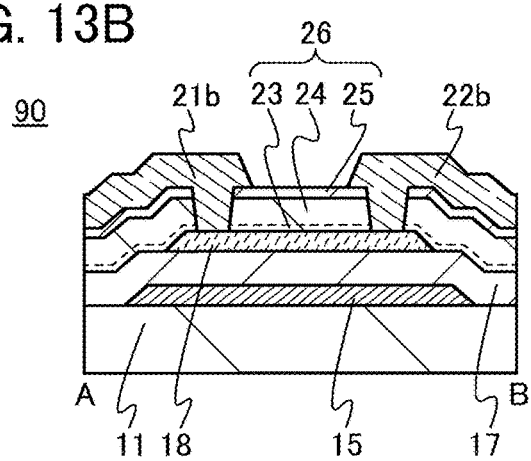

FIGS. 13A to 13C are a top view and cross-sectional views of a transistor 90 included in the semiconductor device. FIG. 13A is a top view of the transistor 90, FIG. 13B is a cross-sectional view taken along dashed-dotted line A-B in FIG. 13A, and FIG. 13C is a cross-sectional view taken along dashed-dotted line C-D in FIG. 13A. Note that in FIG. 13A, the substrate 11, one or more of components of the transistor 90 (e.g., the gate insulating layer 17), the oxide insulating film 23, the oxide insulating film 24, the nitride insulating film 25, and the like are not illustrated for clarity.

The transistor 90 shown in FIGS. 13A to 13C includes the gate electrode 15 provided over the substrate 11. Moreover, the gate insulating film 17 over the substrate 11 and the gate electrode 15, and the oxide semiconductor film 18 overlapping with the gate electrode 15 with the gate insulating film 17 provided therebetween are provided. Further, the protective film 26 including the oxide insulating film 23, the oxide insulating film 24, and the nitride insulating film 25 is provided over the gate insulating film 17 and the oxide semiconductor film 18, and a pair of electrodes 21b and 22b which is formed over the protective film 26 and is connected to the oxide semiconductor film 18 in the opening of the protective film 26 is provided.

Next, a method for manufacturing the transistor 90 is described.

In a manner similar to Embodiment 1, the gate electrode 15 is formed over the substrate 11, and the gate insulating film 17 is formed over the substrate 11 and the gate electrode 15. Next, the oxide semiconductor film 18 is formed over the gate insulating film 17.

Next, in a manner similar to Embodiment 1, after the oxide insulating film 23 is formed over the gate insulating film 17 and the oxide semiconductor film 18 while heating is performed at a temperature higher than or equal to 280° C. and lower than or equal to 400° C., the oxide insulating film 24 and the nitride insulating film 25 are formed. Note that after the oxide insulating film 24 is formed, heat treatment is performed to supply part of oxygen contained in the oxide insulating film 24 to the oxide semiconductor film 18.

Next, parts of the oxide insulating film 23, the oxide insulating film 24, and the nitride insulating film 25 are etched to form an opening which exposes part of the oxide semiconductor film 18. After that, the pair of electrodes 21b and 22b in contact with the oxide semiconductor film 18 is formed in a manner similar to Embodiment 1.

In this embodiment, the oxide semiconductor film 18 is covered with the protective film 26 at the time of etching the pair of electrodes 21b and 22b; thus, the oxide semiconductor film 18, particularly a back channel region of the oxide semiconductor film 18, is not damaged by the etching for forming the pair of electrodes 21b and 22b. Further, the oxide insulating film 24 is formed using an oxide insulating film which contains oxygen at a higher proportion than the stoichiometric composition. Therefore, part of oxygen contained in the oxide insulating film 24 can be moved to the oxide semiconductor film 18 to compensate the oxygen vacancies in the oxide semiconductor film 18. Consequently, the amount of oxygen vacancies in the oxide semiconductor film 18 can be reduced.

By the above-described process, defects contained in the oxide semiconductor film 18 can be reduced, and thus, the reliability of the transistor 90 can be improved.

[Embodiment 6]

In this embodiment, a transistor having a different structure from the transistors in Embodiments 1 to 5 will be described with reference to FIGS. 14A to 14C.

In this embodiment, a semiconductor device having a transistor in which the amount of defects in an oxide semiconductor film can be further reduced as compared to Embodiments 1 to 4 is described with reference to drawings. The transistor described in this embodiment is different from those in Embodiments 1 to 4 in that the back channel side of the oxide semiconductor film 18 is covered with the protective film and is not exposed to plasma generated in the etching treatment for forming the pair of electrodes in a manner similar to Embodiment 5.

Figure 14A:
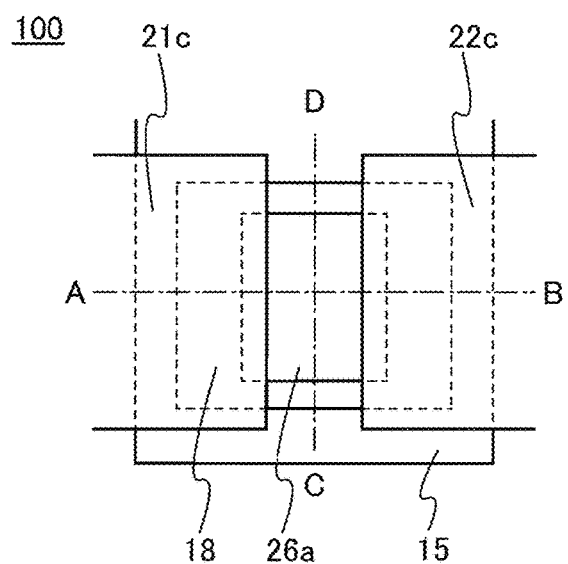
FIGS. 14A to 14C are a top view and cross-sectional views illustrating one embodiment of a transistor.
Figure 14C:
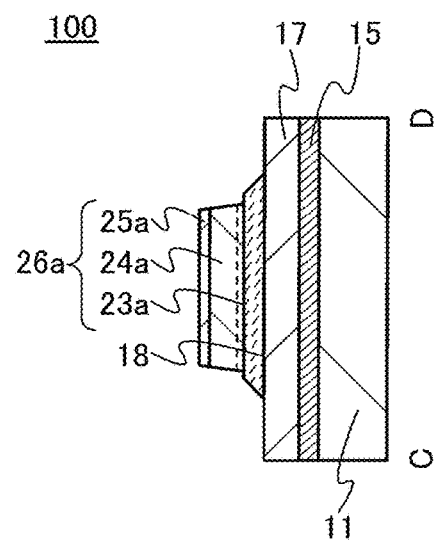
Figure 14B:
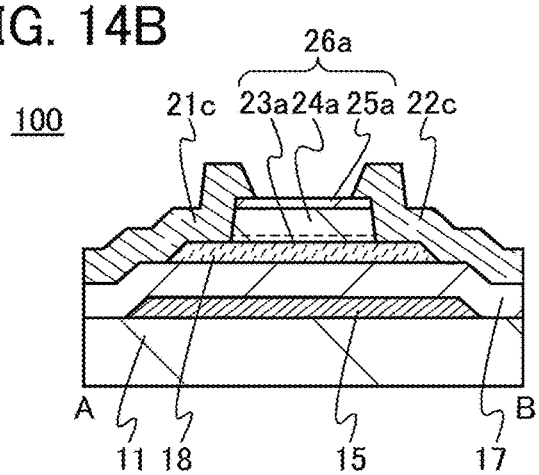

FIGS. 14A to 14C are a top view and cross-sectional views of a transistor 100 included in the semiconductor device. The transistor 100 shown in FIGS. 14A to 14C is a channel protective type transistor. FIG. 14A is a top view of the transistor 100, FIG. 14B is a cross-sectional view taken along dashed-dotted line A-B in FIG. 14A, and FIG. 14C is a cross-sectional view taken along dashed-dotted line C-D in FIG. 14A. Note that in FIG. 14A, the substrate 11 and one or more of components of the transistor 100 (e.g., the gate insulating layer 17) are not illustrated for clarity.

The transistor 100 shown in FIGS. 14A to 14C includes the gate electrode 15 over the substrate 11. Moreover, the gate insulating film 17 over the substrate 11 and the gate electrode 15, and the oxide semiconductor film 18 overlapping with the gate electrode 15 with the gate insulating film 17 provided therebetween are provided. Further, the protective film 26a including an oxide insulating film 23a, an oxide insulating film 24a, and a nitride insulating film 25a is provided over the gate insulating film 17 and the oxide semiconductor film 18, and a pair of electrodes 21c and 22c which is formed over the gate insulating film 17, the oxide semiconductor film 18, and the protective film 26a is provided.

Next, a method for manufacturing the transistor 100 is described.

In a manner similar to Embodiment 1, the gate electrode 15 is formed over the substrate 11, and the gate insulating film 17 is formed over the substrate 11 and the gate electrode 15. Next, the oxide semiconductor film 18 is formed over the gate insulating film 17.

Next, in a manner similar to Embodiment 1, after the oxide insulating film 23 is formed over the gate insulating film 17 and the oxide semiconductor film 18 while heating is performed at a temperature higher than or equal to 280° C. and lower than or equal to 400° C., the oxide insulating film 24 and the nitride insulating film 25 are formed. Note that after the oxide insulating film 24 is formed, heat treatment is performed to supply part of oxygen contained in the oxide insulating film 24 to the oxide semiconductor film 18.

Next, parts of the oxide insulating film 23, the oxide insulating film 24, and the nitride insulating film 25 are etched to form the protective film 26a including the oxide insulating film 23a, the oxide insulating film 24a, and the nitride insulating film 25a.

After that, the pair of electrodes 21c and 22c in contact with the oxide semiconductor film 18 is formed in a manner similar to Embodiment 1.

In this embodiment, the oxide semiconductor film 18 is covered with the protective film 26a at the time of etching the pair of electrodes 21c and 22c; thus, the oxide semiconductor film 18 is not damaged by the etching for forming the pair of electrodes 21c and 22c. Further, the oxide insulating film 24a is formed using an oxide insulating film which contains oxygen at a higher proportion than the stoichiometric composition. Therefore, part of oxygen contained in the oxide insulating film 24a can be moved to the oxide semiconductor film 18 to compensate the oxygen vacancies in the oxide semiconductor film 18. Consequently, the amount of oxygen vacancies in the oxide semiconductor film 18 can be reduced.

Note that the nitride insulating film 25a is formed in the protective film 26a in FIGS. 14A to 14C; however, the protective film 26a may have a stacked-layer structure of the oxide insulating film 23a and the oxide insulating film 24a. In that case, the nitride insulating film 25a is preferably formed after the pair of electrodes 21c and 22c is formed. Thus, hydrogen, water, or the like can be prevented from entering the oxide semiconductor film 18 from the outside.

By the above-described process, defects contained in the oxide semiconductor film 18 can be reduced, and thus, the reliability of the transistor 100 can be improved.

[Embodiment 7]

Although the variety of films such as the metal film, the oxide semiconductor film, and the inorganic insulating film which are described in the above embodiments can be formed by a sputtering method or a plasma chemical vapor deposition (CVD) method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The variety of films such as the metal film, the oxide semiconductor film, and the inorganic insulating film which are described in the above embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed using a deposition apparatus employing ALD, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed using a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an SiH$_4$ gas may be used instead of a B$_2$H$_6$ gas.

For example, in the case where an oxide semiconductor film, e.g., an In—Ga—Zn—O film is formed using a deposition apparatus employing ALD, an In(CH$_3$)$_3$ gas and an O$_3$ gas are sequentially introduced plural times to form an In—O layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an In—Ga—O layer, an In—Zn—O layer or a Ga—Zn—O layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Further, instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Instead of an In(CH$_3$)$_3$ gas, an In(C$_2$H$_5$)$_3$ gas may be used. Furthermore, a Zn(CH$_3$)$_2$ gas may be used.

[Embodiment 8]

In this embodiment, a semiconductor device of one embodiment of the present invention is described with reference to drawings. Note that in this embodiment, a semiconductor device of one embodiment of the present invention is described taking a display device as an example.

Figure 15A:
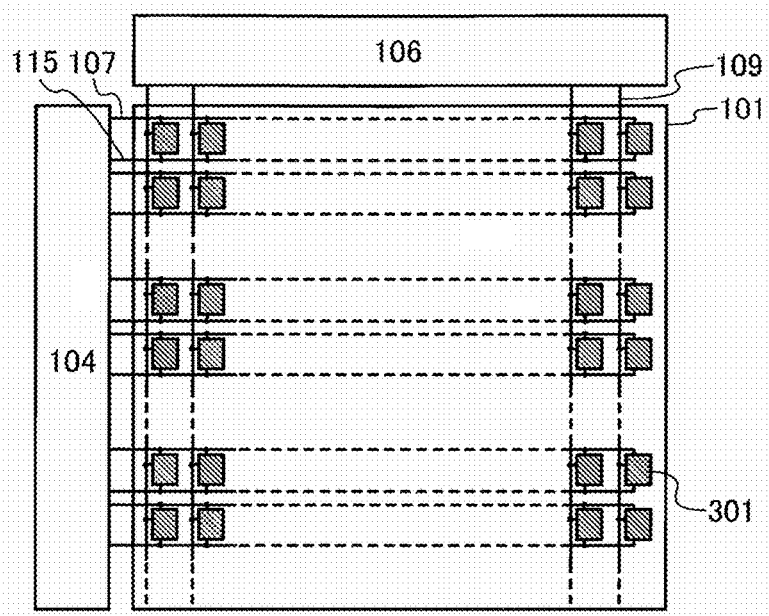
FIGS. 15A to 15C are a block diagram and circuit diagrams illustrating one embodiment of a semiconductor device.

FIG. 15A illustrates an example of a semiconductor device. The semiconductor device in FIG. 15A includes a pixel portion 101, a scan line driver circuit 104, a signal line driver circuit 106, m scan lines 107 which are arranged in parallel or substantially in parallel and whose potentials are controlled by the scan line driver circuit 104, and n signal lines 109 which are arranged in parallel or substantially in parallel and whose potentials are controlled by the signal line driver circuit 106. Further, the pixel portion 101 includes a plurality of pixels 301 arranged in a matrix. Furthermore, capacitor lines 115 arranged in parallel or substantially in parallel are provided along the scan lines 107. Note that the capacitor lines 115 may be arranged in parallel or substantially in parallel along the signal lines 109. The scan line driver circuit 104 and the signal line driver circuit 106 are collectively referred to as a driver circuit portion in some cases.

Each scan line 107 is electrically connected to the n pixels 301 in the corresponding row among the pixels 301 arranged in m rows and n columns in the pixel portion 101. Each signal line 109 is electrically connected to the m pixels 301 in the corresponding column among the pixels 301 arranged in m rows and n columns. Note that m and n are each an integer of 1 or more. Each capacitor line 115 is electrically connected to the n pixels 301 in the corresponding row among the pixels 301 arranged in m rows and n columns. Note that in the case where the capacitor lines 115 are arranged in parallel or substantially in parallel along the signal lines 109, each capacitor line 115 is electrically connected to the m pixels 301 in the corresponding column among the pixels 301 arranged in m rows and n columns.

Figure 15B:
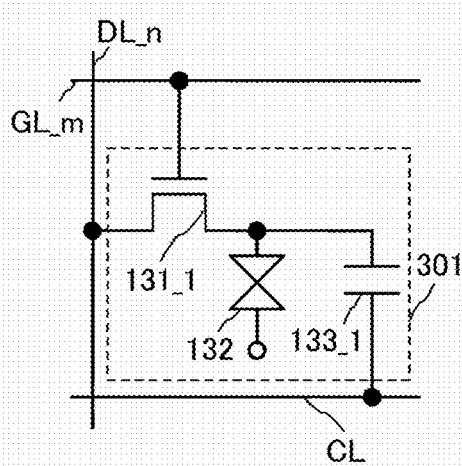
Figure 15C:
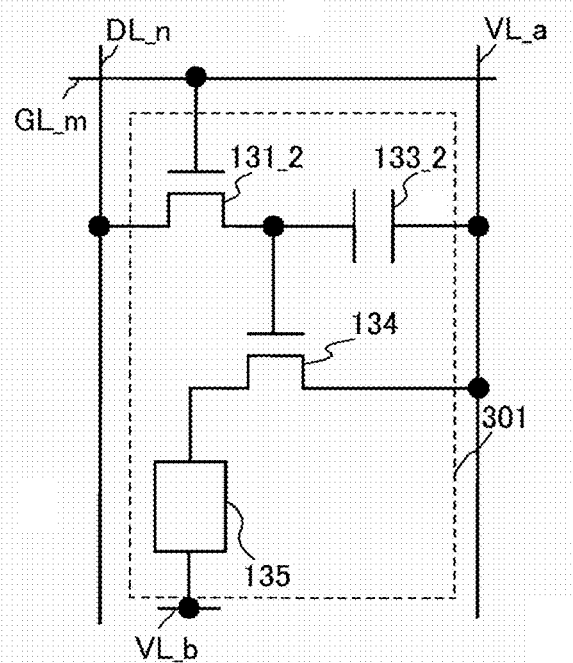

FIGS. 15B and 15C illustrate circuit configurations that can be used for the pixels 301 in the display device illustrated in FIG. 15A.

The pixel 301 illustrated in FIG. 15B includes a liquid crystal element 132, a transistor 131_1, and a capacitor 133_1.

The potential of one of a pair of electrodes of the liquid crystal element 132 is set according to the specifications of the pixels 301 as appropriate. The alignment state of the liquid crystal element 132 depends on written data. A common potential may be applied to one of the pair of electrodes of the liquid crystal element 132 included in each of the plurality of pixels 301. Further, the potential supplied to one of a pair of electrodes of the liquid crystal element 132 in the pixel 301 in one row may be different from the potential supplied to one of a pair of electrodes of the liquid crystal element 132 in the pixel 301 in another row.

As examples of a driving method of the display device including the liquid crystal element 132, any of the following modes can be given: a TN mode, an STN mode, a VA mode, an ASM (axially symmetric aligned micro-cell) mode, an OCB (optically compensated birefringence) mode, an FLC (ferroelectric liquid crystal) mode, an AFLC (anti-ferroelectric liquid crystal) mode, an MVA mode, a PVA (patterned vertical alignment) mode, an IPS mode, an FFS mode, a TBA (transverse bend alignment) mode, and the like. Other examples of the driving method of the display device include ECB (electrically controlled birefringence) mode, PDLC (polymer dispersed liquid crystal) mode, PNLC (polymer network liquid crystal) mode, and a guest-host mode. Note that the present invention is not limited to these examples, and various liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel 301 in the m-th row and the n-th column, one of a source electrode and a drain electrode of the transistor 131_1 is electrically connected to a signal line DL_n, and the other is electrically connected to the other of a pair of electrodes of the liquid crystal element 132. A gate electrode of the transistor 131_1 is electrically connected to a scan line GL_m. The transistor 131_1 has a function of controlling whether to write a data signal by being turned on or off.

One of a pair of electrodes of the capacitor 133_1 is electrically connected to a wiring to which a potential is supplied (hereinafter referred to as a capacitor line CL), and the other is electrically connected to the other of the pair of electrodes of the liquid crystal element 132. The potential of the capacitor line CL is set in accordance with the specifications of the pixel 301 as appropriate. The capacitor 133_1 functions as a storage capacitor for storing written data.

For example, in the display device including the pixel 301 in FIG. 15B, the pixels 301 are sequentially selected row by row by the scan line driver circuit 104, whereby the transistors 131_1 are turned on and a data signal is written.

When the transistors 131_1 are turned off, the pixels 301 in which the data has been written are brought into a holding state. This operation is sequentially performed row by row; thus, an image is displayed.

The pixel 301 illustrated in FIG. 15C includes a transistor 131_2, a capacitor 133_2, a transistor 134, and a light-emitting element 135.

One of a source electrode and a drain electrode of the transistor 1312 is electrically connected to a wiring to which a data signal is supplied (hereinafter referred to as signal line DL_n). A gate electrode of the transistor 131_2 is electrically connected to a wiring to which a gate signal is supplied (hereinafter referred to as scan line GL_m).

The transistor 131_2 has a function of controlling whether to write a data signal by being turned on or off.

One of a pair of electrodes of the capacitor 133_2 is electrically connected to a wiring to which a potential is supplied (hereinafter referred to as a potential supply line VL_a), and the other is electrically connected to the other of the source electrode and the drain electrode of the transistor 131_2.

The capacitor 133_2 functions as a storage capacitor for storing written data.

One of a source electrode and a drain electrode of the transistor 134 is electrically connected to the potential supply line VL_a. Further, a gate electrode of the transistor 134 is electrically connected to the other of the source electrode and the drain electrode of the transistor 131_2.

One of an anode and a cathode of the light-emitting element 135 is electrically connected to a potential supply line VL_b, and the other is electrically connected to the other of the source electrode and the drain electrode of the transistor 134.

As the light-emitting element 135, an organic electroluminescent element (also referred to as an organic EL element) or the like can be used, for example. Note that the light-emitting element 135 is not limited to organic EL elements; an inorganic EL element including an inorganic material can be used.

A high power supply potential VDD is supplied to one of the potential supply line VL_a and the potential supply line VL_b, and a low power supply potential VSS is supplied to the other.

In the display device including the pixel 301 in FIG. 15C, the pixels 301 are sequentially selected row by row by the scan line driver circuit 104, whereby the transistors 131_2 are turned on and a data signal is written.

When the transistors 131_2 are turned off, the pixels 301 in which the data has been written are brought into a holding state. Further, the amount of current flowing between the source electrode and the drain electrode of the transistor 134 is controlled in accordance with the potential of the written data signal. The light-emitting element 135 emits light with a luminance corresponding to the amount of flowing current. This operation is sequentially performed row by row; thus, an image is displayed.

Note that in this specification and the like, a display element, a display device which is a device including a display element, a light-emitting element, and a light-emitting device which is a device including a light-emitting element can employ various modes or can include various elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD), a piezoelectric ceramic display, or a carbon nanotube, which are display media whose contrast, luminance, reflectivity, transmittance, or the like is changed by electromagnetic action. Note that examples of a display device having an EL element include an EL display and the like. Examples of a display device having an electron emitter include a field emission display (FED), an SED-type flat panel display (SED: surface-conduction electron-emitter display), and the like. Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display) and the like. Examples of a display device having an electronic ink or electrophoretic element include electronic paper.

Examples of an EL element are an element including an anode, a cathode, and an EL layer interposed between the anode and the cathode, and the like. Examples of an EL layer include, but are not limited to, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer including an organic material, a layer including an inorganic material, a layer including an organic material and an inorganic material, a layer including a high-molecular material, a layer including a low-molecular material, a layer including a high-molecular material and a low-molecular material, and the like. Further, various types of EL elements can be used as well as these examples.

An example of liquid crystal elements is an element where transmission and non-transmission of light is controlled by optical modulation action of liquid crystals. The element can be configured to include a pair of electrodes and a liquid crystal layer. The optical modulation action of liquid crystal is controlled by an electric field applied to the liquid crystal (including a lateral electric field, a vertical electric field and a diagonal electric field). Note that specifically, the following can be used for a liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and the like.

Figure 16:
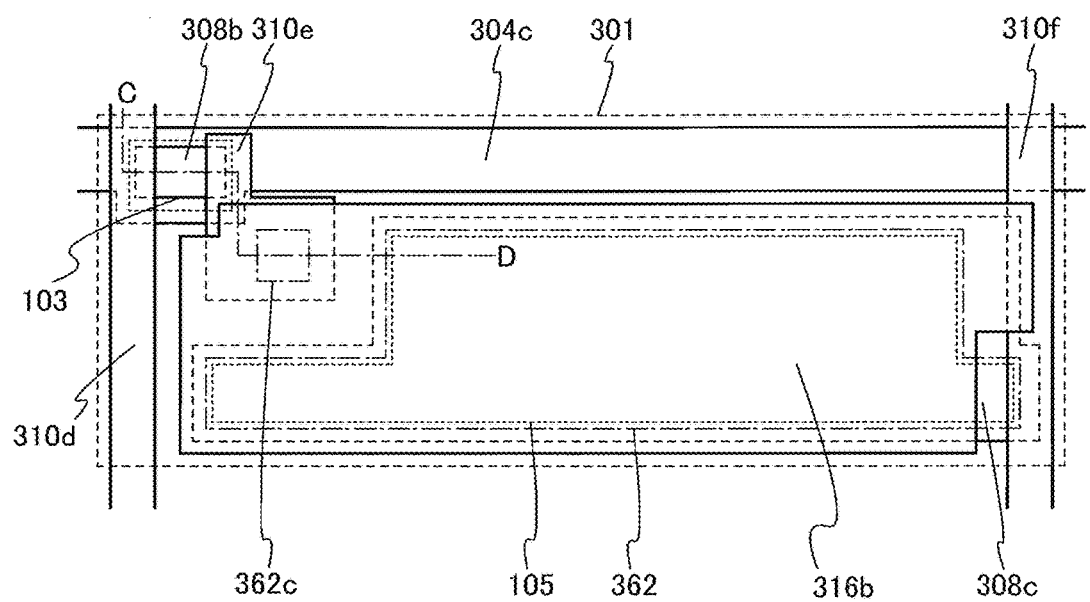
FIG. 16 is a top view illustrating one embodiment of a semiconductor device.

Next, a specific example of a liquid crystal display device including a liquid crystal element in the pixel 301 is described. FIG. 16 is a top view of the pixel 301 illustrated in FIG. 15B. Note that in FIG. 16, a counter electrode and a liquid crystal element are omitted.

In FIG. 16, a conductive film 304c serving as a scan line extends substantially perpendicularly to the signal line (in the horizontal direction in the drawing). A conductive film 310d serving as a signal line extends substantially perpendicularly to the scan line (in the vertical direction in the drawing). A conductive film 310f serving as a capacitor line extends in parallel to the signal line. Note that the conductive film 304c serving as a scan line is electrically connected to the scan line driver circuit 104 (see FIG. 15A), and the conductive film 310d serving as a signal line and the conductive film 310f serving as a capacitor line are electrically connected to the signal line driver circuit 106 (see FIG. 15A).

The transistor 103 is provided at a region where the scan line and the signal line cross each other. The transistor 103 includes the conductive film 304c serving as a gate electrode; the gate insulating film (not illustrated in FIG. 16); an oxide semiconductor film 308b where a channel region is formed, over the gate insulating film; and the conductive films 310d and 310e serving as a source electrode and a drain electrode. The conductive film 304c also serves as a scan line, and a region of the conductive film 304c that overlaps with the oxide semiconductor film 308b serves as the gate electrode of the transistor 103. In addition, the conductive film 310d also serves as a signal line, and a region of the conductive film 310*d* that overlaps with the oxide semiconductor film 308*b* serves as the source electrode or drain electrode of the transistor 103. Further, in the top view of FIG. 16, an end portion of the scan line is located on the outer side than an end portion of the oxide semiconductor film 308*b*. Thus, the scan line functions as a light-blocking film for blocking light from a light source such as a backlight. For this reason, the oxide semiconductor film 308*b* included in the transistor is not irradiated with light, so that a variation in the electrical characteristics of the transistor can be suppressed.

The conductive film 310*e* is electrically connected to the light-transmitting conductive film 316*b* that serves as a pixel electrode, through an opening 362*c*.

The capacitor 105 is connected to the conductive film 310*f* serving as a capacitor line through the opening 362. The capacitor 105 includes the light-transmitting conductive film 308*c* formed over the gate insulating film, a dielectric film formed of a nitride insulating film formed over the transistor 103, and a light-transmitting conductive film 316*b* that serves as a pixel electrode. That is, the capacitor 105 has a light-transmitting property.

Thanks to the light-transmitting property of the capacitor 105, the capacitor 105 can be formed large (covers a large area) in the pixel 301. Thus, a semiconductor device having charge capacity increased while improving the aperture ratio, to 50% or more, preferably 55% or more, more preferably 60% or more can be obtained. For example, in a semiconductor device with a high resolution such as a liquid crystal display device, the area of a pixel is small and thus the area of a capacitor is also small. For this reason, the charge capacity of the capacitor is small. However, since the capacitor 105 of this embodiment has a light-transmitting property, when it is provided in a pixel, enough charge capacity can be obtained in the pixel and the aperture ratio can be improved. Typically, the capacitor 105 can be favorably used in a high-resolution semiconductor device with a pixel density of 200 ppi or more, or furthermore, 300 ppi or more.

The pixel 301 illustrated in FIG. 16 has a shape in which a side parallel to the conductive film 304*c* serving as a scan line is longer than a side parallel to the conductive film 310*d* serving as a signal line and the conductive film 310*f* serving as a capacitor line extends in parallel to the conductive film 310*d* serving as a signal line. As a result, the area where the conductive film 310*f* occupies the pixel 301 can be decreased, thereby increasing the aperture ratio. In addition, the conductive film 310*f* serving as a capacitor line does not use a connection electrode, and is in a direct contact with the light-transmitting conductive film 308*c* and thus the aperture ratio can be further increased.

Further, according to one embodiment of the present invention, the aperture ratio can be improved even in a display device with a high resolution, which makes it possible to use light from a light source such as a backlight efficiently, so that power consumption of the display device can be reduced.

Figure 17:
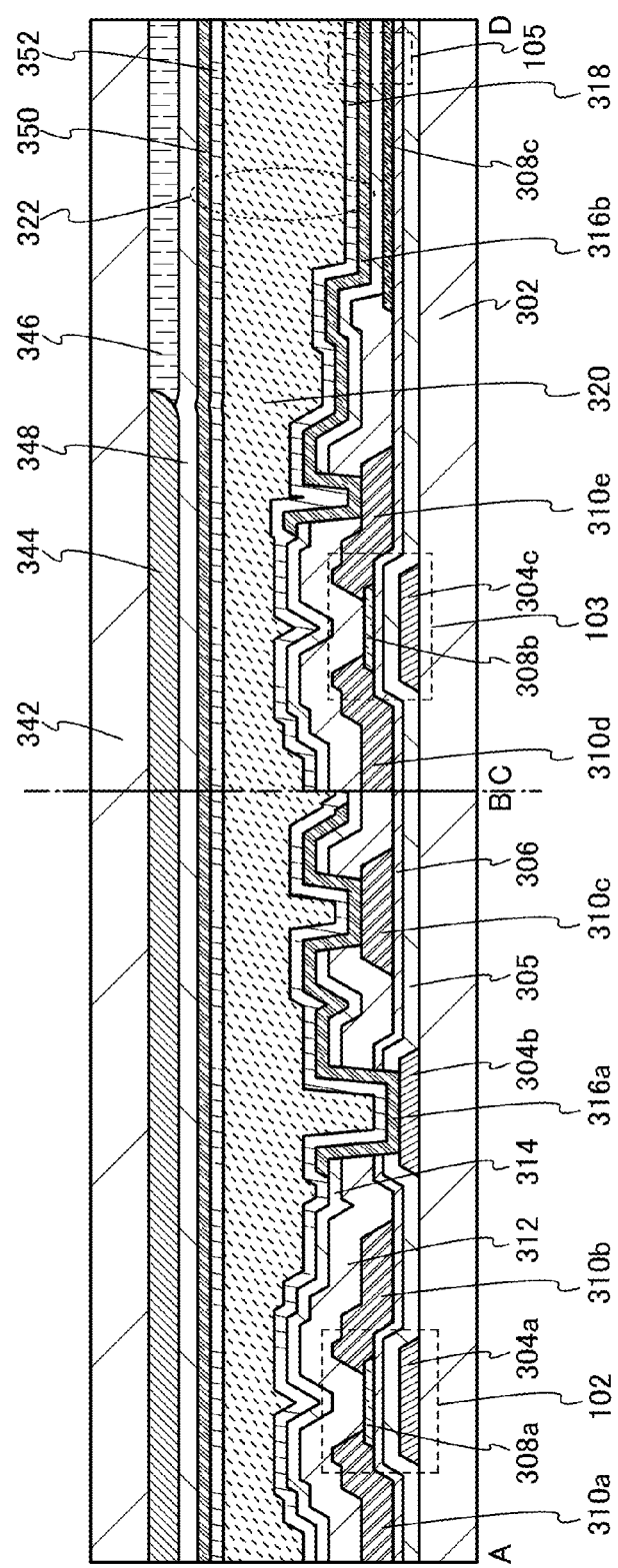
FIG. 17 is a cross-sectional view illustrating one embodiment of a semiconductor device.

Next, FIG. 17 shows a cross section taken along dashed-dotted line C-D in FIG. 16. Note that a cross section A-B in FIG. 17 is a cross-sectional view of a driver circuit portion (a top view thereof is omitted) including the scan line driver circuit 104 and the signal line driver circuit 106. In this embodiment, a liquid crystal display device of a vertical electric field mode is described.

In the liquid crystal display device described in this embodiment, a liquid crystal element 322 is provided between a pair of substrates (a substrate 302 and a substrate 342).

The liquid crystal element 322 includes the light-transmitting conductive film 316*b* over the substrate 302, films controlling alignment (hereinafter referred to as alignment films 318 and 352), a liquid crystal layer 320, and a conductive film 350. Note that the light-transmitting conductive film 316*b* functions as one electrode of the liquid crystal element 322, and the conductive film 350 functions as the other electrode of the liquid crystal element 322.

Thus, a "liquid crystal display device" refers to a device including a liquid crystal element. Note that the liquid crystal display device includes a driver circuit for driving a plurality of pixels and the like. The liquid crystal display device may also be referred to as a liquid crystal module including a control circuit, a power supply circuit, a signal generation circuit, a backlight module, and the like provided over another substrate.

In the driver circuit portion, the transistor 102 includes the conductive film 304*a* functioning as a gate electrode, insulating films 305 and 306 collectively functioning as a gate insulating film, the oxide semiconductor film 308*a* in which a channel region is formed, and the conductive films 310*a* and 310*b* functioning as a source electrode and a drain electrode. The oxide semiconductor film 308*a* is provided over the gate insulating film.

In the pixel portion, the transistor 103 includes the conductive film 304*c* functioning as a gate electrode, the insulating films 305 and 306 collectively functioning as a gate insulating film, the oxide semiconductor film 308*b* which is formed over the gate insulating film and in which a channel region is formed, and the conductive films 310*d* and 310*e* functioning as a source electrode and a drain electrode. The oxide semiconductor film 308*b* is provided over the gate insulating film. Further, insulating films 312 and 314 are provided as protective films over the conductive films 310*d* and 310*e*.

The light-transmitting conductive film 316*b* functioning as a pixel electrode is connected to the conductive film 310*e* through an opening provided in the insulating films 312 and 314.

Further, the capacitor 105 includes the light-transmitting conductive film 308*c* functioning as one electrode of the capacitor 105, the insulating film 314 functioning as a dielectric film, and the light-transmitting conductive film 316*b* functioning as the other electrode of the capacitor 105. The light-transmitting conductive film 308*c* is provided over the gate insulating film.

In the driver circuit portion, the conductive film 304*b* formed at the same time as the conductive films 304*a* and 304*c* and the conductive film 310*c* formed at the same time as the conductive films 310*a*, 310*b*, 310*d*, and 310*e* are connected to each other via the light-transmitting conductive film 316*a* formed at the same time as the light-transmitting conductive film 316*b*.

The conductive film 304*b* and the light-transmitting conductive film 316*a* are connected to each other through an opening provided in the insulating film 306 and the insulating film 312. Further, the conductive film 310*c* and the light-transmitting conductive film 316*a* are connected to each other through an opening provided in the insulating film 312 and the insulating film 314.

Here, components of the display device shown in FIG. 17 are described below.

The conductive films 304a, 304b, and 304c are formed over the substrate 302. The conductive film 304a functions as a gate electrode of the transistor in the driver circuit portion. The conductive film 304c is formed in the pixel portion 101 and functions as a gate electrode of the transistor in the pixel portion. The conductive film 304b is formed in the scan line driver circuit 104 and connected to the conductive film 310c.

The substrate 302 can be formed using the material of the substrate 11 which is given in Embodiment 1, as appropriate.

The conductive films 304a, 304b, and 304c can be formed using the material and the formation method of the gate electrode 15 which are described in Embodiment 1, as appropriate.

The insulating films 305 and 306 are formed over the substrate 302 and the conductive films 304a, 304c, and 304b. The insulating films 305 and 306 function as a gate insulating film of the transistor in the driver circuit portion and a gate insulating film of the transistor in the pixel portion 101.

The insulating film 305 is preferably formed using the nitride insulating film which is described as the gate insulating film 17 in Embodiment 1. The insulating film 306 is preferably formed using the oxide insulating film which is described as the gate insulating film 17 in Embodiment 1.

The oxide semiconductor films 308a and 308b and the light-transmitting conductive film 308c are formed over the insulating film 306. The oxide semiconductor film 308a is formed in a position overlapping with the conductive film 304a and functions as a channel region of the transistor in the driver circuit portion. The oxide semiconductor film 308b is formed in a position overlapping with the conductive film 304c and functions as a channel region of the transistor in the pixel portion. The light-transmitting conductive film 308c functions as one electrode of the capacitor 105.

The oxide semiconductor films 308a and 308b and the light-transmitting conductive film 308c can be formed using the material and the formation method of the oxide semiconductor film 18 which are described in Embodiment 1, as appropriate.

The light-transmitting conductive film 308c is an oxide semiconductor film and contains impurities in a manner similar to those of the oxide semiconductor films 308a and 308b. An example of the impurities is hydrogen. Instead of hydrogen, as the impurity, boron, phosphorus, tin, antimony, a rare gas element, alkali metal, alkaline earth metal, or the like may be included.

Both the oxide semiconductor films 308a and 308b and the light-transmitting conductive film 308c are formed over the gate insulating film but differ in impurity concentration. Specifically, the light-transmitting conductive film 308c has a higher impurity concentration than the oxide semiconductor films 308a and 308b. For example, the concentration of hydrogen contained in each of the oxide semiconductor films 308a and 308b is lower than $5 \times 10^{19}$ atoms/cm$^3$, preferably lower than $5 \times 10^{18}$ atoms/cm$^3$, more preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$. The concentration of hydrogen contained in the light-transmitting conductive film 308c is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The concentration of hydrogen contained in the light-transmitting conductive film 308c is greater than or equal to 2 times, preferably greater than or equal to 10 times those in the oxide semiconductor films 308a and 308b.

The light-transmitting conductive film 308c has lower resistivity than the oxide semiconductor films 308a and 308b. The resistivity of the light-transmitting conductive film 308c is preferably greater than or equal to $1 \times 10^{-8}$ times and less than or equal to $1 \times 10^{-1}$ times the resistivity of the oxide semiconductor films 308a and 308b. The resistivity of the light-transmitting conductive film 308c is typically greater than or equal to $1 \times 10^{-3}$ Ωcm and less than $1 \times 10^4$ Ωcm, preferably greater than or equal to $1 \times 10^{-3}$ Ωcm and less than $1 \times 10^{-1}$ Ω cm.

The oxide semiconductor films 308a and 308b are in contact with the films each formed using a material which can improve characteristics of the interface with the oxide semiconductor film, such as the insulating film 306 and the insulating film 312. Thus, the oxide semiconductor films 308a and 308b function as semiconductors, so that the transistors including the oxide semiconductor films 308a and 308b have excellent electrical characteristics.

The light-transmitting conductive film 308c is in contact with the insulating film 314 in the opening 362 (see FIG. 6A). The insulating film 314 is formed using a material which prevents diffusion of impurities from the outside, such as water, alkali metal, and alkaline earth metal, into the oxide semiconductor film, and the material further includes hydrogen. Thus, when hydrogen in the insulating film 314 is diffused into the oxide semiconductor film formed at the same time as the oxide semiconductor films 308a and 308b, hydrogen is bonded to oxygen and electrons serving as carriers are generated in the oxide semiconductor film. Further, when the insulating film 314 is formed by a plasma CVD method or a sputtering method, the oxide semiconductor film is exposed to plasma, so that oxygen vacancies are generated. When hydrogen contained in the insulating film 314 enters the oxygen vacancies, electrons serving as carriers are generated. As a result, the oxide semiconductor film has higher conductivity and functions as a conductor; in other words, the oxide semiconductor film can be an oxide semiconductor film with high conductivity. Here, a metal oxide which contains a material similar to those of the oxide semiconductor films 308a and 308b as a main component and has higher conductivity because hydrogen concentration of the metal oxide is higher than those of the oxide semiconductor films 308a and 308b is referred to as the "light-transmitting conductive film 308c".

Note that one embodiment of the present invention is not limited thereto, and it is possible that the light-transmitting conductive film 308c be not in contact with the insulating film 314 depending on circumstances.

Further, one embodiment of the present invention is not limited thereto, and the light-transmitting conductive film 308c may be formed by a different process from that of the oxide semiconductor film 308a or the oxide semiconductor film 308b depending on circumstances. In that case, the light-transmitting conductive film 308c may include a different material from that of the oxide semiconductor film 308a or the oxide semiconductor film 308b. For example, the light-transmitting conductive film 308c may include indium tin oxide (hereinafter referred to as ITO), indium zinc oxide, or the like.

In the semiconductor device illustrated in this embodiment, one electrode of the capacitor is formed at the same time as the oxide semiconductor film of the transistor. In addition, the light-transmitting conductive film that serves as a pixel electrode is used as the other electrode of the capacitor. Thus, a step of forming another conductive film is not needed to form the capacitor, and the number of steps of manufacturing the semiconductor device can be reduced.

Further, since the capacitor has a pair of electrodes formed with the light-transmitting conductive film, it can have a light-transmitting property. As a result, the area occupied by the capacitor can be increased and the aperture ratio in a pixel can be increased.

The conductive films 310a, 310b, 310c, 310d, and 310e can be formed using the material and the formation method of the pair of electrodes 21 and 22 which are described in Embodiment 1, as appropriate.

The insulating films 312 and 314 are formed over the insulating film 306, the oxide semiconductor films 308a and 308b, the light-transmitting conductive film 308c, and the conductive films 310a, 310b, 310c, 310d, and 310e. For the insulating film 312, in a manner similar to that of the insulating film 306, a material which can improve characteristics of the interface with the oxide semiconductor film is preferably used. The insulating film 312 can be formed using a material and a formation method which are similar to those of the oxide insulating film 24 which are described in at least Embodiment 1, as appropriate. Further, as described in Embodiment 1, the oxide insulating film 23 and the oxide insulating film may be stacked.

For the insulating film 314, in a manner similar to that of the insulating film 305, a material which prevents diffusion of impurities from the outside, such as water, alkali metal, and alkaline earth metal, into the oxide semiconductor film is preferably used. The insulating film 314 can be formed using the material and the formation method of the nitride insulating film 25 which are described in Embodiment 1, as appropriate.

Further, the light-transmitting conductive films 316a and 316b are provided over the insulating film 314. The light-transmitting conductive film 316a is electrically connected to the conductive film 304b through the opening 364a (see FIG. 20C) and electrically connected to the conductive film 310c through the opening 364b (see FIG. 20C). That is, the light-transmitting conductive film 316a functions as a connection electrode which connects the conductive film 304b and the conductive film 310c. The light-transmitting conductive film 316b is electrically connected to the conductive film 310e through the opening 364c (see FIG. 20C) and functions as the pixel electrode of a pixel. Further, the light-transmitting conductive film 316b can function as one of the pair of electrodes of the capacitor.

In order to form a connection structure in which the conductive film 304b is in direct contact with the conductive film 310c, it is necessary to perform patterning for forming an opening in the insulating films 305 and 306 and to form a mask before the conductive film 310c is formed. However, the photomask is not needed to obtain the connection structure in FIG. 17. When the conductive film 304b is connected to the conductive film 310c with the light-transmitting conductive film 316a as shown in FIG. 17, it is not necessary to form a connection portion where the conductive film 304b is in direct contact with the conductive film 310c. Thus, the number of photomasks can be reduced by one. That is, steps of forming a semiconductor device can be reduced.

For the light-transmitting conductive films 316a and 316b, a light-transmitting conductive material such as indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added can be used.

A film having a colored property (hereinafter referred to as a colored film 346) is formed on the substrate 342. The colored film 346 functions as a color filter. Further, a light-blocking film 344 adjacent to the colored film 346 is formed on the substrate 342. The light-blocking film 344 functions as a black matrix. The colored film 346 is not necessarily provided in the case where the display device is a monochrome display device, for example.

The colored film 346 is a colored film that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used.

The light-blocking film 344 preferably has a function of blocking light in a particular wavelength region, and can be a metal film or an organic insulating film including a black pigment.

An insulating film 348 is formed on the colored film 346. The insulating film 348 functions as a planarization layer or suppresses diffusion of impurities in the colored film 346 to the liquid crystal element side.

The conductive film 350 is formed on the insulating film 348. The conductive film 350 functions as the other of the pair of electrodes of the liquid crystal element in the pixel portion. Note that an insulating film that functions as an alignment film may be additionally formed on the light-transmitting conductive films 316a and 316b and the conductive film 350.

The liquid crystal layer 320 is formed between the light-transmitting conductive film 316a and the conductive film 350, and the light-transmitting conductive film 316b and the conductive film 350. The liquid crystal layer 320 is sealed between the substrate 302 and the substrate 342 with the use of a sealant (not illustrated). The sealant is preferably in contact with an inorganic material to prevent entry of moisture and the like from the outside.

A spacer may be provided between the light-transmitting conductive film 316a and the conductive film 350, and the light-transmitting conductive film 316b and the conductive film 350 to maintain the thickness of the liquid crystal layer 320 (also referred to as a cell gap).

A formation method of the element portion over the substrate 302 in the semiconductor device illustrated in FIG. 17 is described with reference to FIGS. 18A to 18C, FIGS. 19A to 19C, FIGS. 20A to 20C, and FIGS. 21A and 21B.

First, the substrate 302 is prepared. Here, a glass substrate is used as the substrate 302.

Then, a conductive film is formed over the substrate 302 and processed into desired regions, so that the conductive films 304a, 304b, and 304c are formed. The conductive films 304a, 304b, and 304c can be formed in such a manner that a mask is formed in the desired regions by first patterning and regions not covered with the mask are etched (see FIG. 18A).

The conductive films 304a, 304b, and 304c can be typically formed by an evaporation method, a CVD method, a sputtering method, a spin coating method, or the like.

Figure 18A:
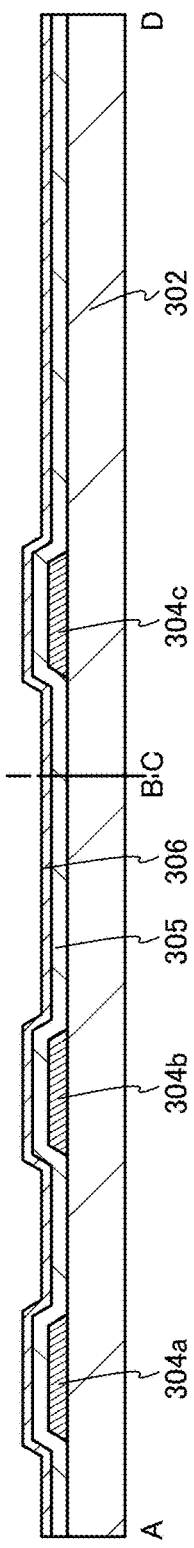
FIGS. 18A to 18C are cross-sectionals views illustrating one embodiment of a method for manufacturing a semiconductor device.

Next, the insulating film 305 is formed over the substrate 302 and the conductive films 304a, 304b, and 304c, and then the insulating film 306 is formed over the insulating film 305 (see FIG. 18A).

The insulating films 305 and 306 can be formed by a sputtering method, a CVD method, or the like. Note that it is preferable that the insulating films 305 and 306 be formed in succession in a vacuum, in which case entry of impurities is suppressed.

Figure 18B:
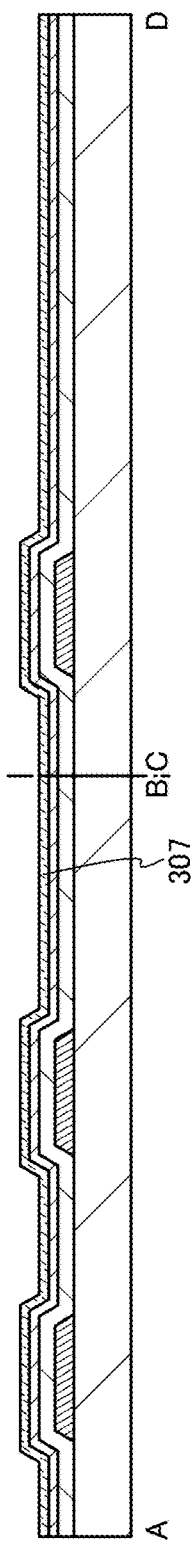

Next, an oxide semiconductor film 307 is formed over the insulating film 306 (see FIG. 18B).

The oxide semiconductor film 307 can be formed by a sputtering method, a coating method, a pulsed laser deposition method, a laser ablation method, or the like.

Next, the oxide semiconductor film 307 is processed into desired regions, so that the island-shaped oxide semiconductor films 308a, 308b, and 308d are formed. The oxide semiconductor films 308a, 308b, and 308d can be formed in such a manner that a mask is formed in the desired regions by second patterning and regions not covered with the mask are etched. For the etching, dry etching, wet etching, or a combination of both can be employed (see FIG. 18C).

Figure 19A:
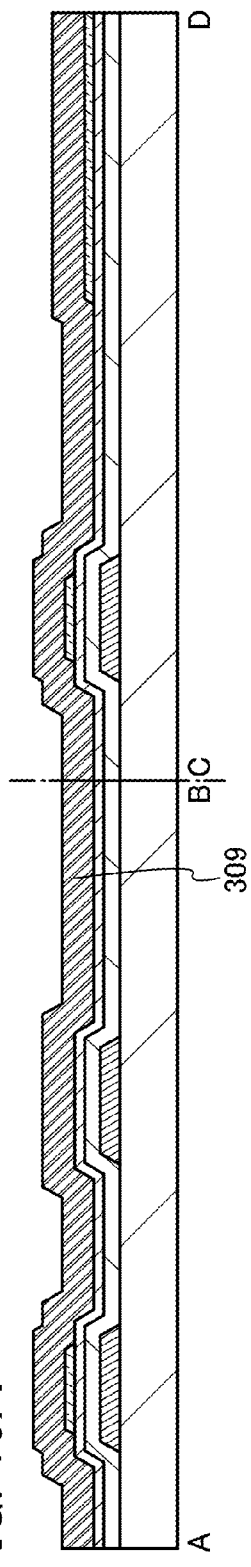
FIGS. 19A to 19C are cross-sectionals views illustrating one embodiment of a method for manufacturing a semiconductor device.
Figure 19B:
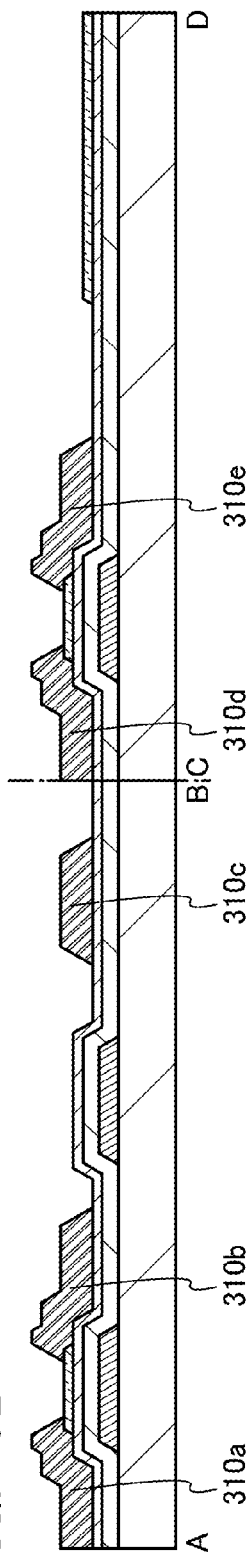

Next, a conductive film 309 is formed over the insulating film 306 and the oxide semiconductor films 308a, 308b, and 308d (see FIG. 19A).

The conductive film 309 can be formed by a sputtering method, for example.

Then, the conductive film 309 is processed into desired regions, so that the conductive films 310a, 310b, 310c, 310d, and 310e are formed. The conductive films 310a, 310b, 310c, 310d, and 310e can be formed in such a manner that a mask is formed in the desired regions by third patterning and regions not covered with the mask are etched (see FIG. 19B).

Figure 19C:
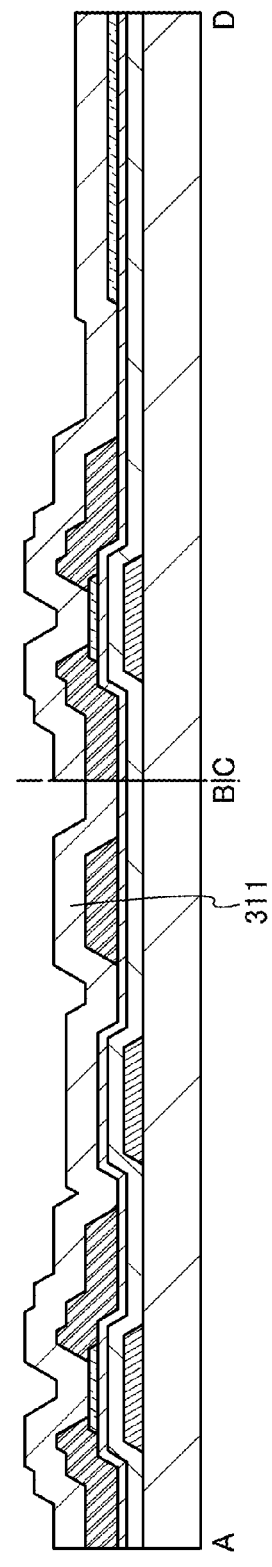

Next, an insulating film 311 is formed to cover the insulating film 306, the oxide semiconductor films 308a, 308b, and 308d, and the conductive films 310a, 310b, 310c, 310d, and 310e (see FIG. 19C).

The insulating film 311 can be formed with a stacked-layer structure under conditions similar to those for the oxide insulating film 23 and the oxide insulating film 24 in Embodiment 1. When the oxide insulating film 23 is formed while heating is performed as described in Embodiment 1, hydrogen, water, or the like in the oxide semiconductor films 308a, 308b, and 308d can be released; thus, highly purified oxide semiconductor films can be formed.

Next, the insulating film 311 is processed into desired regions so that the insulating film 312 and the opening 362 are formed. The insulating film 311 and the opening 362 can be formed in such a manner that a mask is formed in a desired region by fourth patterning and regions not covered with the mask are etched (see FIG. 20A).

The opening 362 is formed so as to expose the surface of the oxide semiconductor film 308d. An example of a formation method of the opening 362 includes, but not limited to, a dry etching method. Alternatively, a wet etching method or a combination of dry etching and wet etching can be employed for formation of the opening 362.

After that, in a manner similar to Embodiment 1, heat treatment can be performed to move part of oxygen in the insulating film 311 to the oxide semiconductor films 308a and 308b and compensate oxygen vacancies included in the oxide semiconductor films 308a and 308b. Consequently, the amount of oxygen vacancies in the oxide semiconductor films 308a and 308b can be reduced.

Next, an insulating film 313 is formed over the insulating film 312 and the oxide semiconductor film 308d (see FIG. 20B).

The insulating film 313 is preferably formed using a material that can prevent an external impurity such as oxygen, hydrogen, water, alkali metal, or alkaline earth metal, from diffusing into the oxide semiconductor film, more preferably formed using the material including hydrogen, and typically an inorganic insulating material containing nitrogen, such as a nitride insulating film, can be used. The insulating film 313 can be formed by a CVD method, for example.

The insulating film 314 is a film formed using a material that prevents diffusion of impurities from the outside, such as water, alkali metal, and alkaline earth metal, into the oxide semiconductor film, and the material further includes hydrogen. Thus, when hydrogen in the insulating film 314 is diffused into the oxide semiconductor film 308d, hydrogen is bonded to oxygen and electrons serving as carriers are generated in the oxide semiconductor film 308d. As a result, the conductivity of the oxide semiconductor film 308d is increased, so that the oxide semiconductor film 308d becomes the light-transmitting conductive film 308c.

The silicon nitride film is preferably formed at a high temperature to have an improved blocking property; for example, the silicon nitride film is preferably formed at a temperature in the range from the substrate temperature of 100° C. to 400° C., more preferably at a temperature in the range from 300° C. to 400° C. When the silicon nitride film is formed at a high temperature, a phenomenon in which oxygen is released from the oxide semiconductor used for the oxide semiconductor films 308a and 308b and the carrier density is increased is caused in some cases; therefore, the upper limit of the temperature is a temperature at which the phenomenon is not caused.

Then, the insulating film 313 is processed into desired regions so that the insulating film 314 and the openings 364a, 364b, and 364c are formed. The insulating film 314 and the openings 364a, 364b, and 364c can be formed in such a manner that a mask is formed in a desired region by fifth patterning and regions not covered by the mask are etched (see FIG. 20C).

The opening 364a is formed so as to expose a surface of the conductive film 304b. The opening 364b is formed so as to expose the conductive film 310c. The opening 364c is formed so as to expose the conductive film 310e.

An example of a formation method of the openings 364a, 364b, and 364c includes, but not limited to, a dry etching method. Alternatively, a wet etching method or a combination of dry etching and wet etching can be employed for formation of the openings 364a, 364b, and 364c.

Then, a conductive film 315 is formed over the insulating film 314 so as to cover the openings 364a, 364b, and 364c (see FIG. 21A).

The conductive film 315 can be formed by a sputtering method, for example.

Then, the conductive film 315 is processed into desired regions so that the light-transmitting conductive films 316a and 316b are formed. The light-transmitting conductive films 316a and 316b are formed in such a manner that a mask is formed in the desired regions by sixth patterning and regions not covered with the mask are etched (see FIG. 21B).

Through the above process, the pixel portion and the driver circuit portion that include transistors can be formed over the substrate 302. In the manufacturing process described in this embodiment, the transistors and the capacitor can be formed at the same time by the first to sixth patterning, that is, with the six masks.

In this embodiment, the conductivity of the oxide semiconductor film 308d is increased by diffusing hydrogen contained in the insulating film 314 into the oxide semiconductor film 308d; however, the conductivity of the oxide semiconductor film 308d may be increased by covering the oxide semiconductor films 308a and 308b with a mask and adding impurities, typically, hydrogen, boron, phosphorus, tin, antimony, a rare gas element, alkali metal, alkaline earth metal, or the like to the oxide semiconductor film 308d. Hydrogen, boron, phosphorus, tin, antimony, a rare gas element, or the like is added to the oxide semiconductor film 308d by an ion doping method, an ion implantation method, or the like. Further, alkali metal, alkaline earth metal, or the like may be added to the oxide semiconductor film 308d by a method in which the oxide semiconductor film 308d is exposed to a solution that contains the impurity.

Next, a structure that is formed over the substrate 342 provided so as to face the substrate 302 is described below.

Figure 22A:
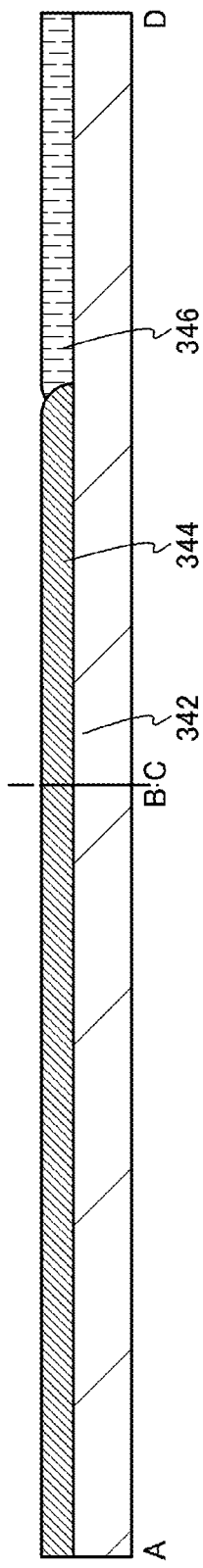
FIGS. 22A to 22C are cross-sectionals views illustrating one embodiment of a method for manufacturing a semiconductor device.

First, the substrate 342 is prepared. For materials of the substrate 342, the materials that can be used for the substrate 302 can be referred to. Then, the light-blocking film 344 and the colored film 346 are formed over the substrate 342 (see FIG. 22A).

The light-blocking film 344 and the colored film 346 each are formed in a desired position with any of various materials by a printing method, an inkjet method, an etching method using a photolithography technique, or the like.

Figure 22B:
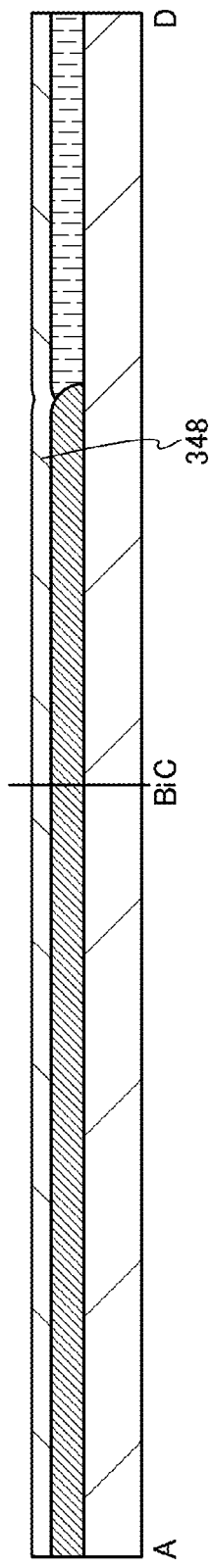

Then, the insulating film 348 is formed over the light-blocking film 344 and the colored film 346 (see FIG. 22B).

For the insulating film 348, an organic insulating film of an acrylic resin, an epoxy resin, polyimide, or the like can be used. With the insulating film 348, an impurity or the like contained in the colored film 346 can be prevented from diffusing into the liquid crystal layer 320, for example. Note that the insulating film 348 is not necessarily formed.

Figure 22C:
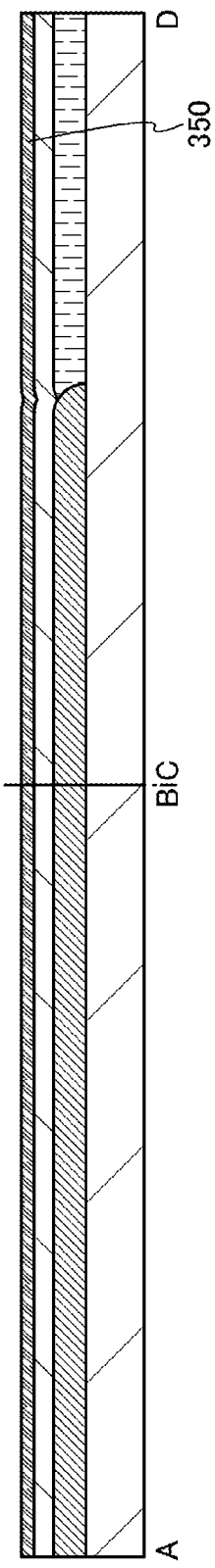

Then, the conductive film 350 is formed over the insulating film 348 (see FIG. 22C). As the conductive film 350, a material that can be used for the conductive film 315 can be used.

Through the above process, the structure formed over the substrate 342 can be formed.

Next, the alignment film 318 and the alignment film 352 are formed over the substrate 302 and the substrate 342 respectively, specifically, over the insulating film 314 and the light-transmitting conductive films 316a and 316b formed over the substrate 302 and over the conductive film 350 formed over the substrate 342. The alignment films 318 and 352 can be formed by a rubbing method, an optical alignment method, or the like. After that, the liquid crystal layer 320 is formed between the substrate 302 and the substrate 342. The liquid crystal layer 320 can be formed by a dispenser method (a dropping method), or an injecting method by which a liquid crystal is injected using a capillary phenomenon after the substrate 302 and the substrate 342 are bonded to each other.

Through the above process, the display device illustrated in FIG. 17 can be fabricated.

This embodiment can be combined with another embodiment in this specification as appropriate.

<Modification Example 1>

Figure 23:
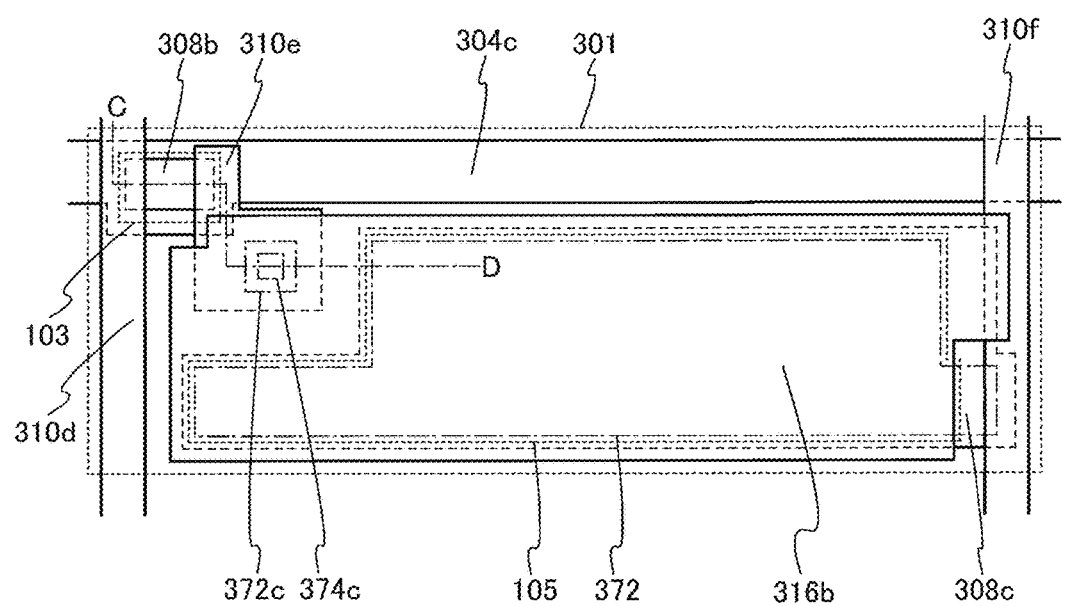
FIG. 23 is a top view illustrating one embodiment of a semiconductor device.

A modification example of the liquid crystal display device including a liquid crystal element in the pixel 301 is described. FIG. 23 is a top view of the pixel 301 shown in FIG. 15B. Note that in FIG. 23, a counter electrode and a liquid crystal element are omitted. Description of the portions similar to those in Embodiment 8 are omitted.

<Structure of Semiconductor Device>

The pixel 301 shown in FIG. 23 is different from the pixel 301 shown in FIG. 16 in that an opening 374c is provided inside an opening 372c. The pixel 301 shown in FIG. 23 is different from the pixel shown in FIG. 17 in that an opening 372 is provided instead of the opening 364. The conductive film 310e is electrically connected to the light-transmitting conductive film 316b functioning as a pixel electrode, through the opening 372c and the opening 374c.

Figure 24:
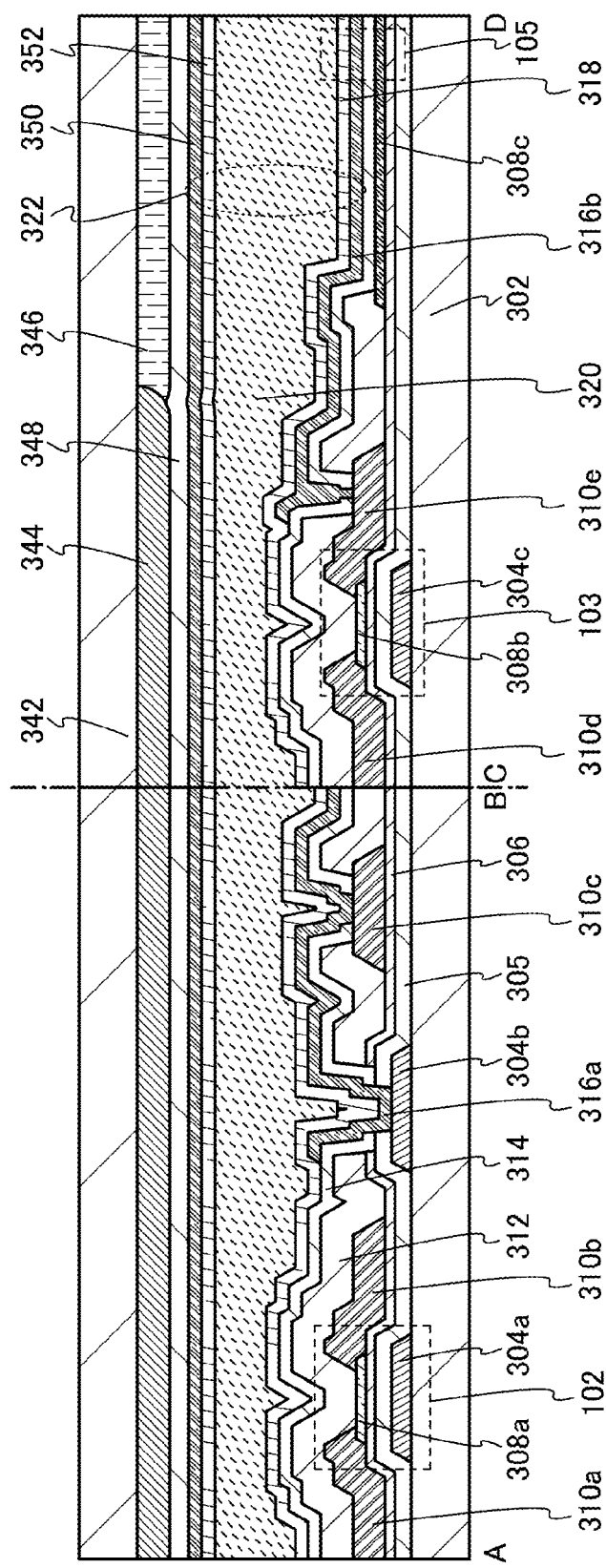
FIG. 24 is a cross-sectional view illustrating one embodiment of a semiconductor device.

Next, FIG. 24 shows a cross section taken along dashed-dotted line C-D in FIG. 23. Note that a cross section A-B in FIG. 24 is a cross-sectional view of a driver circuit portion (a top view thereof is omitted).

As shown in FIG. 24, an opening 372a (see FIG. 25A) formed in the insulating film 306 and the insulating film 312 and an opening 374a (see FIG. 25C) formed in the insulating film 314 are provided over the conductive film 304a. The opening 374a (see FIG. 25C) is located inside the opening 372a (see FIG. 25A). In the opening 374a (see FIG. 25C), the conductive film 304a and the light-transmitting conductive film 316a are connected to each other.

Further, an opening 372b (see FIG. 25A) formed in the insulating film 312 and an opening 374b (see FIG. 25C) formed in the insulating film 314 are provided over the conductive film 310c. The opening 374b (see FIG. 25C) is located inside the opening 372b (see FIG. 25A). In the opening 374b (see FIG. 25C), the conductive film 310c and the light-transmitting conductive film 316a are connected to each other.

Furthermore, the opening 372c (see FIG. 25A) formed in the insulating film 312 and the opening 374c (see FIG. 25C) formed in the insulating film 314 are provided over the conductive film 310e. The opening 374c (see FIG. 25C) is located inside the opening 372c (see FIG. 25A). In the opening 374c (see FIG. 25C), the conductive film 310e and the light-transmitting conductive film 316b are connected to each other.

The opening 372 (see FIG. 25A) formed in the insulating film 312 is provided over the light-transmitting conductive film 308c. In the opening 372, the light-transmitting conductive film 308c is in contact with the insulating film 314.

A connection portion between the conductive film 304b and the light-transmitting conductive film 316a, a connection portion between the conductive film 310c and the light-transmitting conductive film 316a, and a connection portion between the conductive film 310e and the light-transmitting conductive film 316b are each surrounded by the insulating film 305 and/or the insulating film 314. The insulating films 305 and 314 are each formed of an insulating film using a material that prevents diffusion of impurities from the outside, such as water, alkali metal, and alkaline earth metal, into the oxide semiconductor film. Further, the side surfaces of the openings 372a, 372b, 372c, and 372 (see FIG. 25A) are each covered with the insulating film 305 and/or the insulating film 314. The oxide semiconductor films are provided on an inner side than the insulating films 305 and 314. Thus, it is possible to prevent diffusion of impurities from the outside, such as water, alkali metal, and alkaline earth metal, through the connection portions between the conductive film 304b and the light-transmitting conductive film 316a, between the conductive film 310c and the light-transmitting conductive film 316a, between the conductive film 310e and the light-transmitting conductive film 316b, and between the light-transmitting conductive film 308c and the light-transmitting conductive film 316b into the oxide semiconductor films included in the transistors. As a result, fluctuation in the electrical characteristics of the transistors can be prevented and reliability of the semiconductor device can be improved.

A formation method of the element portion over the substrate 302 in the semiconductor device shown in FIG. 24 is described with reference to FIGS. 19A to 19C, FIGS. 25A to 25C, and FIGS. 26A and 26B.

In a manner similar to Embodiment 8, through the steps in FIGS. 18A to 18C and FIGS. 19A to 19C, the conductive films 304a, 304b, and 304c, each of which functions as a gate electrode, the insulating films 305 and 306 which function as a gate insulating film, the oxide semiconductor films 308a, 308b, and 308d, the conductive films 310a, 310b, 310c, 310d, and 310e, and the insulating film 311 are formed over the substrate 302. Note that in the process, the first to third patterning are performed to form the conductive films 304a, 304b, and 304c, the oxide semiconductor films 308a 308b, and 308d, and the conductive films 310a, 310b, 310c, 310d, and 310e.

Then, heat treatment is performed in a manner similar to Embodiment 8, whereby part of oxygen contained in the insulating film 311 can be moved to the oxide semiconductor films 308a and 308b to compensate the oxygen vacancies in the oxide semiconductor films 308a and 308b. Consequently, the amount of oxygen vacancies in the oxide semiconductor films 308a and 308b can be reduced.

Then, as shown in FIG. 25A, the insulating film 311 is processed into desired regions so that the insulating film 312 and the openings 372, 372b, and 372c are formed. Further, the insulating film 306 which is part of the gate insulating film is processed into desired regions so that the opening 372a is formed. The insulating film 305, the insulating film 312, and the openings 372, 372a, 372b, and 372c can be formed in such a manner that a mask is formed in the desired regions by fourth patterning and regions not covered with the mask are etched. As a method for forming the openings 372, 372a, 372b, and 372c, the method for forming the opening 362 described in Embodiment 8 can be used as appropriate.

By forming at least the opening 372a in the etching step, the etching amount can be reduced in an etching step with a mask formed by fifth patterning to be performed later.

Next, the insulating film 313 is formed over the insulating film 305, the conductive films 310c and 310e, the insulating film 312, and the oxide semiconductor film 308d (see FIG. 25B).

Then, in a manner similar to Embodiment 8, the insulating film 313 is processed into desired regions so that the insulating film 314 and the openings 374a, 374b, and 374c are formed. The insulating film 314 and the openings 374a, 374b, and 374c can be formed in such a manner that a mask is formed in the desired regions by fifth patterning and regions not covered with the mask are etched (see FIG. 25C).

Then, a conductive film 315 is formed over the insulating film 314 to cover the openings 374a, 374b, and 374c (see FIG. 26A) in a manner similar to Embodiment 8.

Then, the conductive film 315 is processed into desired regions to form the light-transmitting conductive films 316a and 316b. The light-transmitting conductive films 316a and 316b can be formed in such a manner that a mask is formed in the desired regions by sixth patterning and regions not covered with the mask are etched (see FIG. 26B).

Through the above process, the pixel portion and the driver circuit portion that include transistors can be formed over the substrate 302. In the manufacturing process described in this embodiment, the transistors and the capacitor can be formed at the same time by the first to sixth patterning, that is, with the six masks.

When the opening 372a is not formed in the process of FIG. 25A, the insulating films 305, 306, 312, and 314 are required to be etched in the etching step in FIG. 25C, so that the etching amount is increased as compared to the case of forming other openings. Thus, the etching step cannot be performed uniformly and the opening 374a is not formed in some regions, so that a contact defect between the light-transmitting conductive film 316a formed later and the conductive film 304b is generated. However, in this embodiment, the openings 372a and 374a are formed in two etching steps; thus, an etching defect is not easily generated in the forming process of the openings. Consequently, yield of a semiconductor device can be improved. The opening 372a is described here, but the same effect can also obtained in the case of the openings 374b and 374c.

<Modification Example 2>

A modification example of the liquid crystal display device including a liquid crystal element in the pixel 301 is described. In the liquid crystal display devices shown in FIGS. 17 and 24, the light-transmitting conductive film 308 is in contact with the insulating film 314; however, a structure in which the light-transmitting conductive film 308 is in contact with the insulating film 305 can be employed. In that case, it is not necessary to provide the opening 362 as shown in FIGS. 20A to 20C. Thus, unevenness of the surfaces of the light-transmitting conductive films 316a and 316b can be reduced. Consequently, alignment disorder of the liquid crystal materials contained in the liquid crystal layer 320 can be reduced. Further, a high-contrast semiconductor device can be fabricated.

Such a structure can be obtained as follows: in FIG. 18B, before the oxide semiconductor film 307 is formed, the insulating film 306 is selectively etched, so that part of the insulating film 305 is exposed.

<Modification Example 3>

A modification example of the semiconductor device described in Embodiment 1 is described with reference to FIG. 27, FIGS. 28A to 28C, and FIGS. 29A to 29C. A cross section A-B in FIG. 27 is a cross-sectional view of a driver circuit portion, and a cross section C-D in FIG. 27 is a cross-sectional view of a pixel portion.

Figure 27:
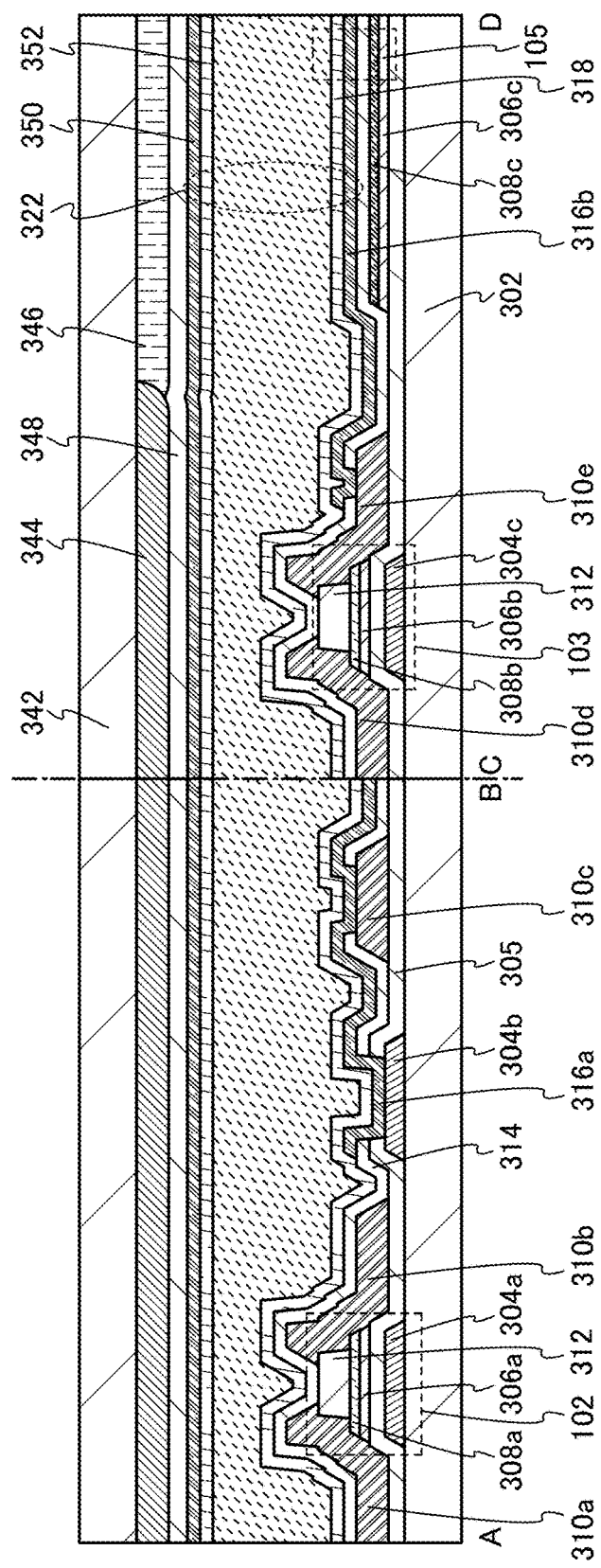
FIG. 27 is a cross-sectional view illustrating one embodiment of a semiconductor device.

The semiconductor device shown in FIG. 27 is different from the semiconductor device described in Embodiment 1 in that a channel protective transistor is used.

In the driver circuit portion, the transistor 102 includes the conductive film 304a functioning as a gate electrode, the insulating films 305 and 306 collectively functioning as a gate insulating film, the oxide semiconductor film 308a in which a channel region is formed, and the conductive films 310a and 310b functioning as a source electrode and a drain electrode. The insulating film 312 functioning as a channel protective film is provided between the oxide semiconductor film 308a and the conductive films 310a and 310b. Further, the insulating film 314 is provided as a protective film over the conductive films 310a, 310b, and 310c.

In the pixel portion, the transistor 103 includes the conductive film 304c functioning as a gate electrode, the insulating films 305 and 306 collectively functioning as a gate insulating film, the oxide semiconductor film 308b which is formed over the gate insulating film and in which a channel region is formed, and the conductive films 310d and 310e functioning as a source electrode and a drain electrode. The insulating film 312 functioning as a channel protective film is provided between the oxide semiconductor film 308b and the conductive films 310d and 310e. Further, the insulating film 314 is provided as a protective film over the conductive films 310d and 310e and the light-transmitting conductive film 308c.

The light-transmitting conductive film 316b functioning as a pixel electrode is connected to the conductive film 310e through an opening provided in the insulating film 314.

Further, the capacitor 105 includes the light-transmitting conductive film 308c functioning as one electrode of the capacitor 105, the insulating film 314 functioning as a dielectric film, and the light-transmitting conductive film 316b functioning as the other electrode of the capacitor 105.

In the driver circuit portion, the conductive film 304b formed at the same time as the conductive films 304a and 304c and the conductive film 310c formed at the same time as the conductive films 310a, 310b, 310d, and 310e are connected to each other via the light-transmitting conductive film 316a formed at the same time as the light-transmitting conductive film 316b.

In this modification example, the oxide semiconductor films 308a and 308b are not damaged by etching for forming the conductive films 310a, 310b, 310d, and 310e because the oxide semiconductor films 308a and 308b are covered with the insulating film 312 when the conductive films 310a, 310b, 310d, and 310e are etched. Further, the insulating film 312 is formed using an oxide insulating film which contains oxygen at a higher proportion than the stoichiometric composition. Thus, part of oxygen contained in the oxide insulating film 312 can be moved to the oxide semiconductor films 308a and 308b, so that the amount of oxygen vacancies contained in the oxide semiconductor films 308a and 308b can be reduced.

A formation method of the element portion over the substrate 302 in the semiconductor device shown in FIG. 27 is described with reference to FIGS. 19A to 19C, FIGS. 28A to 28C, and FIGS. 29A to 29C.

Figure 18C:
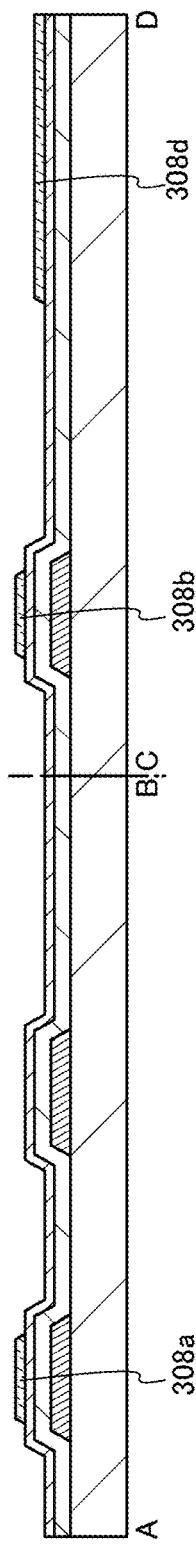

In a manner similar to Embodiment 8, through the steps in FIGS. 18A to 18C, the conductive films 304a, 304b, and 304c, each of which functions as a gate electrode, the insulating films 305 and 306 which function as a gate insulating film, and the oxide semiconductor films 308a, 308b, and 308d are formed over the substrate 302. Note that in the process, the first and second patterning are performed to form the conductive films 304a, 304b, and 304c and the oxide semiconductor films 308a 308b, and 308d.

Figure 28A:
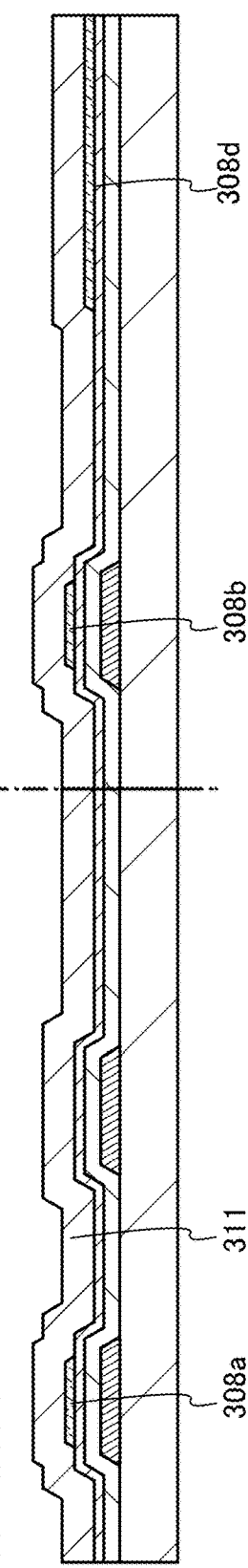
FIGS. 28A to 28C are cross-sectionals views illustrating one embodiment of a method for manufacturing a semiconductor device.

Next, as shown in FIG. 28A, the insulating film 311 is formed in a manner similar to Embodiment 8.

Then, heat treatment is performed in a manner similar to Embodiment 8, whereby part of oxygen contained in the insulating film 311 can be moved to the oxide semiconductor films 308a and 308b to compensate the oxygen vacancies in the oxide semiconductor films 308a and 308b. Consequently, the amount of oxygen vacancies in the oxide semiconductor films 308a and 308b can be reduced.

Figure 28B:
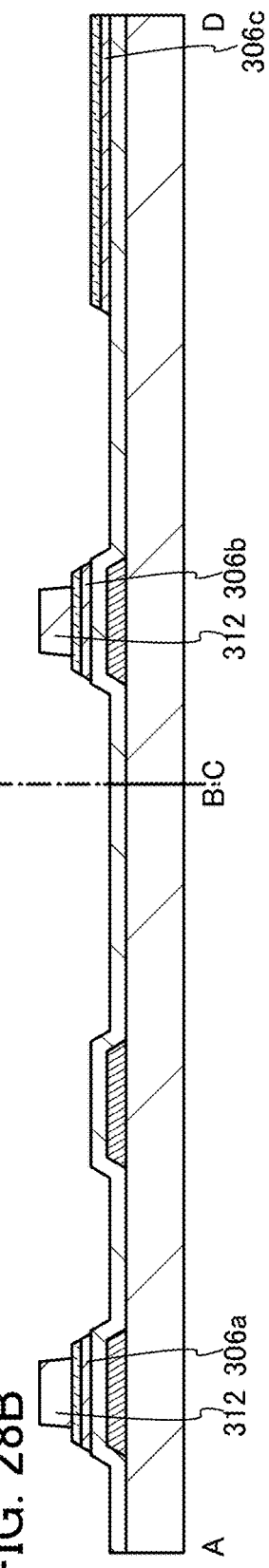

Next, as shown in FIG. 28B, the insulating film 311 is processed into desired regions, so that the insulating film 312 is formed over the oxide semiconductor films 308a and 308b. In the process, in the case where the insulating film 306 is formed using a material similar to that of the insulating film 312, part of the insulating film 306 is etched, and only regions covered with the oxide semiconductor films 308a and 308b are left. Note that the insulating film 306 and the insulating film 312 can be formed in such a manner that a mask is formed in the desired regions by third patterning and regions not covered with the mask are etched.

Figure 28C:
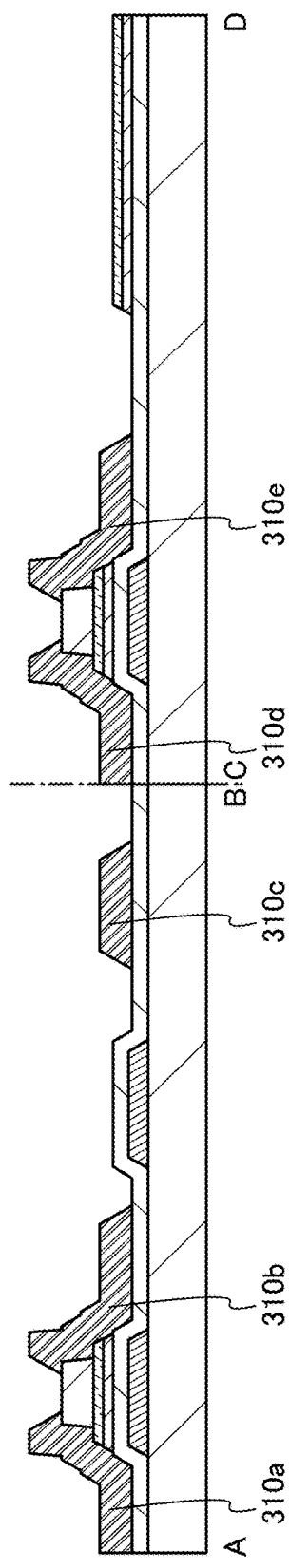

Next, after a conductive film is formed over the insulating film 305, the insulating film 306, and the oxide semiconductor films 308a and 308b, a process similar to that in Embodiment 8 is performed, so that the conductive films 310a, 310b, 310c, 310d, and 310e are formed (see FIG. 28C). The conductive films 310a, 310b, 310c, 310d, and 310e can be formed in such a manner that a mask is formed in a desired region by fourth patterning and regions not covered with the mask are etched.

Next, the insulating film 313 is formed over the insulating film 305, the insulating film 312, the oxide semiconductor film 308d, and the conductive films 310a, 310b, 310c, 310d, and 310e (see FIG. 29A).

Then, in a manner similar to Embodiment 8, the insulating film 313 is processed into desired regions, so that the insulating film 314 and the openings 384a, 384b, and 384c are formed. Note that the insulating film 314 and the openings 384a, 384b, and 384c can be formed in such a manner that a mask is formed in the desired regions by fifth patterning and regions not covered with the mask are etched (see FIG. 29B).

Next, in a manner similar to Embodiment 8, after a conductive film is formed over the insulating film 314 to cover the openings 384a, 384b, and 384c, the conductive film is processed into desired regions, so that the light-transmitting conductive films 316a and 316b are formed (see FIG. 29C). The light-transmitting conductive films 316a and 316b can be formed in such a manner that a mask is formed in the desired regions by sixth patterning and regions not covered with the mask are etched.

Through the above process, the pixel portion and the driver circuit portion that include the transistors can be formed over the substrate 302. In the manufacturing process described in this embodiment, the transistors and the capacitor can be formed at the same time by the first to sixth patterning, that is, with the six masks.

<Modification Example 4>

Figure 8:
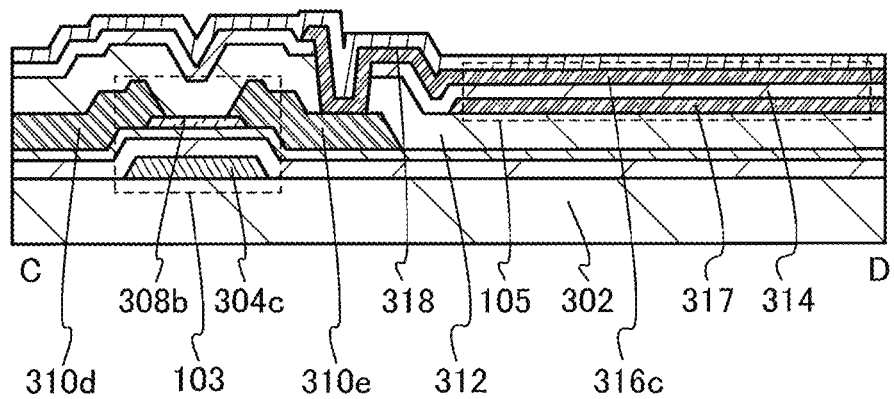
FIG. 8 is a cross-sectional view illustrating one embodiment of a semiconductor device.

In this embodiment and the modification example, the light-transmitting conductive film 308c and the light-transmitting conductive film 316b are used as the pair of electrodes for forming the capacitor 105. Instead of these films, as shown in FIG. 8, a light-transmitting conductive film 317 can be formed between the insulating film 312 and the insulating film 314 and the light-transmitting conductive film 316c can be formed over the insulating film 314, so that the light-transmitting conductive film 317 and the light-transmitting conductive film 316c can be used as the pair of electrodes for forming the capacitor 105.

Further, an organic insulating film of an acrylic resin, an epoxy resin, polyimide, or the like may be provided over the insulating film 312. The organic insulating film of an acrylic-based resin or the like can reduce unevenness of the surface of the light-transmitting conductive film 316a because of its high planarity. Thus, alignment disorder of the liquid crystal materials contained in the liquid crystal layer 320 can be reduced. Further, a high-contrast semiconductor device can be fabricated.

<Modification Example 5>

In this embodiment and the modification example, the light-transmitting conductive film 308c and the light-transmitting conductive film 316b are used as the pair of electrodes for forming the capacitor; however, two or more of the following can be selected as appropriate: a conductive film formed at the same time as the conductive films 304a, 304b, and 304c; a conductive film formed at the same time as the conductive films 310a, 310b, 310c, 310d, and 310e; the light-transmitting conductive film 308c; and the light-transmitting conductive film 316b.

[Embodiment 9]

In this embodiment, one embodiment which can be applied to the oxide semiconductor film 18 and the multilayer films 20 and 34 in any of the transistors included in the semiconductor device described in the above embodiment is described. Note that here, the oxide semiconductor film included in the multilayer film is used as an example; further, the oxide film can have a similar structure.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Further, the oxide semiconductor film may include a CAAC-OS. Furthermore, the oxide semiconductor film may include an amorphous oxide semiconductor and an oxide semiconductor having a crystal grain. Described below are the single-crystal oxide semiconductor, the CAAC-OS, the polycrystalline oxide semiconductor, the microcrystalline oxide semiconductor, and the amorphous oxide semiconductor.

<Single Crystal Oxide Semiconductor>

The single crystal oxide semiconductor has, for example, a low impurity concentration and a low density of defect states (a small amount of oxygen vacancies), and thus has a low carrier density. Therefore, a transistor using the single crystal oxide semiconductor for a channel region is unlikely to be normally on. Further, the single crystal oxide semiconductor has a low density of defect states and thus has a low density of trap states in some cases. Therefore, a transistor using the single crystal oxide semiconductor for a channel region has a small variation in electrical characteristics and high reliability in some cases.

<CAAC-OS>

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at $2\theta$ of around 31 degrees which shows alignment appears in some cases. Further, for example, spots (luminescent spots) are observed in an electron diffraction pattern of the CAAC-OS in some cases. An electron diffraction pattern obtained with an electron beam having a beam diameter of 10 nmφ or smaller, or 5 nmφ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

Figure 30:
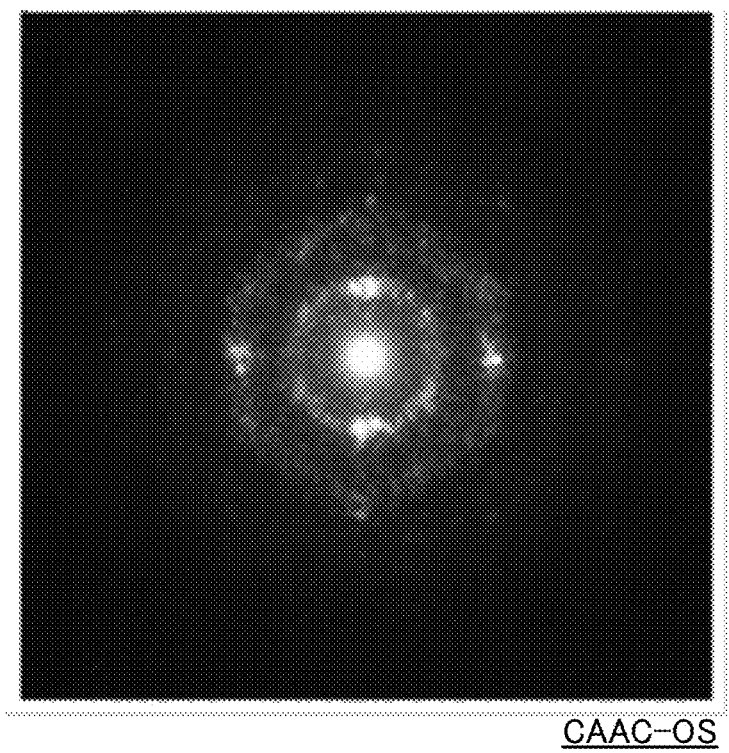
FIG. 30 shows a nanobeam electron diffraction pattern of an oxide semiconductor.

FIG. 30 is an example of a nanobeam electron diffraction pattern of a sample including a CAAC-OS. Here, the sample is cut in the direction perpendicular to a surface where the CAAC-OS is formed and the thickness thereof is reduced to about 40 nm. Further, an electron beam with a diameter of 1 nmφ enters from the direction perpendicular to the cut surface of the sample. FIG. 30 shows that spots are observed in the nanobeam electron diffraction pattern of the CAAC-OS.

In each of the crystal parts included in the CAAC-OS, for example, a c-axis is aligned in a direction parallel to a normal vector of a surface where the CAAC-OS is formed or a normal vector of a surface of the CAAC-OS, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

Since the c-axes of the crystal parts included in the CAAC-OS are aligned in the direction parallel to a normal vector of a surface where the CAAC-OS is formed or a normal vector of a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). Note that the film deposition is accompanied with the formation of the crystal parts or followed by the formation of the crystal parts through crystallization treatment such as heat treatment. Hence, the c-axes of the crystal portions are aligned in the direction parallel to a normal vector of the surface where the CAAC-OS is formed or a normal vector of the surface of the CAAC-OS.

The CAAC-OS can be obtained by reducing the impurity concentration, for example. The impurity herein means an element other than main components of the oxide semiconductor, such as hydrogen, carbon, silicon, or a transition metal element. In particular, an element such as silicon has a higher strength to bond with oxygen than that of a metal element included in the oxide semiconductor. Therefore, when the element takes oxygen away in the oxide semiconductor, the atomic arrangement in the oxide semiconductor is disrupted, whereby the crystallinity of the oxide semiconductor is lowered in some cases. In addition, a heavy metal such as iron or nickel, argon, carbon dioxide, or the like has a large atomic radius (or molecular radius), and thus disrupts the atomic arrangement in the oxide semiconductor, whereby the crystallinity of the oxide semiconductor is lowered in some cases. Hence, the CAAC-OS is an oxide semiconductor with a low impurity concentration. Note that the impurity included in the oxide semiconductor might serve as a carrier generation source.

In the CAAC-OS, distribution of crystal parts is not necessarily uniform. For example, in the formation process of the CAAC-OS, in the case where crystal growth occurs from a surface side of the oxide semiconductor, the proportion of crystal parts in the vicinity of the surface of the oxide semiconductor is higher than that in the vicinity of the surface where the oxide semiconductor is formed in some cases. Further, when an impurity is added to the CAAC-OS, the crystal part in a region to which the impurity is added may have low crystallinity.

Further, the CAAC-OS can be formed, for example, by reducing the density of defect states. In an oxide semiconductor, for example, oxygen vacancies cause an increase in the density of defect states. The oxygen vacancies serve as carrier traps or serve as carrier generation sources when hydrogen is captured therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

Note that of the CAAC-OS, the absorption coefficient calculated by a constant photocurrent method (CPM) is lower than $1 \times 10^{-3}$/cm, preferably lower than $1 \times 10^{-4}$/cm, further preferably lower than $5 \times 10^{-5}$/cm. The absorption coefficient has a positive correlation with an energy corresponding to the localized levels due to oxygen vacancies and entry of impurities (the energy calculated from the wavelength); thus, the density of defect levels in the CAAC-OS is extremely low.

A part of the absorption coefficient which is called an urbach tail due to the band tail is removed from a curve of the absorption coefficient obtained by the CPM measurement, whereby the absorption coefficient due to the defect levels can be calculated from the following formula. Note that the urbach tail indicates a constant gradient region on a curve of the absorption coefficient obtained by the CPM measurement, and the gradient is called urbach energy.

$$\int \frac{\alpha(E) - \alpha_u}{E} dE \qquad \text{[Formula 3]}$$

Here, $\alpha(E)$ indicates the absorption coefficient at each energy level and $\alpha_u$ indicates the absorption coefficient due to the urbach tail.

With the use of the highly purified intrinsic or substantially highly purified intrinsic CAAC-OS in a transistor, variation in the electrical characteristics of the transistor due to irradiation with visible light or ultraviolet light is small.

<Method for Forming CAAC-OS>

Since the c-axes of the crystal parts included in the CAAC-OS are aligned in the direction parallel to a normal vector of a surface where the CAAC-OS is formed or a normal vector of a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). Note that when the CAAC-OS is formed, the direction of c-axis of the crystal part is the direction parallel to a normal vector of the surface where the CAAC-OS is formed or a normal vector of the surface of the CAAC-OS. The crystal part is formed by film formation or by performing treatment for crystallization such as heat treatment after film formation.

There are three methods for forming a CAAC-OS.

The first method is to form an oxide semiconductor film at a temperature higher than or equal to 100° C. and lower than or equal to 450° C. to form, in the oxide semiconductor film, crystal parts in which the c-axes are aligned in the direction parallel to a normal vector of a surface where the oxide semiconductor film is formed or a normal vector of a surface of the oxide semiconductor film. Note that in this specification, the film formation temperature is preferably higher than or equal to 100° C. and lower than or equal to 400° C.

The second method is to form an oxide semiconductor film with a small thickness and then heat it at a temperature higher than or equal to 200° C. and lower than or equal to 700° C. to form, in the oxide semiconductor film, crystal parts in which the c-axes are aligned in the direction parallel to a normal vector of a surface where the oxide semiconductor film is formed or to a normal vector of a surface of the oxide semiconductor film. Note that in this specification, the heating temperature is preferably higher than or equal to 200° C. and lower than or equal to 400° C.

The third method is to form a first oxide semiconductor film with a small thickness, then heat it at a temperature higher than or equal to 200° C. and lower than or equal to 700° C., and form a second oxide semiconductor film to form, in the second oxide semiconductor film, crystal parts in which the c-axes are aligned in the direction parallel to a normal vector of a surface where the second oxide semiconductor film is formed or to a normal vector of a surface of the second oxide semiconductor film. Note that in this specification, the heating temperature is preferably higher than or equal to 200° C. and lower than or equal to 400° C.

Here, the first method for forming a CAAC-OS is described.

<Target and Formation Method thereof>

The CAAC-OS is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle or the pellet-like sputtered particle reaches a surface on which the CAAC-OS is formed while maintaining its crystal state, whereby the CAAC-OS can be deposited.

For the deposition of the CAAC-OS, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the deposition chamber may be reduced. Furthermore, the concentration of impurities in a deposition gas may be reduced. Specifically, a deposition gas with a dew point of −80° C. or lower, preferably −100° C. or lower is used.

By increasing the heating temperature of the surface on which the CAAC-OS is formed (e.g., the substrate heating temperature) during the deposition, migration of a sputtered particle is likely to occur after the sputtered particle reaches the surface on which the CAAC-OS is formed. Specifically, the temperature of the surface on which the CAAC-OS is formed during the deposition is higher than or equal to 100° C. and lower than or equal to 740° C., preferably higher than or equal to 200° C. and lower than or equal to 500° C. By increasing the temperature of the surface on which the CAAC-OS is formed during the deposition, when the flat-plate-like sputtered particle reaches the surface on which the CAAC-OS is formed, migration occurs on the surface on which the CAAC-OS is formed, so that a flat plane of the sputtered particle is attached to the surface on which the CAAC-OS is formed. The diameter (equivalent circle diameter) of the plane of the sputtered particle, which is parallel to the a-b plane, is approximately greater than or equal to 1 nm and less than or equal to 30 nm or greater than or equal to 1 nm and less than or equal to 10 nm, though it differs depending on the kind of oxide. Note that the flat-plate-like sputtered particle may have a hexagonal cylinder shape whose hexagonal plane is parallel to the a-b plane. In such a case, a direction perpendicular to the hexagonal plane is a c-axis direction.

When a cation of oxygen is ejected to a sputtering target in the sputtering, it is possible to reduce plasma damage at the deposition. Thus, when the ion collides with the surface of the sputtering target, a lowering in crystallinity of the sputtering target can be suppressed or a change of the sputtering target into an amorphous state can be suppressed.

When a cation of oxygen or argon is ejected to a sputtering target in the sputtering, in the case where a flat-plate-like sputtered particle having a hexagonal columnar shape is sputtered, the corners of a hexagonal plane can be positively charged. When the corners of the hexagonal plane are positively charged, positive charges repel each other in one sputtered particle. Thus, flat-plate shapes of the sputtered particles can be maintained.

It is preferable to use a direct-current (DC) power source to positively charge the corners of the plane of the flat-plate-like sputtered particle. Note that a radio frequency (RF) power source or an alternating-current (AC) power source can be used. Note that it is difficult to use an RF power source for a sputtering apparatus which is capable of deposition to a large-sized substrate. In addition, a DC power source is preferred to an AC power source from the viewpoint below.

In the AC power source, adjacent targets alternately have a cathode potential and an anode potential. In the case where the flat-plate-like sputtered particle is positively charged, positive charges in the sputtered particle repel each other, whereby flat-plate shapes of the sputtered particles can be maintained. However, in the case where the AC power source is used, there is time during which an electric field is not applied instantaneously; therefore, some charges of the flat-plate-like sputtered particle are lost and the structure of the sputtered particle might be broken. Thus, a DC power source is preferred to an AC power source.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based compound target is described below.

The polycrystalline In—Ga—Zn-based compound target is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, 3:1:2, 1:3:2, 1:6:4, or 1:9:6. The kinds of powder and the molar ratio for mixing powder may be determined as appropriate depending on the desired sputtering target.

With use of the sputtering target in the way as described above, an oxide semiconductor film having a uniform thickness and a uniform crystal orientation can be formed.

<Polycrystalline Oxide Semiconductor>

Note that an oxide semiconductor including polycrystal is referred to as a polycrystalline oxide semiconductor. A polycrystalline oxide semiconductor includes a plurality of crystal grains.

In an image obtained with a TEM, for example, crystal grains can be found in the polycrystalline oxide semiconductor in some cases. In most cases, the size of a crystal grain in the polycrystalline oxide semiconductor is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in the TEM image, a boundary between crystal grains can be found in the polycrystalline oxide semiconductor in some cases. Moreover, in the TEM image, a grain boundary can be found in the polycrystalline oxide semiconductor in some cases.

The polycrystalline oxide semiconductor may include a plurality of crystal grains, and the alignment of crystals may be different in the plurality of crystal grains. When a polycrystalline oxide semiconductor is analyzed by an out-of-plane method with use of an XRD apparatus, a peak at 2θ of around 31 degrees which shows alignment or peaks showing plural kinds of alignment appear in some cases. Further, spots are observed in a nanobeam electron diffraction pattern of the polycrystalline oxide semiconductor in some cases.

The polycrystalline oxide semiconductor has high crystallinity and thus has high electron mobility in some cases. Accordingly, a transistor including the polycrystalline oxide semiconductor in a channel region has high field-effect mobility. Note that there are cases in which an impurity is segregated at the grain boundary between the crystals in the polycrystalline oxide semiconductor. Moreover, the grain boundary of the polycrystalline oxide semiconductor becomes a defect state. Since the grain boundary of the polycrystalline oxide semiconductor may serve as a carrier trap or a carrier generation source, a transistor using the polycrystalline oxide semiconductor for a channel region has larger variation in electrical characteristics and lower reliability than a transistor using a CAAC-OS for a channel region in some cases.

The polycrystalline oxide semiconductor can be formed by high-temperature heat treatment or laser light treatment.

<Microcrystalline Oxide Semiconductor>

In an image obtained with the TEM, crystal parts cannot be found clearly in the microcrystalline oxide semiconductor in some cases. In most cases, the size of a crystal part in a microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak which shows a crystal plane does not appear. Further, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to that of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

Figure 31:
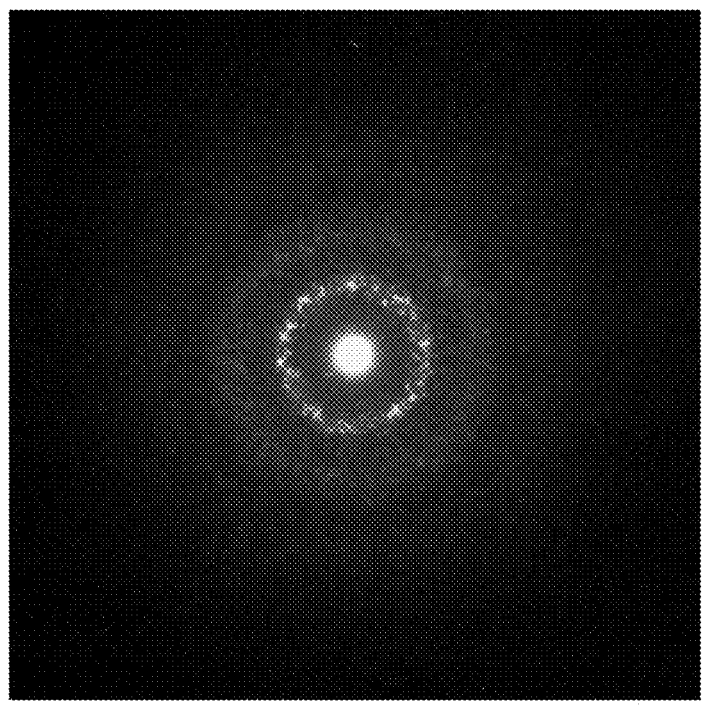
FIG. 31 shows a nanobeam electron diffraction pattern of an oxide semiconductor.

FIG. 31 shows an example of nanobeam electron diffraction performed on a sample including an nc-OS film. The measurement position is changed. Here, the sample is cut in the direction perpendicular to a surface where an nc-OS film is formed and the thickness thereof is reduced to be less than or equal to 10 nm. Further, an electron beam with a diameter of 1 nm enters from the direction perpendicular to the cut surface of the sample. FIG. 31 shows that, when a nanobeam electron diffraction is performed on the sample including the nc-OS film, a diffraction pattern exhibiting a crystal plane is obtained, but orientation along a crystal plane in a particular direction is not observed.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Thus, the nc-OS film has a higher carrier density than the CAAC-OS film in some cases. The oxide semiconductor film having a high carrier density has high electron mobility in some cases. Thus, a transistor including the nc-OS film has high field-effect mobility in some cases. The nc-OS film has a higher defect state density than the CAAC-OS film, and thus has a lot of carrier traps in some cases. Consequently, a transistor including the nc-OS film has larger variation in electric characteristics and lower reliability than a transistor including the CAAC-OS film. The nc-OS film can be formed easily as compared to the CAAC-OS film because the nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

<Method of Forming Microcrystalline Oxide Semiconductor Film>

Next, a method of forming the microcrystalline oxide semiconductor film is described below. The microcrystalline oxide semiconductor film is formed by a sputtering method in an atmosphere containing oxygen at a temperature of higher than or equal to a room temperature and lower than or equal to 75° C., preferably higher than or equal to a room temperature and lower than or equal to 50° C. With the use of the atmosphere containing oxygen, oxygen vacancies in the microcrystalline oxide semiconductor film can be reduced and a film including a microcrystal part can be formed.

A reduction of oxygen vacancies in the microcrystalline oxide semiconductor film allows the formation of a film having stable physical properties. In particular, in the case where a semiconductor device is manufactured with the use of a microcrystalline oxide semiconductor film, oxygen vacancies in the microcrystalline oxide semiconductor film serve as donors, and electrons that are carriers are generated in the microcrystalline oxide semiconductor film, which causes change in electrical characteristics of the semiconductor device. Thus, a semiconductor device formed using a microcrystalline oxide semiconductor film in which oxygen vacancies are reduced can be highly reliable.

Note that it is preferable to increase the oxygen partial pressure in the deposition atmosphere because the oxygen vacancies in the microcrystalline oxide semiconductor film can be further reduced. More specifically, the oxygen partial pressure in the deposition atmosphere is preferably greater than or equal to 33%.

Note that for a target used in formation of a microcrystalline oxide semiconductor film by a sputtering method, a target and a forming method which are similar to those of the CAAC-OS can be used.

Note that the nc-OS can be formed easily as compared to the CAAC-OS because the nc-OS can be formed even when a relatively large amount of impurities are included; thus, depending on the purpose, the nc-OS can be favorably used in some cases. For example, the nc-OS may be formed by a deposition method such as a sputtering method using an AC power supply. The sputtering method using an AC power supply allows a film to be formed with high uniformity over a large substrate, so that a semiconductor device including a transistor using the nc-OS for a channel region can be manufactured with high productivity.

<Amorphous Oxide Semiconductor>

An amorphous oxide semiconductor, for example, has disordered atomic arrangement and no crystal part. An amorphous oxide semiconductor, for example, does not have a specific shape as in quartz and regularity in atomic arrangement.

In an image obtained with a TEM, for example, crystal parts cannot be found clearly in the amorphous oxide semiconductor film in some cases.

When an amorphous oxide semiconductor is analyzed by an out-of-plane method with an XRD apparatus, a peak which shows alignment does not appear in some cases. Further, a halo pattern is observed in an electron diffraction pattern of an amorphous oxide semiconductor in some cases. In other cases, a halo pattern is observed instead of a spot in a nanobeam electron diffraction pattern of the amorphous oxide semiconductor.

The amorphous oxide semiconductor can be formed in some cases, for example, by introducing a high-concentration impurity such as hydrogen. Thus, the amorphous oxide semiconductor contains impurities at a high concentration.

When an oxide semiconductor contains a high-concentration impurity, a defect state such as an oxygen vacancy is formed in the oxide semiconductor in some cases. This means that an amorphous oxide semiconductor with a high-concentration impurity has a high density of defect states. In addition, since the amorphous oxide semiconductor has low crystallinity, the density of defect states of the amorphous oxide semiconductor is higher than that of the CAAC-OS or the nc-OS.

Accordingly, the amorphous oxide semiconductor has much higher carrier density than the nc-OS. Therefore, a transistor including the amorphous oxide semiconductor for a channel region tends to be normally on. Thus, in some cases, such an amorphous oxide semiconductor can be applied to a transistor which needs to be normally on. Since the amorphous oxide semiconductor has a high density of defect states, density of carrier traps might be increased. Consequently, a transistor including the amorphous oxide semiconductor for a channel region has larger variation in electric characteristics and lower reliability than a transistor including the CAAC-OS or the nc-OS for a channel region. Note that the amorphous oxide semiconductor can be formed by a deposition method in which a relatively large amount of impurity is contained, and thus can be easily obtained and preferably used depending on the application. For example, the amorphous oxide semiconductor may be formed by a deposition method such as a spin coating method, a sol-gel method, an immersion method, a spray method, a screen printing method, a contact printing method, an ink-jet printing method, a roll coating method, or a mist CVD method. Hence, a semiconductor device including a transistor using the amorphous oxide semiconductor for a channel region can be manufactured with high productivity.

Note that when the oxide semiconductor has few defects, the density thereof is increased. When the oxide semiconductor has high crystallinity, the density thereof is increased. When the oxide semiconductor has a lower concentration of impurities such as hydrogen, the density thereof is increased. The single-crystal oxide semiconductor has higher density than the CAAC-OS in some cases. The CAAC-OS has higher density than the microcrystalline oxide semiconductor in some cases. The polycrystalline oxide semiconductor has higher density than the microcrystalline oxide semiconductor in some cases. The microcrystalline oxide semiconductor has higher density than the amorphous oxide semiconductor in some cases.

[Embodiment 10]

In this embodiment, a human interface to which the semiconductor device of one embodiment of the present invention can be applied is described. In particular, a structure example of a sensor that can detect proximity or touch of an object (hereinafter referred to as a touch sensor) is described.

For a touch sensor, a variety of types such as a capacitive type, a resistive type, a surface acoustic wave type, and an infrared type can be employed.

Examples of the capacitive touch sensor are typically of a surface capacitive type, a projected capacitive type, and the like. Further, examples of the projected capacitive type are of a self capacitive type, a mutual capacitive type, and the like mainly in accordance with the difference in the driving method. Here, the use of a mutual capacitive type is preferable because of simultaneous sensing of multiple points (also referred to as multipoint sensing or multitouch).

Besides the touch sensor described here in detail, a sensor that can detect the operation (gesture) of an object (e.g., a finger or a hand), eye movements of users, or the like by a camera (including an infrared camera) or the like can be used as a human interface.

<Example of Detection Method of Sensor>

Figure 32A:
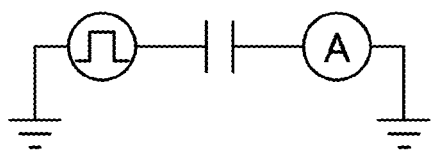
FIGS. 32A to 32C illustrate a touch sensor according to one embodiment.
Figure 32B:
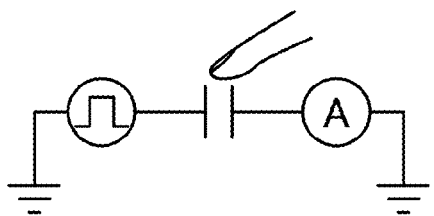

FIGS. 32A and 32B are schematic diagrams each illustrating a structure of a mutual capacitive touch sensor and input and output waveforms. The touch sensor includes a pair of electrodes. Capacitance is formed between the pair of electrodes. Input voltage is input to one of the pair of electrodes. Further, a detection circuit which detects current flowing in the other electrode (or a potential of the other electrode) is provided.

For example, in the case where a rectangular wave is used as an input voltage waveform as illustrated in FIG. 32A, a waveform having a sharp peak is detected as an output current waveform.

Further, in the case where an object having conductivity is proximate to or touches a capacitor as illustrated in FIG. 32B, the capacitance value between the electrodes is decreased; accordingly, the current value of the output is decreased.

By detecting a change in capacitance by using a change in output current (or potential) with respect to input voltage in this manner, proximity or a touch of an object can be detected.

<Structure Example of Touch Sensor>

Figure 32C:
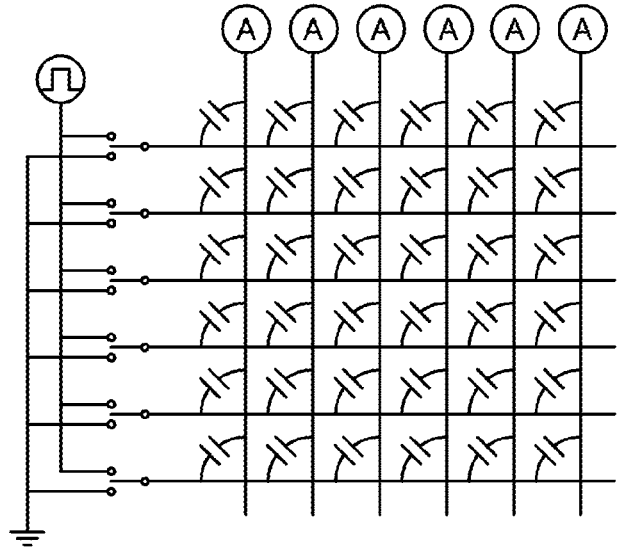

FIG. 32C illustrates a structure example of a touch sensor provided with a plurality of capacitors arranged in a matrix.

The touch sensor includes a plurality of wirings extending in an X direction (the horizontal direction of this figure) and a plurality of wirings extending in a Y direction (the vertical direction of this figure) which intersect with the plurality of wirings. Capacitance is formed between two wirings intersecting with each other.

One of input voltage and a common potential (including a grounded potential and a reference potential) is input to each of the wirings extending in the X direction. Further, a detection circuit (e.g., a source meter or a sense amplifier) is electrically connected to the wirings extending in the Y direction and can detect current (or potential) flowing through the wirings.

The touch sensor can perform sensing two dimensionally in such a manner that the touch sensor sequentially scans the plurality of wirings extending in the X direction so that input voltage is input and detects a change in current (or potential) flowing through the wirings extending in the Y direction.

<Structure Example of Touchscreen>

A structure example of a touchscreen including a touch sensor and a display portion including a plurality of pixels and a case where the touchscreen is incorporated in an electronic device are described below.

Figure 33A:
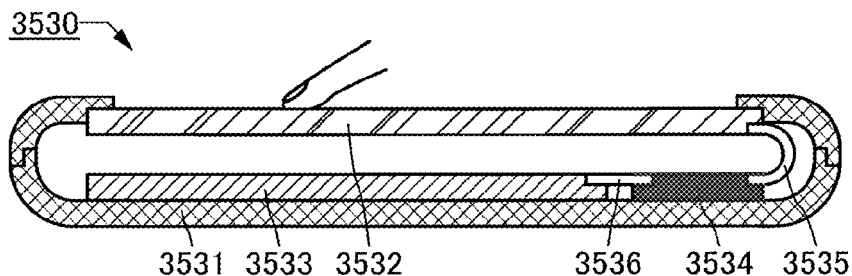
FIGS. 33A to 33E illustrate structural examples of a touchscreen and an electronic device according to one embodiment.

FIG. 33A is a schematic cross-sectional view of an electronic device including a touchscreen.

An electronic device 3530 includes a housing 3531 and at least a touchscreen 3532, a battery 3533, and a control portion 3534, which are provided in the housing 3531. The touchscreen 3532 is electrically connected to the control portion 3534 through a wiring 3535. The control portion 3534 controls image display on a display portion and the sensing operation of the touch sensor. The battery 3533 is electrically connected to the control portion 3534 through a wiring 3536 to supply electric power to the control portion 3534.

The touchscreen 3532 is provided so that its surface is not covered. An image can be displayed on the exposed surface of the touchscreen 3532 and the proximity or the contact of an object can be detected.

FIGS. 33B to 33E each illustrate a structure example of a touchscreen.

Figure 33B:
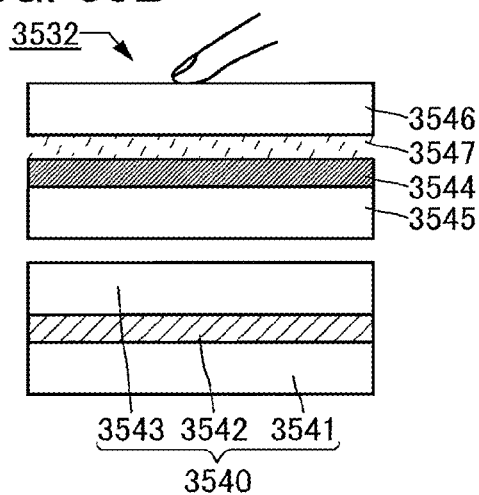

The touchscreen 3532 illustrated in FIG. 33B includes a display panel 3540 in which a display portion 3542 is provided between a first substrate 3541 and a second substrate 3543, a third substrate 3545 provided with a touch sensor 3544, and a protective substrate 3546.

As the display panel 3540, a variety of display devices such as a display device including a liquid crystal element or an organic electroluminescence (EL) element and an electronic paper can be used. Note that the touchscreen 3532 may additionally include a backlight, a polarizing plate, and the like in accordance with the structure of the display panel 3540.

An object comes in contact with or close to one of the surfaces of the protective substrate 3546; thus, the mechanical strength of at least the surface is preferably high. For example, a tempered glass which has been subjected to physical or chemical treatment by an ion exchange method, a thermal tempering method, or the like and has a surface to which compressive stress has been applied can be used as the protective substrate 3546. Alternatively, a flexible substrate with a coated surface, such as a plastic substrate can be used. Note that a protective film or an optical film may be provided over the protective substrate 3546.

The touch sensor 3544 is provided on at least one of the surfaces of the third substrate 3545. Alternatively, a pair of electrodes included in the touch sensor 3544 may be formed on both surfaces of the third substrate 3545. A flexible film may be used as the third substrate 3545 for thickness reduction of the touchscreen. The touch sensor 3544 may be held between a pair of substrates (provided with a film).

Although the protective substrate 3546 and the third substrate provided with the touch sensor 3544 are bonded to each other by a bonding layer 3547 in FIG. 33B, the protective substrate 3546 and the third substrate are not necessarily bonded to each other. The third substrate 3545 and the display panel 3540 may be bonded to each other by the bonding layer.

In the touchscreen 3532 illustrated in FIG. 33B, the display panel and the substrate provided with the touch sensor are separately provided. The touchscreen having such a structure can also be referred to as an externally attached touchscreen. In such a structure, the display panel and the substrate provided with the touch sensor are separately formed and then they are overlapped with each other, so that the display panel can have a touch sensor function. Thus, the touchscreen can be easily manufactured without a special manufacturing process.

Figure 33C:
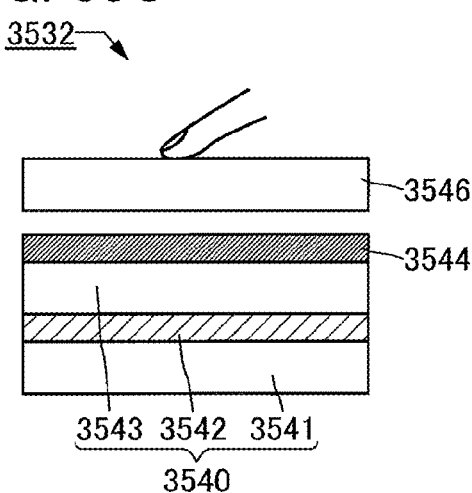

In the touchscreen 3532 illustrated in FIG. 33C, the touch sensor 3544 is provided on a surface of the second substrate 3543 which is on the protective substrate 3546 side. The touchscreen having such a structure can also be referred to as an on-cell touchscreen. With such a structure, the number of substrates needed can be reduced, which results in reductions in the thickness and weight of the touchscreen.

Figure 33D:
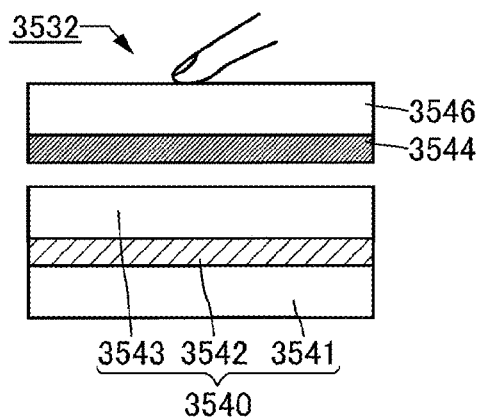

In the touchscreen 3532 illustrated in FIG. 33D, the touch sensor 3544 is provided on one of the surfaces of the protective substrate 3546. With such a structure, the display panel and the touch sensor can be separately manufactured; thus, the touchscreen can be easily manufactured. Furthermore, the number of substrates needed can be reduced, which results in reductions in the thickness and weight of the touchscreen.

Figure 33E:
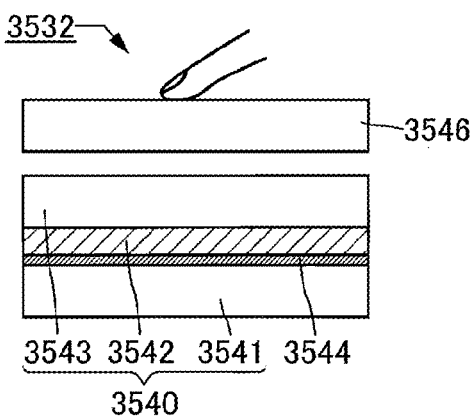

In the touchscreen 3532 illustrated in FIG. 33E, the touch sensor 3544 is provided between the pair of substrates in the display panel 3540. The touchscreen having such a structure can also be referred to as an in-cell touchscreen. With such a structure, the number of substrates needed can be reduced, which results in reductions in the thickness and weight of the touchscreen. Such a touchscreen can be achieved, for example, in such a manner that a circuit functioning as a touch sensor is formed using a transistor, a wiring, an electrode, and the like included in the display portion 3542 on the first substrate 3541 or the second substrate 3543. Further, in the case of using an optical touch sensor, a photoelectric conversion element may be provided.

<Structural Example of In-cell Touchscreen>

A structure example of a touchscreen incorporating the touch sensor into a display portion including a plurality of pixels is described below. Here, an example where a liquid crystal element is used as a display element provided in the pixel is shown.

Figure 34A:
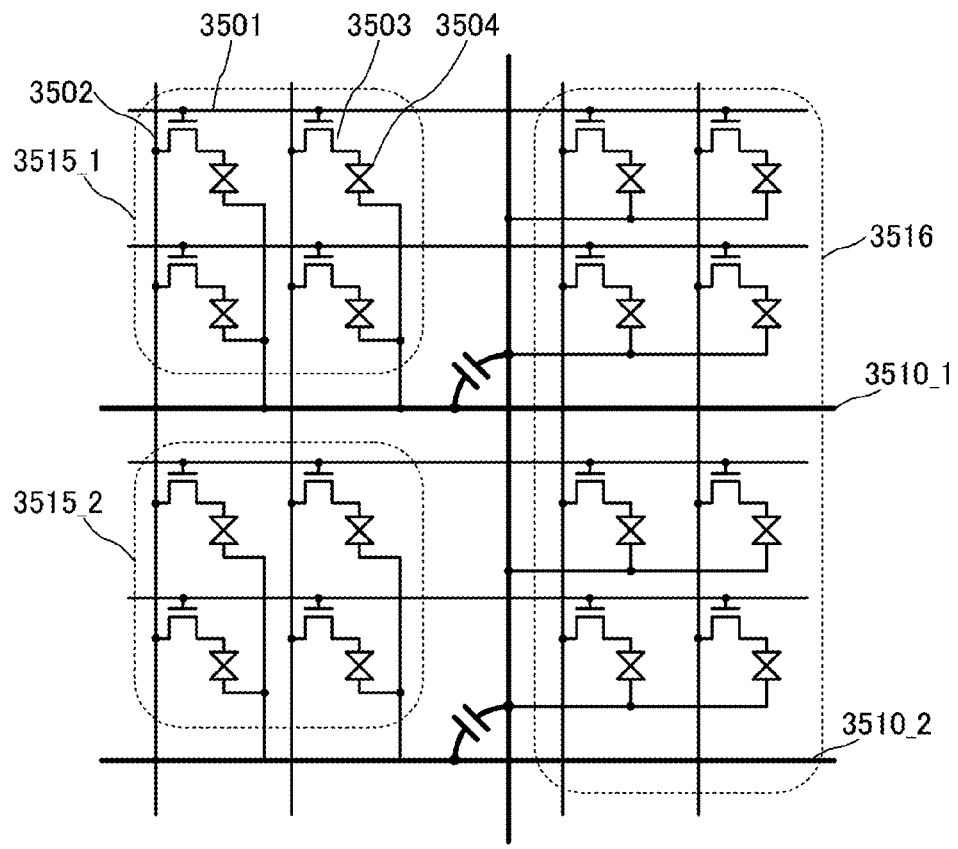
FIGS. 34A and 34B are diagrams illustrating a pixel provided with a touch sensor according to one embodiment.

FIG. 34A is an equivalent circuit diagram of part of a pixel circuit provided in the display portion of the touchscreen exemplified in this structure example.

Each pixel includes at least a transistor 3503 and a liquid crystal element 3504. In addition, a gate of the transistor 3503 is electrically connected to a wiring 3501 and one of a source and a drain of the transistor 3503 is electrically connected to a wiring 3502.

The pixel circuit includes a plurality of wirings extending in the X direction (e.g., a wiring 3510_1 and a wiring 3510_2) and a plurality of wirings extending in the Y direction (e.g., a wiring 3511). They are provided to intersect with each other, and capacitance is formed therebetween.

Among the pixels provided in the pixel circuit, ones of electrodes of the liquid crystal elements of some pixels adjacent to each other are electrically connected to each other to form one block. The block is classified into two types: an island-shaped block (e.g., a block 3515_1 or a block 3515_2) and a linear block (e.g., a block 3516) extending in the Y direction. Note that only part of the pixel circuit is illustrated in FIGS. 34A and 34B, and actually, these two kinds of blocks are repeatedly arranged in the X direction and the Y direction.

The wiring 3510_1 (or 3510_2) extending in the X direction is electrically connected to the island-shaped block 3515_1 (or the block 3515_2). Although not illustrated, the wiring 3510_1 extending in the X direction is electrically connected to a plurality of island-shaped blocks 3515_1 which are provided discontinuously along the X direction with the linear blocks therebetween. Further, the wiring 3511 extending in the Y direction is electrically connected to the linear block 3516.

Figure 34B:
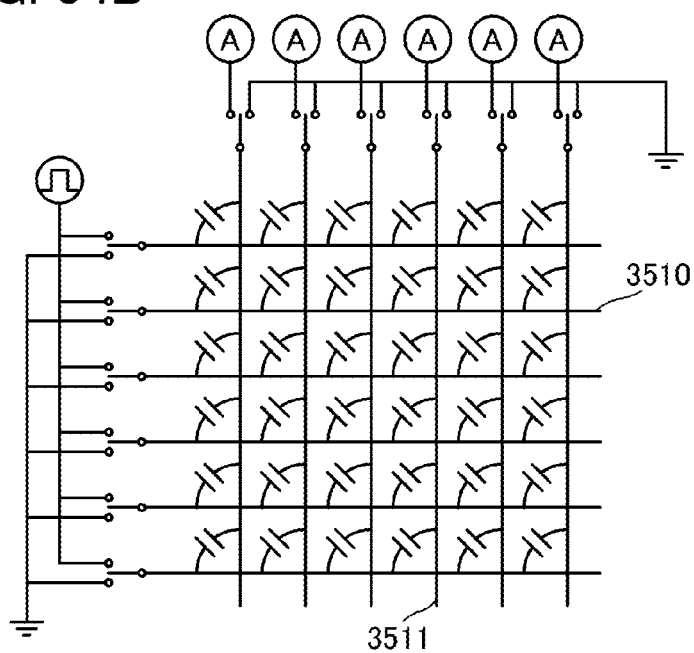

FIG. 34B is an equivalent circuit diagram in which a plurality of wirings 3510 extending in the X direction and the plurality of wirings 3511 extending in the Y direction are illustrated. Input voltage or a common potential can be input to each of the wirings 3510 extending in the X direction. Further, a ground potential can be input to each of the wirings 3511 extending in the Y direction, or the wirings 3511 can be electrically connected to the detection circuit.

<Example of Operation of Touchscreen>

Operation of the above-described touchscreen is described with reference to FIGS. 35A to 35C.

Figure 35A:
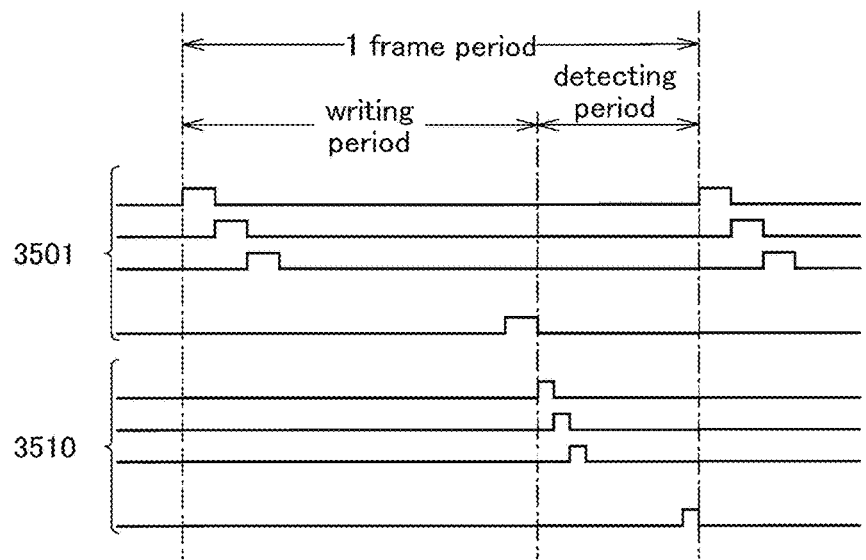
FIGS. 35A to 35C illustrate operations of touch sensors and pixels according to one embodiment.

As illustrated in FIG. 35A, one frame period is divided into a writing period and a detecting period. The writing period is a period in which image data is written to a pixel, and the wirings 3510 (also referred to as gate lines) are sequentially selected. On the other hand, the detecting period is a period in which sensing is performed by a touch sensor, and the wirings 3510 extending in the X direction are sequentially selected and input voltage is input.

Figure 35B:
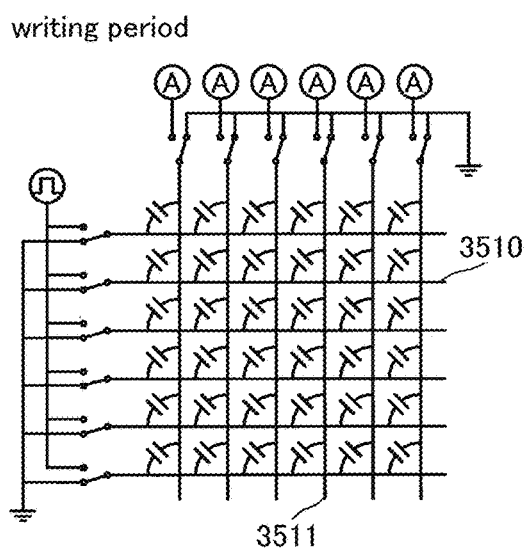

FIG. 35B is an equivalent circuit diagram in the writing period. In the wiring period, a common potential is input to both the wiring 3510 extending in the X direction and the wiring 3511 extending in the Y direction.

Figure 35C:
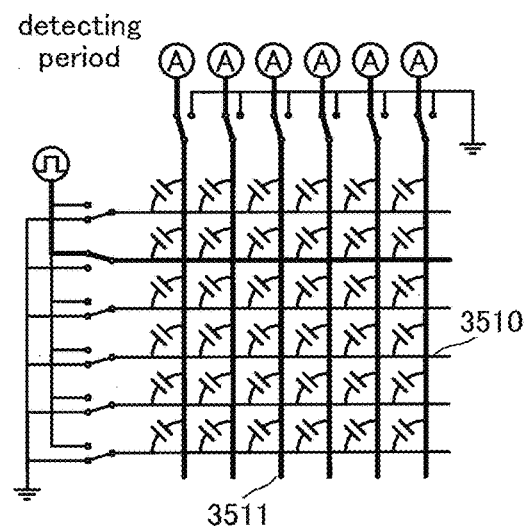

FIG. 35C is an equivalent circuit diagram at some point in time in the detection period. In the detection period, each of the wirings 3511 extending in the Y direction is electrically connected to the detection circuit. Input voltage is input to the wirings 3510 extending in the X direction which are selected, and a common potential is input to the wirings 3511 extending in the X direction which are not selected.

It is preferable that a period in which an image is written and a period in which sensing is performed by a touch sensor be separately provided as described above. Thus, a decrease in sensitivity of the touch sensor caused by noise generated when data is written to a pixel can be suppressed.

[Embodiment 11]

Figure 36:
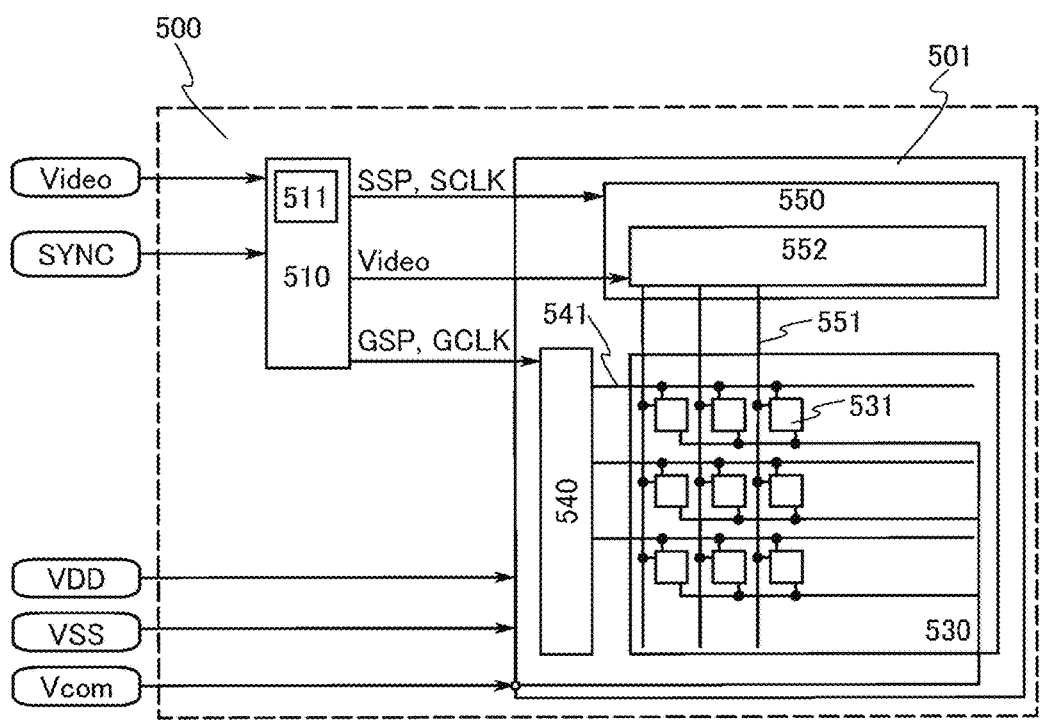
FIG. 36 is a block diagram showing a structural example of a liquid crystal display device.
Figure 37:
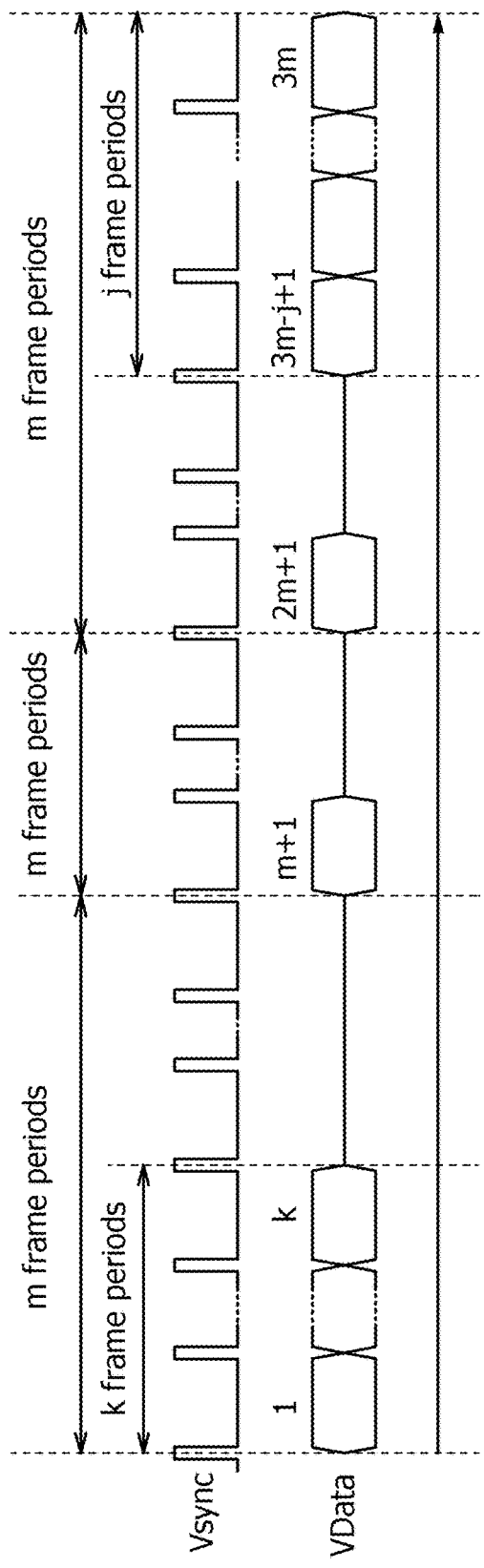
FIG. 37 is a timing chart illustrating one example of a method for driving a liquid crystal display device.

In this embodiment, a driving method for reducing power consumption of a display device is described. By using the driving method in this embodiment, power consumption of a display device including an oxide semiconductor transistor in a pixel can be further reduced. With reference to FIGS. 36 and 37, low power consumption of a liquid crystal display device, which is an example of the display device, is described below.

FIG. 36 is a block diagram illustrating a structural example of a liquid crystal display device in this embodiment. As shown in FIG. 36, a liquid crystal display device 500 includes a liquid crystal panel 501 as a display module, a control circuit 510, and a counter circuit.

An image signal (Video), which is digital data, and a synchronization signal (SYNC) for controlling rewriting of a screen of the liquid crystal panel 501 are input to the liquid crystal display device 500. Examples of a synchronization signal include a horizontal synchronization signal (Hsync), a vertical synchronization signal (Vsync), and a reference clock signal (CLK).

The liquid crystal panel 501 includes a display portion 530, a scan line driver circuit 540, and a data line driver circuit 550. The display portion 530 includes a plurality of pixels 531. The pixels 531 in the same row are connected to the scan line driver circuit 540 through a common scan line 541, and the pixels 531 in the same column are connected to the data line driver circuit 550 through a common data line 551.

A high power supply voltage (VDD) and a low power supply voltage (VSS), which serve as power supply voltages, and a common voltage (hereinafter referred to as Vcom) are supplied to the liquid crystal panel 501. The common voltage (Vcom) is supplied to each pixel 531 in the display portion 530.

The data line driver circuit 550 processes an input image signal to generate a data signal, and outputs the data signal to the data line 551. The scan line driver circuit 540 outputs, to the scan line 541, a scan signal for selecting the pixel 531 into which a data signal is to be written.

The pixel 531 includes a switching element whose electrical connection to the data line 551 is controlled by a scan signal. When the switching element is turned on, a data signal is written into the pixel 531 through the data line 551.

An electrode to which Vcom is applied corresponds to a common electrode.

The control circuit 510 controls the whole liquid crystal display device 500 and includes a circuit which generates control signals for circuits included in the liquid crystal display device 500.

The control circuit 510 includes a control circuit generation circuit which generates control signals for the scan line driver circuit 540 and the data line driver circuit 550 on the basis of the synchronization signal (SYNC). Examples of a control signal for the scan line driver circuit 540 include a start pulse (GSP) and a clock signal (GCLK). Examples of a control signal for the data line driver circuit 550 include a start pulse (SSP) and a clock signal (SCLK). For example, the control circuit 510 generates a plurality of clock signals with the same cycle and shifted phases as the clock signals (GCLK and SCLK).

Further, the control circuit 510 controls output of an image signal (Video), which is input from the outside of the liquid crystal display device 500, to the data line driver circuit 550.

The data line driver circuit 550 includes a digital/analog conversion circuit (hereinafter referred to as a D-A conversion circuit 552). The D-A conversion circuit 552 converts an image signal to an analog signal, thereby generating a data signal.

Note that in the case where an image signal input to the liquid crystal display device 500 is an analog signal, the image signal is converted to a digital signal in the control circuit 510 and output to the liquid crystal panel 501.

An image signal is image data for each frame. The control circuit 510 has a function of performing image processing on the image signal and controlling output of the image signal to the data line driver circuit 550 on the basis of data obtained by the processing. For that function, the control circuit 510 includes a motion detection portion 511 which detects motion in the image data for each frame. The control circuit 510 stops output of an image signal to the data line driver circuit 550 when the motion detection portion 511 determines that there is no motion, and restarts the output of an image signal when the motion detection portion 511 determines that there is motion.

There is no particular limitation on the image processing for detecting motion which is performed in the motion detection portion 511. An example of a method for detecting motion is to obtain difference data from image data for two consecutive frames. It can be determined whether there is motion or not from the obtained difference data. Another example of the method is to detect a motion vector.

In addition, the liquid crystal display device 500 may be provided with an image signal correction circuit which corrects an input image signal. For example, an image signal is corrected such that a voltage higher than a voltage corresponding to the gray scale of the image signal is written into the pixel 531. Such correction can shorten the response time of the liquid crystal element. A method in which the control circuit 510 is driven with an image signal corrected in this manner is referred to as overdriving. In the case of performing high frame rate driving in which the liquid crystal display device 500 is driven at an integral multiple of the frame frequency of an image signal, image data for interpolation between two frames or image data for performing black display between two frames may be generated in the control circuit 510.

Next, the operation of the liquid crystal display device 500 for displaying an image with motion, such as a moving image, and an image without motion, such as a still image, is described with reference to a timing chart in FIG. 37. FIG. 37 shows the signal waveforms of a vertical synchronization signal (Vsync) and a data signal (Vdata) output to the data line 551 from the data line driver circuit 550.

FIG. 37 is a timing chart of the liquid crystal display device 500 during 3m frame periods. Here, there is motion in image data in the first k frame periods and the last j frame periods and there is no motion in image data in the other frame periods. Note that k and j are each an integer greater than or equal to 1 and less than or equal to m−2.

In the first k frame periods, the motion detection portion 511 determines that there is motion in image data for each frame. The control circuit 510 outputs data signals (Vdata)

to the data line 551 on the basis of the result of determination by the motion detection portion 511.

The motion detection portion 511 performs image processing for detecting motion and determines that there is no motion in image data for the (k+1)-th frame. Then, the control circuit 510 stops output of image signals (Video) to the data line driver circuit 550 in the (k+1)-th frame period on the basis of the result of determination by the motion detection portion 511. Thus, output of the data signal (Vdata) from the data line driver circuit 550 to the data line 551 is stopped. Further, the control circuit 510 stops the supply of control signals (e.g., a start pulse signal and a clock signal) to the scan line driver circuit 540 and the data line driver circuit 550 in order to stop rewriting of the display portion 530. The control circuit 510 does not output an image signal to the data line driver circuit 550 nor output control signals to the scan line driver circuit 540 and the data line driver circuit 550, thereby keeping rewriting of the display portion 530 stopped, until the motion detection portion 511 determines that there is motion in image data.

Note that, in this specification, "not to supply" a signal to a liquid crystal panel means to apply voltage which is different from a predetermined voltage for operating a circuit to a wiring for supplying the signal, or to bring the wiring into an electrically floating state.

When rewriting of the display portion 530 is stopped, an electric field in one direction is kept applied to the liquid crystal element, which might lead to deterioration of liquid crystal in the liquid crystal element. In the case where such a problem is likely to occur, it is preferable that signals be supplied to the scan line driver circuit 540 and the data line driver circuit 550 from the control circuit 510 and data signals with an inverted polarity be written into the data line 551 at predetermined timings to invert the direction of the electric field applied to the liquid crystal element, regardless of the result of determination by the motion detection portion 511.

Note that the polarity of a data signal input to the data line 551 is determined relative to Vcom. The polarity is positive when the voltage of the data signal is higher than Vcom, and is negative when the voltage of the data signal is lower than Vcom.

Specifically, as shown in FIG. 37, in the (m+1)-th frame period, the control circuit 510 outputs control signals to the scan line driver circuit 540 and the data line driver circuit 550 and outputs an image signal (Video) to the data line driver circuit 550. The data line driver circuit 550 outputs, to the data line 551, a data signal (Vdata) which has an inverted polarity with respect to a data signal (Vdata) output to the data line 551 in the k-th frame period. In this manner, a data signal (Vdata) with an inverted polarity is written into the data line 551 in the (m+1)-th frame period and in the (2m+1)-th frame period, which are periods in which no motion is detected in image data. Rewriting of the display portion 530 is intermittently performed in periods in which there is no change in image data; thus, it is possible to reduce power consumption due to rewriting and prevent deterioration of the liquid crystal element.

When the motion detection portion 511 determines that there is motion in image data for any frame after the (2m+1)-th frame, the control circuit 510 controls the scan line driver circuit 540 and the data line driver circuit 550 to perform rewriting of the display portion 530.

As described above, with the driving method in FIG. 37, the polarity of a data signal (Vdata) is inverted every m frame periods regardless of whether there is motion in image data (Video) or not. Meanwhile, the display portion 530 is rewritten every frame in periods in which an image with motion is displayed and is rewritten every m frames in periods in which an image without motion is displayed. Consequently, power consumed owing to rewriting of the display portion can be reduced. This can prevent an increase in power consumption due to an increase in driving frequency and the number of pixels.

As described above, in the liquid crystal device 500, the method for driving the liquid crystal display device is switched between in a moving image display mode and in a still image display mode; thus, it is possible to provide a liquid crystal display device with low power consumption while inhibiting deterioration of liquid crystal and maintaining display quality.

In the case where a still image is displayed, when a pixel is rewritten every one frame, human eyes perceive the rewriting of the pixel as flickers in some cases, which causes eyestrain. The pixel is not frequently rewritten in the display period of the still image in the liquid crystal device of this embodiment, which is effective for reducing eyestrain.

Thus, with the use of a liquid crystal panel in which a backplane is formed using an oxide semiconductor transistor, a middle size liquid crystal display device with high resolution and low power consumption, which is very suitable for a portable electronic device, can be provided.

Note that, in order to prevent deterioration of the liquid crystal, the interval between polarity inversions of data signals (here, m frame periods) is set to two seconds or shorter, preferably one second or shorter.

Although the detection of motion in image data is performed in the motion detection portion 511 in the control circuit 510, the detection of motion is not necessarily performed only in the motion detection portion 511. Data on whether there is motion or not may be input to the control circuit 510 from the outside of the liquid crystal display device 500.

Determination that there is no motion in image data is not always based on image data for two consecutive frames; the number of frames required for the determination may be set as appropriate depending on the usage mode of the liquid crystal display device 500. For example, rewriting of the display portion 530 may be stopped when there is no motion in image data for m consecutive frames.

Note that although description of this embodiment is made using a liquid crystal display device as a display device, the driving method in this embodiment can be used for other display devices, e.g., a light-emitting display device.

Note that the structures, methods, and the like described in this embodiment can be used as appropriate in combination with any of the structures, methods, and the like described in the other embodiments and examples.

[Embodiment 12]

The semiconductor device which is one embodiment of the present invention can be applied to a variety of electronic appliances (including game machines). Examples of electronic appliances include a television device (also referred to as television or television receiver), a monitor of a computer or the like, a digital camera, a digital video camera, a digital photo frame, a mobile phone, a portable game machine, a portable information terminal, an audio reproducing device, a game machine (e.g., a pachinko machine or a slot machine), and a game console, and the like. Examples of these electronic appliances are illustrated in FIGS. 38A to 38C.

Figure 38A:
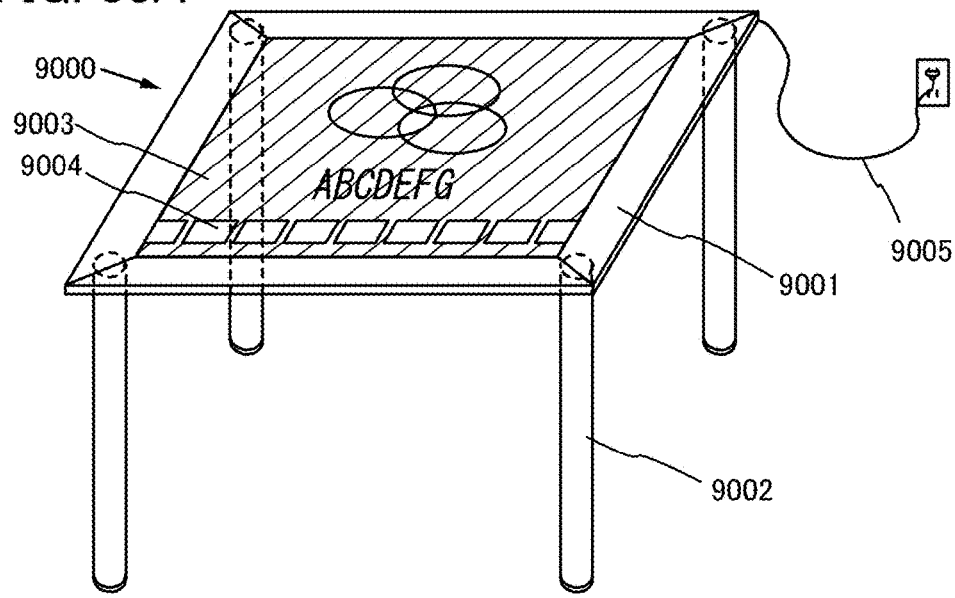
FIGS. 38A to 38C illustrate electronic devices each including a semiconductor device of one embodiment of the present invention.
Figure 38B:
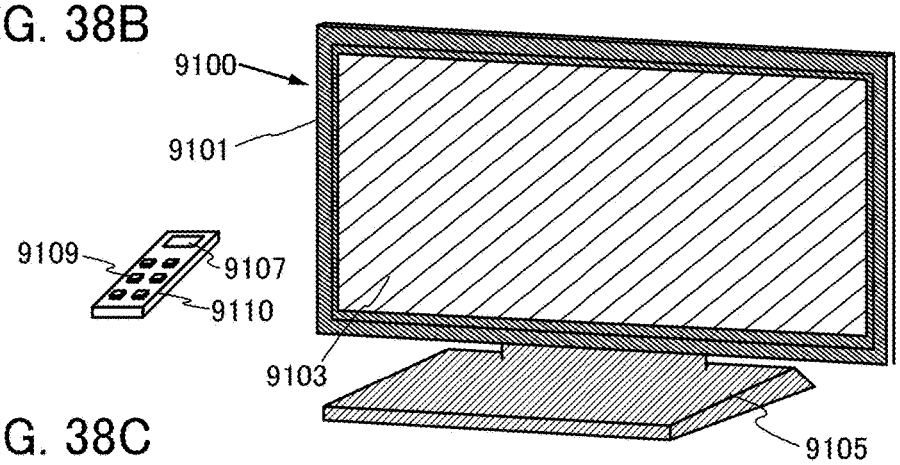
Figure 38C:
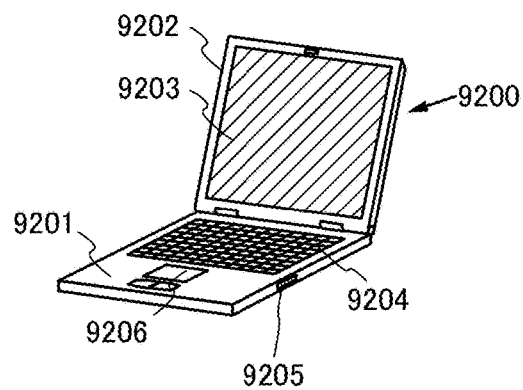

FIG. 38A illustrates a table 9000 having a display portion. In the table 9000, a display portion 9003 is incorporated in a housing 9001 and an image can be displayed on the display portion 9003. The housing 9001 is supported by four leg portions 9002. Further, a power cord 9005 for supplying power is provided for the housing 9001.

The semiconductor device described in any of the above embodiments can be used for the display portion 9003. Thus, the display portion 9003 can have high display quality.

The display portion 9003 has a touch-input function. When a user touches displayed buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen. For example, with the use of the semiconductor device having an image sensor function, the display portion 9003 can have a touch-input function.

Further, the screen of the display portion 9003 can be placed perpendicular to a floor with a hinge provided for the housing 9001; thus, the table can also be used as a television device. When a television device having a large screen is set in a small room, an open space is reduced; however, when a display portion is incorporated in a table, a space in the room can be efficiently used.

FIG. 38B illustrates a television device 9100. In the television device 9100, a display portion 9103 is incorporated in a housing 9101 and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 38B is provided with a receiver, a modem, and the like. With the receiver, general television broadcasts can be received in the television device 9100. Further, when the television device 9100 is connected to a communication network by wired or wireless connection via the modem, one-way (from a transmitter to a receiver) or two-way (between a transmitter and a receiver or between receivers) data communication can be performed.

Any of the semiconductor devices described in the above embodiments can be used for the display portions 9103 and 9107. Thus, the television device can have high display quality.

FIG. 38C illustrates a computer 9200, which includes a main body 9201, a housing 9202, a display portion 9203, a keyboard 9204, an external connection port 9205, a pointing device 9206, and the like.

Any of the semiconductor devices described in the above embodiments can be used for the display portion 9203. Thus, the computer 9200 can have high display quality.

The display portion 9203 has a touch-input function. When a user touches displayed buttons which are displayed on the display portion 9203 of the computer 9200 with his/her fingers or the like, the user can carry out operation of the screen and input of information. Further, when the computer may be made to communicate with home appliances or control the home appliances, the display portion 9203 may function as a control device which controls the home appliances by operation on the screen.

FIGS. 39A and 39B illustrate a foldable tablet terminal. In FIG. 39A, the tablet terminal is opened and includes a housing 9630, a display portion 9631a, a display portion 9631b, a display-mode switching button 9034, a power button 9035, a power-saving-mode switching button 9036, a clip 9033, and an operation button 9038.

Any of the semiconductor devices described in the above embodiments can be used for the display portion 9631a and the display portion 9631b. Thus, the display quality of the tablet terminal can be improved.

Part of the display portion 9631a can be a touch panel region 9632a and data can be input when a displayed operation key 9638 is touched. Although a structure in which a half region in the display portion 9631a has only a display function and the other half region also has a touch panel function is illustrated as an example, the structure of the display portion 9631a is not limited thereto. The whole area of the display portion 9631a may have a touch screen function. For example, the whole area of the display portion 9631a can display keyboard buttons and serve as a touch screen while the display portion 9631b can be used as a display screen.

Like the display portion 9631a, part of the display portion 9631b can be a touch screen region 9632b. When a keyboard display switching button 9639 displayed on the touch panel is touched with a finger, a stylus, or the like, a keyboard can be displayed on the display portion 9631b.

Touch input can be performed concurrently on the touch screen regions 9632a and 9632b.

The display-mode switching button 9034 can switch display orientation (e.g., between landscape mode and portrait mode) and select a display mode (switch between monochrome display and color display), for example. The power-saving-mode switching button 9036 can control display luminance in accordance with the amount of external light in use of the tablet terminal detected by an optical sensor incorporated in the tablet. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 39A, one embodiment of the present invention is not limited to this example. The display portion 9631a and the display portion 9631b may have different areas or different display quality. For example, one of them may be a display panel that can display higher-definition images than the other.

In FIG. 39B, the tablet terminal is folded and includes the housing 9630, a solar cell 9633, and a charge and discharge control circuit 9634. Note that in FIG. 39B, an example in which the charge and discharge control circuit 9634 includes the battery 9635 and the DCDC converter 9636 is illustrated.

Since the tablet can be folded in two, the housing 9630 can be closed when not in use. Thus, the display portions 9631a and 9631b can be protected, thereby providing a tablet with high endurance and high reliability for long-term use.

In addition, the tablet terminal illustrated in FIGS. 39A and 39B can have a function of displaying various kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633, which is attached on the surface of the tablet terminal, supplies electric power to a touch screen, a display portion, an image signal processor, and the like. Note that the solar cell 9633 can be provided on one or both surfaces of the housing 9630, so that the battery 9635 can be charged efficiently. The use of a lithium ion battery as the battery 9635 is advantageous in downsizing or the like.

The structure and operation of the charge and discharge control circuit 9634 illustrated in FIG. 39B are described with reference to a block diagram of FIG. 39C. The solar cell 9633, the battery 9635, the DCDC converter 9636, a converter 9637, switches SW1 to SW3, and the display portion 9631 are shown in FIG. 39C, and the battery 9635, the DCDC converter 9636, the converter 9637, and the switches SW1 to SW3 correspond to the charge/discharge control circuit 9634 in FIG. 39B.

First, an example of the operation in the case where power is generated by the solar cell 9633 using external light is described. The voltage of power generated by the solar battery is raised or lowered by the DCDC converter 9636 so that the power has a voltage for charging the battery 9635. Then, when the power from the solar cell 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and a switch SW2 is turned on so that charge of the battery 9635 may be performed.

Note that the solar cell 9633 is described as an example of a power generation means; however, without limitation thereon, the battery 9635 may be charged using another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Note that the structures and the like described in this embodiment can be combined as appropriate with any of the structures and the like described in the other embodiments.

EXAMPLE 1

Example 1 describes measurement results of Vg-Id characteristics of transistors and BT photostress tests.

First of all, a manufacturing process of a transistor included in a sample 1 is described. In this example, the process is described with reference to FIGS. 2A to 2D.

First, as illustrated in FIG. 2A, a glass substrate was used as the substrate 11, and the gate electrode 15 was formed over the substrate 11.

A 100-nm-thick tungsten film was formed by a sputtering method, a mask was formed over the tungsten film by a photolithography process, and part of the tungsten film was etched with the use of the mask, so that the gate electrode 15 was formed.

Next, the gate insulating film 17 (corresponding to GI in FIG. 40) was formed over the gate electrode 15.

The gate insulating film 17 was formed by stacking a 50-nm-thick first silicon nitride film and a 200-nm-thick silicon oxynitride film.

The silicon nitride film was formed under the following conditions: silane with a flow rate of 50 sccm and nitrogen with a flow rate of 5000 sccm were supplied to a treatment chamber of a plasma CVD apparatus as the source gas; the pressure in the treatment chamber was controlled to 60 Pa; and a power of 150 W was supplied with the use of a 27.12 MHz high-frequency power source.

Next, the silicon oxynitride film was formed under the following conditions: silane with a flow rate of 20 sccm and dinitrogen monoxide with a flow rate of 3000 sccm were supplied to the treatment chamber of the plasma CVD apparatus as the source gas; the pressure in the treatment chamber was controlled to 40 Pa, and a power of 100 W was supplied with the use of a 27.12 MHz high-frequency power source.

In each of the forming steps of the silicon nitride film and the silicon oxynitride film, the substrate temperature was 350° C.

Next, the oxide semiconductor film 18 was formed to overlap with the gate electrode 15 with the gate insulating film 17 provided therebetween.

Here, a 35-nm-thick oxide semiconductor film was formed over the gate insulating film 17 by a sputtering method. Then, a mask was formed over the oxide semiconductor film by a photolithography process, and part of the oxide semiconductor film was etched using the mask to form the oxide semiconductor film 18 (corresponding to S1 in FIG. 40).

The oxide semiconductor film (S1) was formed under the following conditions: a sputtering target where In:Ga:Zn=1:1:1 (atomic ratio) was used; argon with a flow rate of 100 sccm and oxygen with a flow rate of 100 sccm were supplied as a sputtering gas into a treatment chamber of a sputtering apparatus; the pressure in the treatment chamber was controlled to 0.6 Pa; and a direct-current power of 5 kW was supplied. Note that the oxide semiconductor film was formed at a substrate temperature of 170° C.

For the structure obtained through the steps up to here, FIG. 2B can be referred to.

Next, after the gate electrode was exposed by partly etching the gate insulating film 17 (not illustrated), the pair of electrodes 21 and 22 in contact with the oxide semiconductor film 18 was formed as illustrated in FIG. 2C.

Here, a conductive film was formed over the gate insulating film 17 and the oxide semiconductor film 18. As the conductive film, a 400-nm-thick aluminum film was formed over a 50-nm-thick tungsten film, and a 100-nm-thick titanium film was formed over the aluminum film. Then, a mask was formed over the conductive film by a photolithography process, and part of the conductive film was subjected to wet etching using the mask, whereby the pair of electrodes 21 and 22 was formed.

Next, after the substrate was transferred to a treatment chamber in a reduced pressure and heated at 350° C., the oxide semiconductor film 18 was exposed to oxygen plasma that was generated in a dinitrogen monoxide atmosphere by supply of a high-frequency power of 150 W to an upper electrode provided in the treatment chamber with the use of a 27.12 MHz high-frequency power source.

Then, the protective film 26 was formed over the oxide semiconductor film 18 and the pair of electrodes 21 and 22 (see FIG. 2D). Here, as the protective film 26, the oxide insulating film 23 (corresponding to P1 in FIG. 40) and the oxide insulating film 24 (corresponding to P2 in FIG. 40) were formed.

First, after the above plasma treatment, the oxide insulating film 23 and the oxide insulating film 24 were formed in succession without exposure to the atmosphere. A 10-nm-thick silicon oxynitride film was formed as the oxide insulating film 23, and a 390-nm-thick silicon oxynitride film was formed as the oxide insulating film 24.

The oxide insulating film 23 was formed by a plasma CVD method under the following conditions: silane with a flow rate of 20 sccm and dinitrogen monoxide with a flow rate of 3000 sccm were used as a source gas; the pressure in the treatment chamber was 200 Pa; the substrate temperature was 350° C.; and a high-frequency power of 100 W was supplied to parallel-plate electrodes.

The oxide insulating film 24 was formed by a plasma CVD method under the following conditions: silane with a flow rate of 160 sccm and dinitrogen monoxide with a flow rate of 4000 sccm were used as a source gas, the pressure in the treatment chamber was 200 Pa, the substrate temperature was 220° C., and the high-frequency power of 1500 W was supplied to the parallel-plate electrodes. Under the above conditions, it is possible to form a silicon oxynitride film which contains oxygen at a higher proportion than the stoichiometric composition and from which part of oxygen is released by heating.

Next, by heat treatment, water, nitrogen, hydrogen, or the like was released from the oxide insulating film 23 and the oxide insulating film 24 and part of oxygen contained in the oxide insulating film 24 was supplied to the oxide semiconductor film 18. Here, the heat treatment was performed in an atmosphere of nitrogen and oxygen at 350° C. for one hour.

Next, although not illustrated, an opening which exposes part of the pair of electrodes 21 and 22 was formed by partly etching the protective film 26.

Next, a planarization film was formed (not illustrated) over the protective film 26. Here, the protective film 26 was coated with a composition, and exposure and development were performed, so that a planarization film having an opening through which the pair of electrodes is partly exposed was formed. Note that as the planarization film, a 1.5-μm-thick acrylic resin was formed. Then, heat treatment was performed. The heat treatment was performed at a temperature of 250° C. in a nitrogen atmosphere for one hour.

Next, a conductive film connected to part of the pair of electrodes was formed (not illustrated). Here, a 100-nm-thick ITO film containing silicon oxide was formed as the conductive film by a sputtering method. After that, heat treatment was performed at 250° C. in a nitrogen atmosphere for one hour.

Through the above process, the sample 1 including a transistor was formed.

Another sample was formed in the following manner. The gate insulating film 17 in the transistor of the sample 1 was formed by stacking a 50-nm-thick first silicon nitride film, a 300-nm-thick second silicon nitride film, a 50-nm-thick third silicon nitride film, and a 50-nm-thick silicon oxynitride film. Further, instead of the oxide semiconductor film 18, a multilayer film in which a 35-nm-thick oxide semiconductor film (corresponding to S1 in FIG. 40) and a 10-nm-thick oxide film (corresponding to S2 in FIG. 40) were stacked was formed. After the pair of electrodes was formed, a surface of the multilayer film was subjected to cleaning treatment using a phosphoric acid solution in which 85% phosphoric acid was diluted by 100 times. The protective film 26 was formed by stacking a 10-nm-thick oxide insulating film 23, a 400-nm-thick oxide insulating film 24, and a 100-nm-thick silicon nitride film 25 (corresponding to P3 in FIG. 40). A sample having such a structure is referred to as a sample 2.

The film formation conditions of the first to the third silicon nitride films of the gate insulating film 17 in the sample 2 are described below.

The first silicon nitride film was formed under the following conditions: silane with a flow rate of 200 sccm, nitrogen with a flow rate of 2000 sccm, and ammonia with a flow rate of 100 sccm were supplied to the treatment chamber of the plasma CVD apparatus as the source gas; the pressure in the treatment chamber was controlled to 100 Pa, and a power of 2000 W was supplied with the use of a 27.12 MHz high-frequency power source.

Next, the second silicon nitride film was formed in such a manner that, in the conditions of the source gas of the first silicon nitride film, the flow rate of ammonia was changed to 2000 sccm.

Next, the third silicon nitride film was formed under the following conditions: silane with a flow rate of 200 sccm and nitrogen with a flow rate of 5000 sccm were supplied to the treatment chamber of the plasma CVD apparatus as the source gas; the pressure in the treatment chamber was controlled to 100 Pa, and the power of 2000 W was supplied with the use of a 27.12 MHz high-frequency power source.

The film formation conditions of the oxide film (S2) in contact with the oxide semiconductor film 18 in the sample 2 are described below. The oxide film (S2) was formed under the following conditions: a sputtering target where In:Ga:Zn=1:3:2 (atomic ratio) was used; Ar with a flow rate of 180 sccm and oxygen with a flow rate of 20 sccm were supplied as a sputtering gas into the treatment chamber of the sputtering apparatus; the pressure in the treatment chamber was controlled to 0.6 Pa; and a direct-current power of 5 kW was supplied. Note that the oxide film was formed at a substrate temperature of 170° C.

The film formation conditions of the nitride insulating film 25 (corresponding to P3 in FIG. 40) in the sample 2 are described below. The nitride insulating film 25 was formed by a plasma CVD method under the following conditions: silane with a flow rate of 50 sccm, nitrogen with a flow rate of 5000 sccm, and ammonia with a flow rate of 100 sccm were used as a source gas, the pressure in the treatment chamber was 100 Pa, the substrate temperature was 350° C., and a high-frequency power of 1000 W was supplied to the parallel-plate electrodes.

Another sample was formed in the following manner. In the transistor of the sample 1, the gate insulating film 17 was formed using the structure and conditions similar to those of the sample 2. Further, after the oxide semiconductor film 18 was formed, heat treatment was performed at 450° C. Note that in a manner similar to that of the sample 2, after the pair of electrodes was formed, a surface of the oxide semiconductor film 18 was subjected to cleaning treatment using a phosphoric acid solution in which 85% phosphoric acid was diluted by 100 times. The thickness of the oxide insulating film 23 was 50 nm. In the film formation conditions of the oxide insulating film 23 (corresponding to P1 in FIG. 40), the film formation temperature was 220° C. Further, the protective film was formed by stacking the oxide insulating film 23, the oxide insulating film 24, and the nitride insulating film 25 (corresponding to P3 in FIG. 40) in a manner similar to that of the sample 2. A sample having such a structure is referred to as a comparative sample 1.

A comparative sample 2 was formed in such a manner that, in the comparative sample 1, the heat treatment was performed at 350° C. after the formation of the oxide semiconductor film 18.

A comparative sample 3 was formed in the following manner. In the comparative sample 1, instead of the oxide semiconductor film 18, the multilayer film including the oxide semiconductor film 18 and the oxide film was formed using the structure and conditions similar to those of the sample 2.

A transistor included in each sample has a channel length (L) of 6 µm and a channel width (W) of 50 µm.

<Vg-Id Characteristics>

Next, initial Vg-Id characteristics of the transistors included in the samples 1 and 2 and the comparative samples 1 and 2 were measured. Here, change in characteristics of current flowing between a source electrode and a drain electrode (hereinafter referred to as the drain current), that is, Vg-Id characteristics were measured under the following conditions: the substrate temperature was 25° C., the potential difference between the source electrode and the drain electrode (hereinafter referred to as the drain voltage) was 1 V or 10 V, and the potential difference between the source electrode and the gate electrode (hereinafter referred to as the gate voltage) were changed from −15 V to +20 V.

Figure 40:
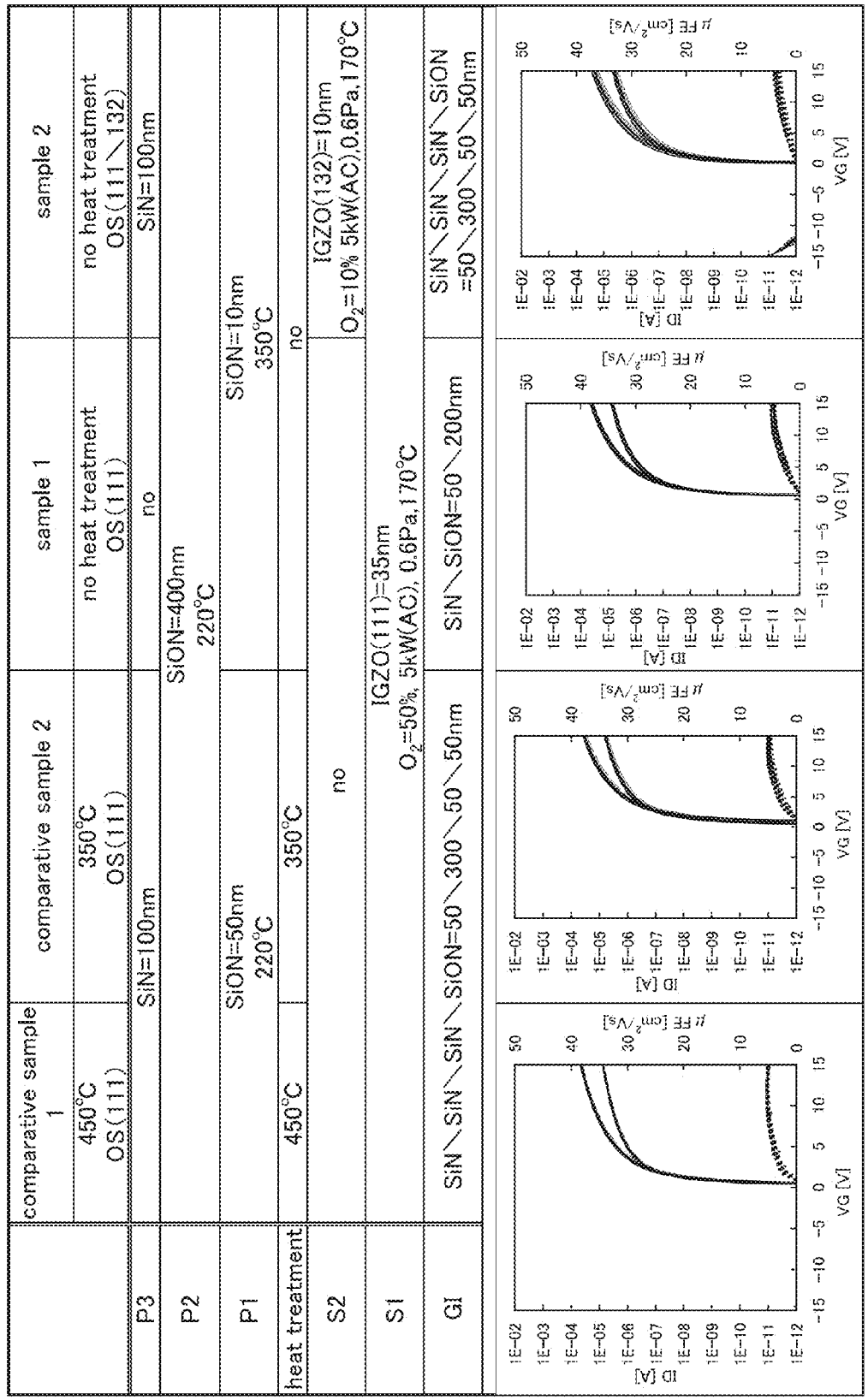
FIG. 40 is a diagram showing Vg-Id characteristics of transistors.

FIG. 40 shows the Vg-Id characteristics of the transistors included in the samples. In each graph shown in FIG. 40, the horizontal axis indicates gate voltage Vg, the left vertical axis indicates drain current Id, and the right vertical axis indicates field-effect mobility. Note that a voltage range of −15 V to 15 V is represented along the horizontal axis. Further, the solid lines indicate the Vg-Id characteristics at the drain voltages Vd of 1 V and 10 V, and the dashed lines indicate the field-effect mobility with respect to the gate voltages at the drain voltage Vd of 10 V. Note that the field effect mobility was obtained by operation of each sample in a saturation region.

Further, in each of the samples, 20 transistors having the same structure were formed on the substrate.

The results in FIG. 40 show that favorable switching characteristics can be obtained in each of the samples 1 and 2 and the comparative samples 1 and 2.

Next, a BT stress test and a BT photostress test were performed on each of the samples 1 and 2 and the comparative samples 1 and 2. The BT stress test is one kind of accelerated test and can evaluate, in a short time, a change in characteristics (i.e., a change with time) of a transistor, which is caused by long-term use. The amount of change in characteristics of the transistor before and after the BT stress test is an important indicator when examining the reliability of the transistor.

<Gate BT Stress Test and Gate BT Photostress Test>

A gate BT stress test and a gate BT photostress test were performed.

A measurement method of the gate BT stress test is described. First, initial Vg-Id characteristics of the transistor were measured as described above.

Next, the substrate temperature was set at a given temperature (hereinafter referred to as stress temperature) and the temperature was kept constant, the pair of electrodes serving as a source electrode and a drain electrode of the transistor were set at a same potential, and the gate electrode was supplied for a certain period of time (hereinafter referred to as stress time) with potential different from that of the pair of electrodes serving as a source electrode and a drain electrode. Next, the substrate temperature was set as appropriate, and the electrical characteristics of the transistor were measured. As a result, a difference in threshold voltage and a difference in shift value between before and after the gate BT stress test can be obtained as the amount of change in the electrical characteristics.

Note that a stress test where negative voltage is applied to a gate electrode is called negative gate BT stress test (Dark −GBT); whereas a stress test where positive voltage is applied is called positive gate BT stress test (Dark +GBT). Note that a stress test where negative voltage is applied to a gate electrode while light emission is performed is called negative gate BT photostress test (Photo −GBT); whereas a stress test where positive voltage is applied while light emission is performed is called positive gate BT photostress test (Photo +GBT).

Here, the gate BT stress conditions were as follows: stress temperature, 60° C.; stress time, 3600 seconds; voltage applied to the gate electrode, −30 V or +30 V; voltage applied to the source electrode, 0 V; and voltage applied to the drain electrode, 0 V. The electric field intensity applied to the gate insulating film was 0.66 MV/cm.

Under conditions similar to those of the above BT stress test, the gate BT photostress test where the transistor is irradiated with white LED light with 10000 lx was performed. Note that the Vg-Id characteristics of the transistor after the BT stress test were measured at a temperature of 60° C.

Figure 41A:
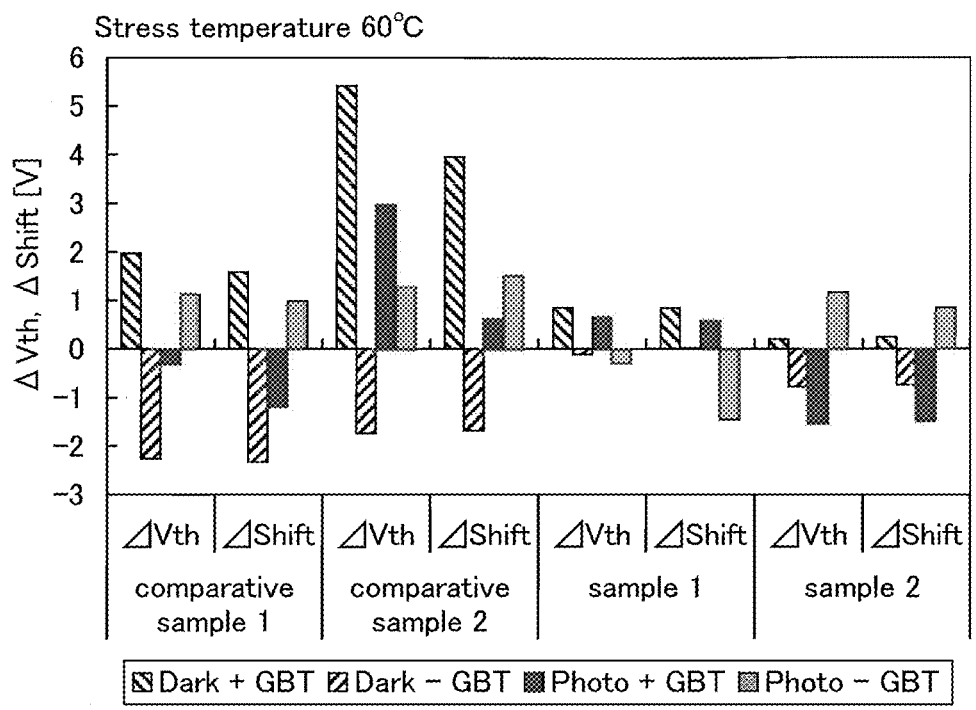
FIGS. 41A and 41B are graphs showing the amounts of change in threshold voltage and shift value of transistors after BT stress tests and after BT photostress tests.

FIG. 41A shows a difference between threshold voltage in the initial characteristics and threshold voltage after the BT stress test (i.e., the amount of change in threshold voltage ($\Delta$Vth)) and a difference in shift value (i.e. the amount of change in shift value ($\Delta$Shift)) of each of the transistors included in the samples 1 and 2 and the comparative samples 1 and 2. FIG. 41A shows the amounts of change due to the positive gate BT stress test (Dark +GBT), the negative gate BT stress test (Dark −GBT), the positive gate BT photostress test (Photo +GBT), and the negative gate BT photostress test (Photo −GBT).

Next, the stress temperature of a stress test was changed. Performed here is a gate BT stress test where the stress temperature was changed to 125° C. in the conditions of the above-described gate BT stress test. Note that the Vg-Id characteristics of the transistor after the gate BT stress test were measured at a temperature of 40° C.

Figure 41B:
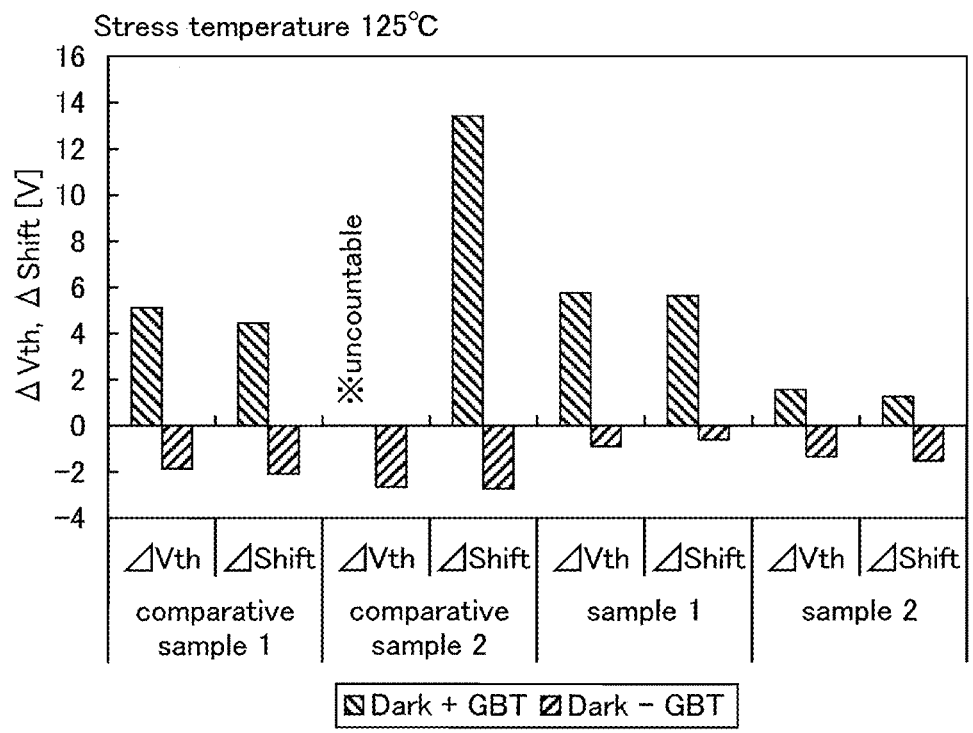

FIG. 41B shows the amounts of change in threshold voltage ($\Delta$Vth) and the amounts of change in shift value ($\Delta$Shift) of the samples 1 and 2 and the comparative samples 1 and 2. In FIG. 41B, the amounts of change by a positive gate BT stress test (Dark +GBT) and a negative gate BT stress test (Dark −GBT) are shown.

Here, a threshold voltage and a shift value in this specification are described with reference to FIGS. 42A and 42B.

Figure 42A:
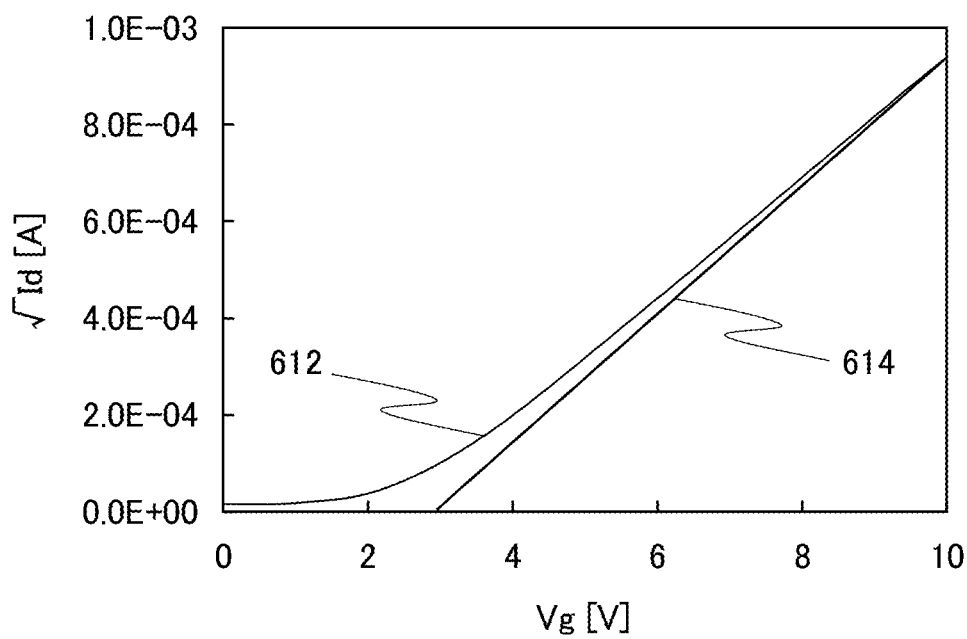
FIGS. 42A and 42B illustrate the definition of a threshold voltage and a shift value.

In this specification, in a curve 612 where the horizontal axis and the vertical axis indicate the gate voltage (Vg [V]) and the square root of drain current ($Id^{1/2}$ [A]), respectively, the threshold voltage (Vth) is defined as a gate voltage at a point of intersection of an extrapolated tangent line 614 of $Id^{1/2}$ having the highest inclination with the Vg axis (i.e., $Id^{1/2}$ of 0 A) (see FIG. 42A). Note that in this specification, threshold voltage is calculated with a drain voltage Vd of 10 V. Further, in this specification, threshold voltage (Vth) refers to an average value of Vth of 20 transistors included in each sample.

Figure 42B:
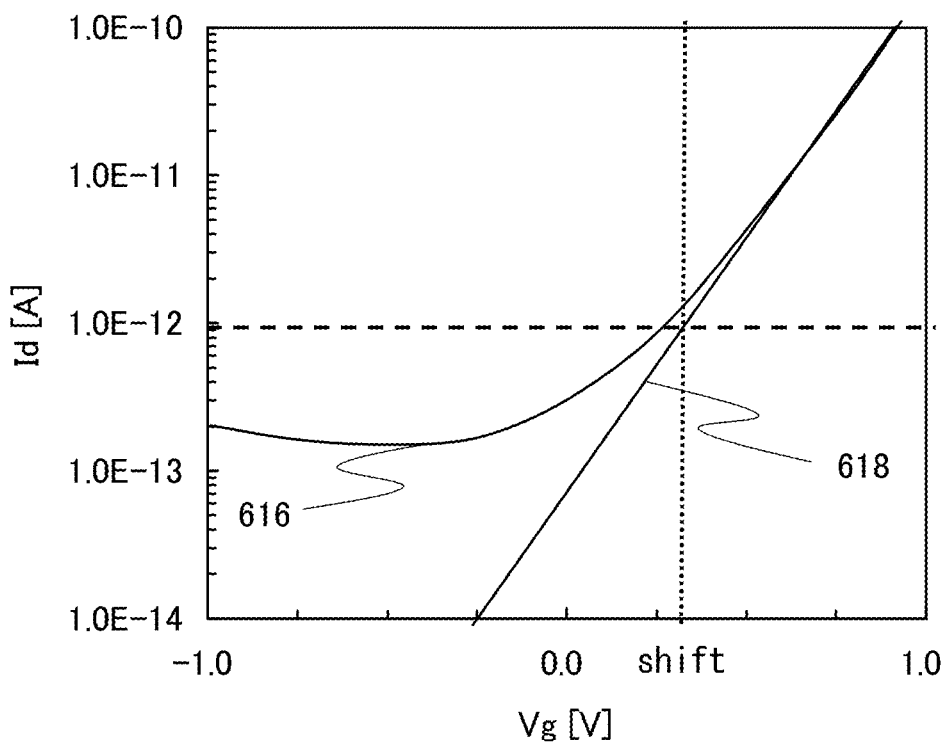

In this specification, in a curve 616 where the horizontal axis and the vertical axis indicate the gate voltage (Vg [V]) and the logarithm of drain current (Id [A]), respectively, the shift value (Shift) is defined as a gate voltage at a point of intersection of an extrapolated tangent line 618 of Id having the highest inclination with a straight line of $Id=1.0\times10^{-12}$ [A] (see FIG. 42B). Note that in this specification, a shift value is calculated with a drain voltage Vd of 10 V. Further, in this specification, the shift value refers to an average value of shift values of 20 transistors included in each sample.

It is shown from FIG. 41A that the amount of change in each of the samples 1 and 2 due to the positive gate BT stress test (Dark+GBT) and the negative gate BT stress test (Dark −GBT) is smaller than that of each of the comparative samples 1 and 2 in the case where the stress temperature is 60° C.

It is shown from FIG. 41B that the amount of change in each of the samples 1 and 2 due to the positive gate BT stress test (Dark+GBT) and the negative gate BT stress test (Dark −GBT) is smaller than that of each of the comparative samples 1 and 2 in the case where the stress temperature is 120° C.

The above results show that, when the oxide insulating film is formed over the oxide semiconductor film or the multilayer film at a temperature of higher than or equal to 280° C. and lower than or equal to 400° C., the impurity can be released from the oxide semiconductor film or the multilayer film without performing heat treatment after the oxide semiconductor film or the multilayer film is formed. Thus, the amount of change in transistor characteristics can be reduced.

Figure 43A:
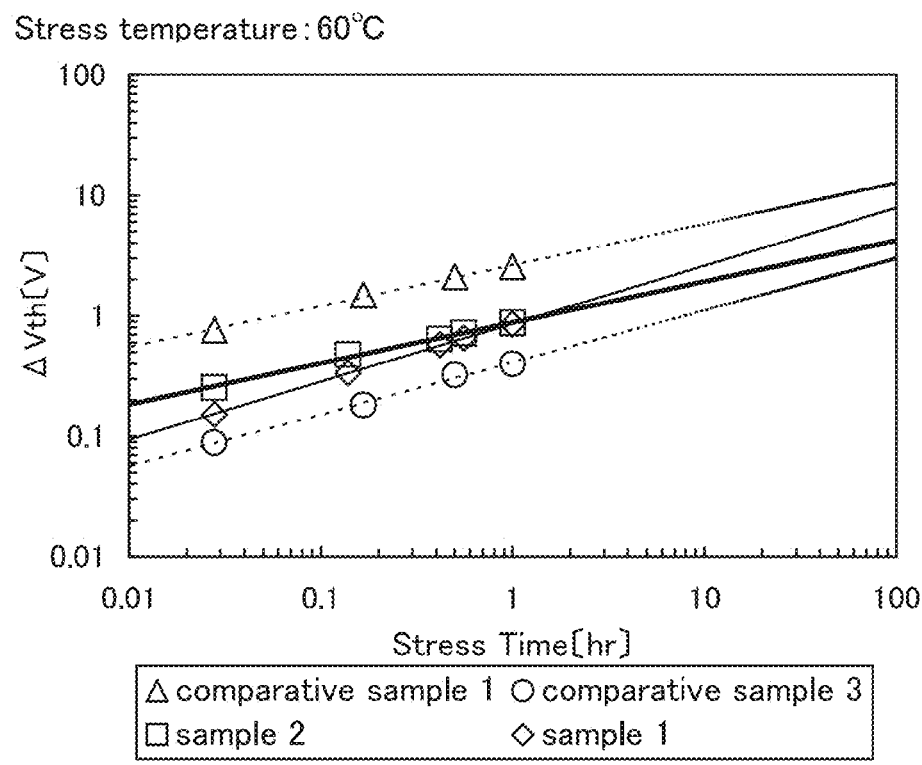
FIGS. 43A and 43B show BT stress test results.
Figure 43B:
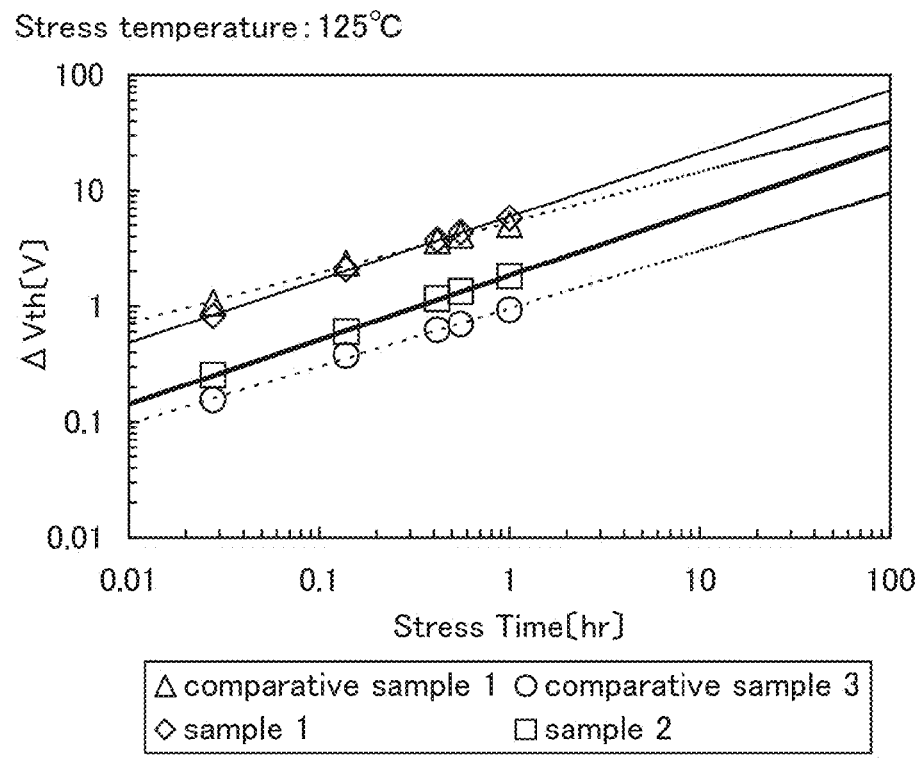

Further, a positive gate BT stress test (Dark+GBT) was performed on the samples 1 and 2 and the comparative samples 1 and 3. Here, the stress temperature was set to 60° C. or 125° C. and the stress time was set to 100 seconds, 500 seconds, 1500 seconds, 2000 seconds, and 3600 seconds to measure the amount of change in threshold voltage. FIGS. 43A and 43B show the amounts of change in threshold voltage in each stress time and an approximate line obtained from the amounts of change. The horizontal axis indicates stress time and the vertical axis indicates the amount of change in threshold voltage (ΔVth). FIG. 43A shows the measurement results when the stress temperature is 60° C. FIG. 43B shows the measurement results when the stress temperature is 125° C.

It is shown from FIG. 43A that the amount of change in threshold voltage of each of the samples 1 and 2 is smaller than that of the comparative sample 1. These results show that, when the oxide insulating film is formed over the oxide semiconductor film or the multilayer film at a temperature of higher than or equal to 280° C. and lower than or equal to 400° C., the amount of change in transistor characteristics can be reduced without performing heat treatment after the oxide semiconductor film or the multilayer film is formed.

Further, it is shown from FIGS. 43A and 43B that the amounts of change in transistor characteristics of the samples 1 and 2 are larger than, but substantially equal to, that of the comparative sample 3.

EXAMPLE 2

Example 2 describes the amounts of water and oxygen released from the oxide insulating film 23 and the oxide insulating film 24 in Embodiment 1 and the amount of defects in the films.

First, samples each including an oxide insulating film were measured by TDS to evaluate the amounts of released water and oxygen.

First of all, a process for manufacturing the samples is described.

A silicon oxynitride film was formed on a silicon wafer by a plasma CVD method using the conditions for forming the oxide insulating film 23 described in Embodiment 1. The sample is referred to as a sample 3. Note that the thickness of the silicon oxynitride film included in the sample 3 was 100 nm.

The silicon oxynitride film included in the sample 3 was formed under the following conditions: silane with a flow rate of 20 sccm and dinitrogen monoxide with a flow rate of 3000 sccm were supplied to the treatment chamber of the plasma CVD apparatus as the source gas; the pressure in the treatment chamber was controlled to 200 Pa; the substrate temperature was 350° C.; and a power of 100 W was supplied with the use of a 27.12 MHz high-frequency power source.

Another sample was formed in such a manner that a silicon oxynitride film was formed on a silicon wafer by a plasma CVD method using the conditions for forming the oxide insulating film 24 described in Embodiment 1. The sample is referred to as a sample 4. Note that the thickness of the silicon oxynitride film included in the sample 4 was 400 nm.

The silicon oxynitride film included in the sample 4 was formed by a plasma CVD method under the following conditions: silane with a flow rate of 160 sccm and dinitrogen monoxide with a flow rate of 4000 sccm were used as a source gas; the pressure in the treatment chamber was 200 Pa; the substrate temperature was 220° C.; and a high-frequency power of 1500 W was supplied to the parallel-plate electrodes. Under the above conditions, it is possible to form a silicon oxynitride film which contains oxygen at a higher proportion than the stoichiometric composition and from which part of oxygen is released by heating.

Another sample was formed in such a manner that a silicon oxynitride film was formed on a silicon wafer by a plasma CVD method using conditions where the film formation pressure and the film formation temperature are lower than those for the sample 3. The sample is referred to as a comparative sample 4. Note that the thickness of the silicon oxynitride film included in the comparative sample 4 was 400 nm.

The silicon oxynitride film included in the comparative sample 4 was formed under the following conditions: silane with a flow rate of 30 sccm and dinitrogen monoxide with a flow rate of 4000 sccm were supplied to the treatment chamber of the plasma CVD apparatus as the source gas; the pressure in the treatment chamber was controlled to 40 Pa; the substrate temperature was 220° C.; and a power of 150 W was supplied with the use of a 27.12 MHz high-frequency power source.

<TDS Measurement>

Figure 44:
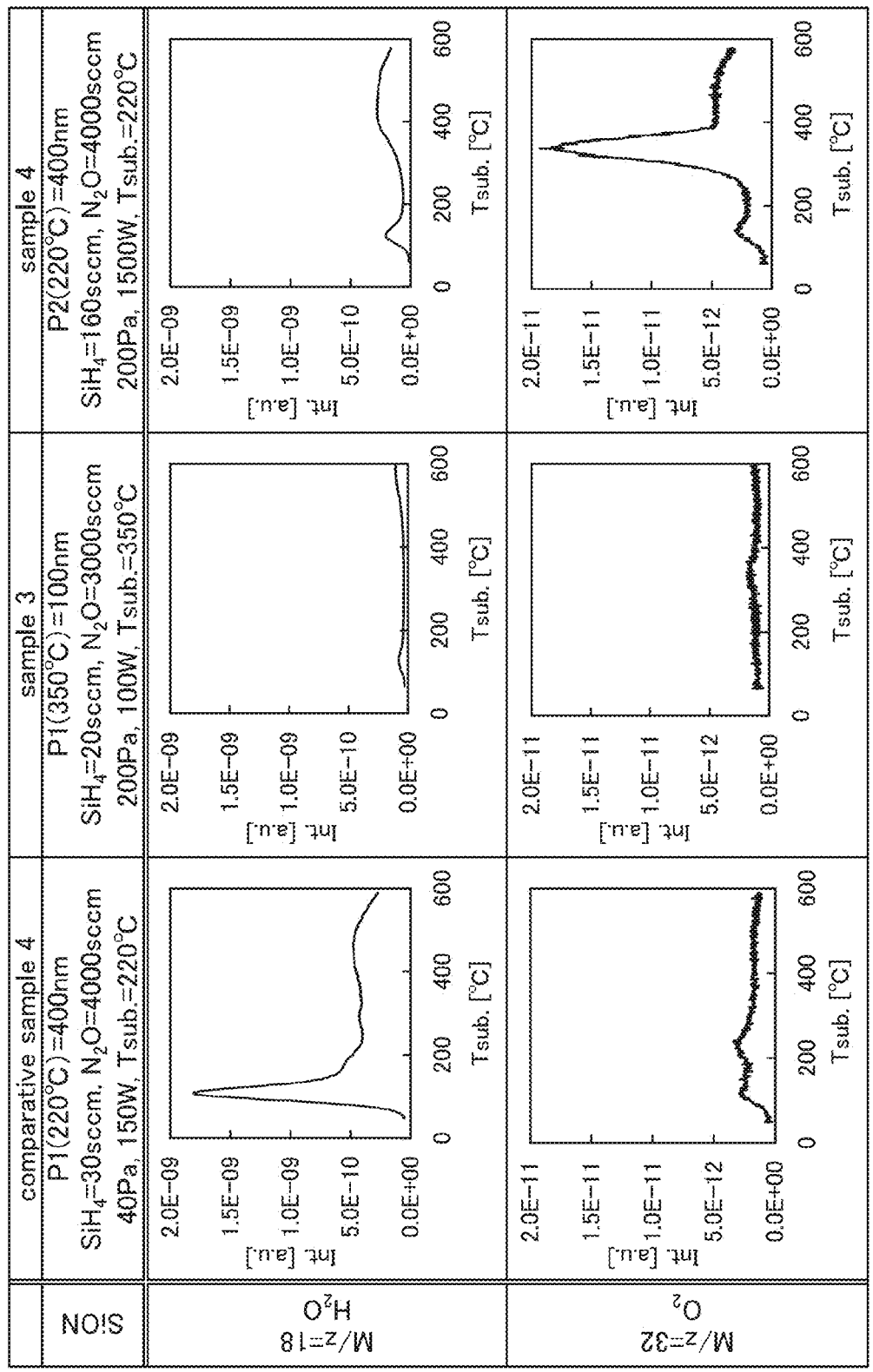
FIG. 44 is a diagram showing TDS measurement results.

FIG. 44 shows the results of TDS measurement performed on the samples 3 and 4 and the comparative sample 4. Shown in the upper part of FIG. 44 are measurement results indicating the amount of released water molecules. Shown in the lower part of FIG. 44 are measurement results indicating the amount of released oxygen molecules.

As shown in the upper part of FIG. 44, a peak of M/z=18 corresponding to the mass number of a water molecule is observed in the comparative sample 4. Further, peak intensities in the vicinity of substrate temperatures from 50° C. to 150° C. of the samples 3 and 4 are lower than those of the comparative sample 4. Thus, the amount of water is small in each of the films formed using the conditions for forming the oxide insulating film 23 and the oxide insulating film 24 in Embodiment 1.

As shown in the lower part of FIG. 44, a peak of M/z=32 corresponding to the mass number of an oxygen molecule is observed in the sample 4. Further, peak intensities in the vicinity of substrate temperatures from 300° C. to 400° C. of the sample 3 and the comparative sample 4 are lower than those of the sample 4. Thus, the amount of water is small in the film formed using the conditions for forming the oxide insulating film 24 in Embodiment 1.

Next, description is made on the results of measuring, by electron spin resonance (ESR), the amounts of defects in the oxide insulating films included in the samples 3 and 4 and the comparative sample 4.

First, the structures of evaluated samples are described.

A sample 5 was formed in such a manner that the silicon oxynitride film included in the sample 3 was formed over a quartz substrate. Note that the thickness of the silicon oxynitride film included in the sample 5 was 100 nm.

A sample 6 was formed in such a manner that the silicon oxynitride film included in the sample 4 was formed over a quartz substrate. Note that the thickness of the silicon oxynitride film included in the sample 6 was 400 nm.

A comparative sample 5 was formed in such a manner that the silicon oxynitride film included in the comparative sample 4 was formed over a quartz substrate. Note that the thickness of the silicon oxynitride film included in the comparative sample 5 was 400 nm.

<ESR Measurement>

Next, ESR measurement was performed on the samples 5 and 6 and the comparative sample 5. In the ESR measurement performed at a predetermined temperature, a value of a magnetic field ($H_0$) where a microwave is absorbed is used for an equation $g=hv/\beta H_0$, so that a parameter of a g-factor can be obtained. Note that v represents the frequency of the microwave. Note that h and β represent the Planck constant and the Bohr magneton, respectively, and are both constants.

Here, the ESR measurement was performed under the following conditions. The measurement temperature was −170° C., the high-frequency power (power of microwaves) of 8.92 GHz was 1 mW, and the direction of a magnetic field was parallel to a surface of each sample. Note that the lower limit of the detection of the spin density of a signal which appears at g (g-factor)=2 due to a dangling bond of silicon was $1.1 \times 10^{11}$ spins. The smaller the number of spins is, the fewer the defects that are dangling bonds of silicon.

Figure 45:
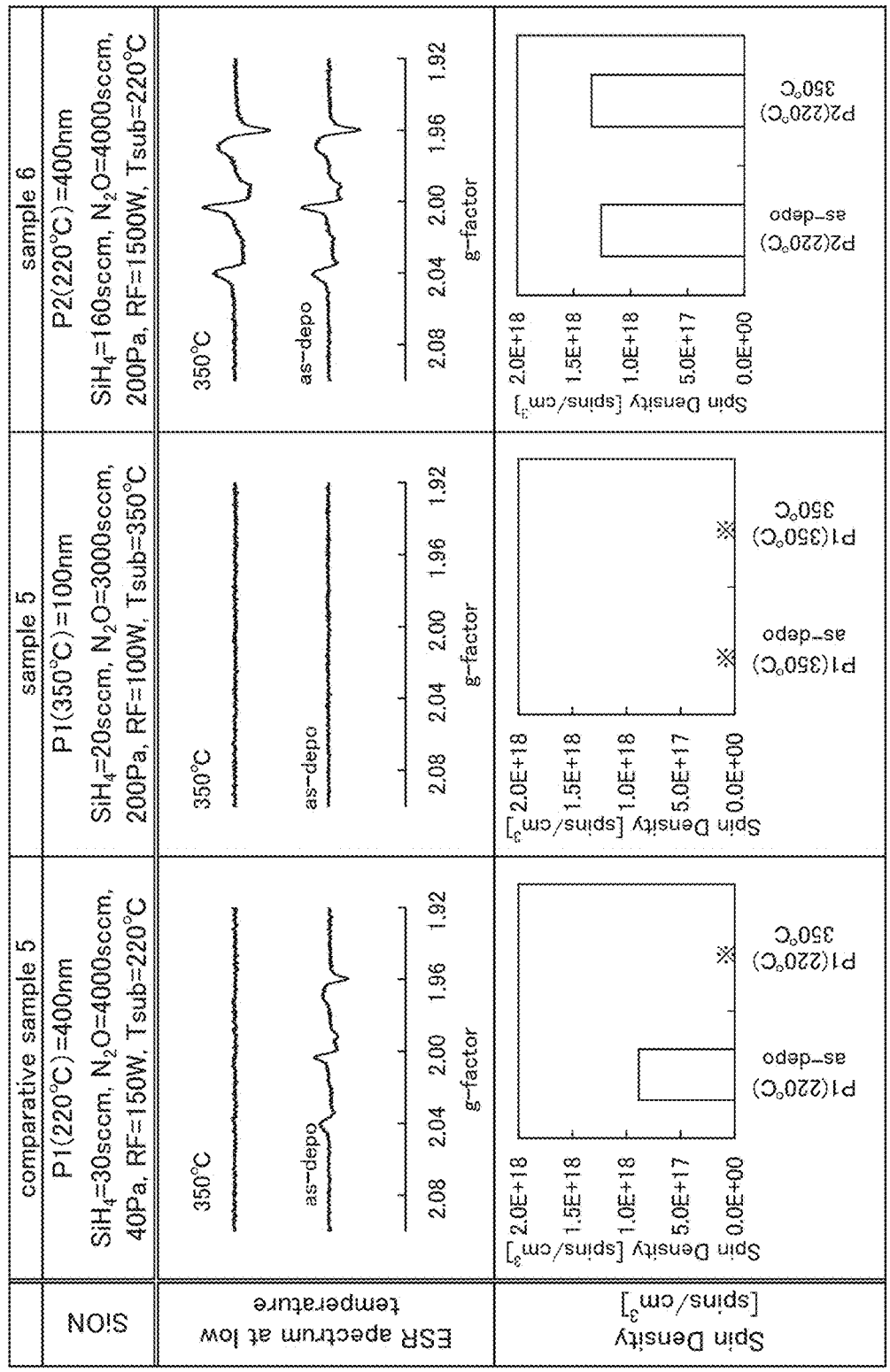
FIG. 45 is a diagram showing ESR measurement results.

First derivative curves obtained by performing ESR measurement on the samples are shown in the upper part of FIG. 45. The spin densities of signals which appear at g (g-factor)=2 due to dangling bonds of silicon in the samples are shown in the lower part of FIG. 45. Note that shown here is spin density obtained by converting the number of measured spins into that per unit volume.

Note that here, ESR measurement was performed on the sample before and after heat treatment to determine change in the amount of defects due to heat treatment. In FIG. 45, "as-depo" is written beside the result of measurement before heat treatment, and "350° C." is written beside the result of measurement after heat treatment at 350° C.

As shown in the upper part of FIG. 45, in the silicon oxynitride film included in the sample 5, a signal having symmetry is not detected at a g-factor of 2 before and after the heat treatment. Thus, it is shown that, in the silicon oxynitride film included in the sample 5, the amount of defects is extremely low or no defect is included.

In the silicon oxynitride film included in each of the sample 6 and the comparative sample 5, a signal having symmetry is detected at a g-factor of 2 before the heat treatment. Thus, it is revealed that a defect is contained in the silicon oxynitride film included in each of the sample 6 and the comparative sample 5. In the sample 6, a signal having symmetry is detected at a g-factor of 2 after the heat treatment, but in the comparative sample 5, a signal having symmetry is not detected at a g-factor of 2 after the heat treatment. Thus, in the comparative sample 5, the amount of defects in the film is reduced or no defect is included owing to the heat treatment.

The above results show that the oxide insulating film with few defects can be formed using the conditions for forming the oxide insulating film 23 described in Embodiment 1.

EXAMPLE 3

Example 3 describes the relation between the film formation temperature of the oxide insulating film 23 described in Example 1 and the concentration of hydrogen contained in the oxide semiconductor film and the oxide insulating film. In this example, hydrogen concentration was measured by SIMS measurement performed on a sample in which the oxide semiconductor film and the oxide insulating film were stacked.

First of all, a process for manufacturing the sample is described.

A 100-nm-thick oxide semiconductor film (corresponding to OS in FIG. 46) was formed over a quartz substrate by a sputtering method. Next, heat treatment was performed.

Here, an oxide semiconductor film was formed using conditions similar to those for the oxide semiconductor film included in the sample 1 in Example 1. Further, after performing heat treatment at 350° C. in a nitrogen atmosphere for one hour, heat treatment was performed at 350° C. in an atmosphere containing nitrogen and oxygen for one hour.

Next, a 20-nm-thick silicon oxynitride film (corresponding to P1 in FIG. 46) was formed over the oxide semiconductor film using the conditions for forming the oxide insulating film 23 described in Embodiment 1, and after that, a 200-nm-thick silicon oxynitride film (corresponding to P2 in FIG. 46) was formed under the conditions for forming the oxide insulating film 24 described in Embodiment 1.

Here, silicon oxynitride (P1) was formed under conditions similar to those for the oxide insulating film 23 included in the sample 1 described in Example 1. Silicon oxynitride (P2) was formed under conditions similar to those for the oxide insulating film 23 included in the sample 1 described in Example 1. The sample is referred to as a sample 7.

Further, a comparative sample 6 was formed in the following manner: in the heat treatment performed after the formation of the oxide semiconductor film (corresponding to OS in FIG. 46) of the sample 7, the heat treatment temperature was set to 450° C.; and a 50-nm-thick silicon oxynitride film (corresponding to P1 in FIG. 46) was formed over the oxide semiconductor film under conditions where the film formation pressure and the film formation temperature were lower than those for the sample 7.

The silicon oxynitride film (P1) included in the comparative sample 6 was formed using conditions similar to those for the silicon oxynitride film included in the comparative sample 4.

Further, a comparative sample 7 was formed in such a manner that, in the heat treatment performed after the formation of the oxide semiconductor film (corresponding to OS in FIG. 46) of the comparative sample 6, the heat treatment temperature was set to 350° C.

<SIMS Measurement>

Next, SIMS measurement was performed on the sample 7 and the comparative samples 6 and 7 to measure the hydrogen concentrations contained in the oxide semiconductor film (OS) and the silicon oxynitride film (P1). The hydrogen concentration in the oxide semiconductor film (OS) in each of the samples is shown in the upper part of FIG. 46. The hydrogen concentration in the silicon oxynitride film (P1) in each of the samples is shown in the lower part of FIG. 46.

Figure 46:
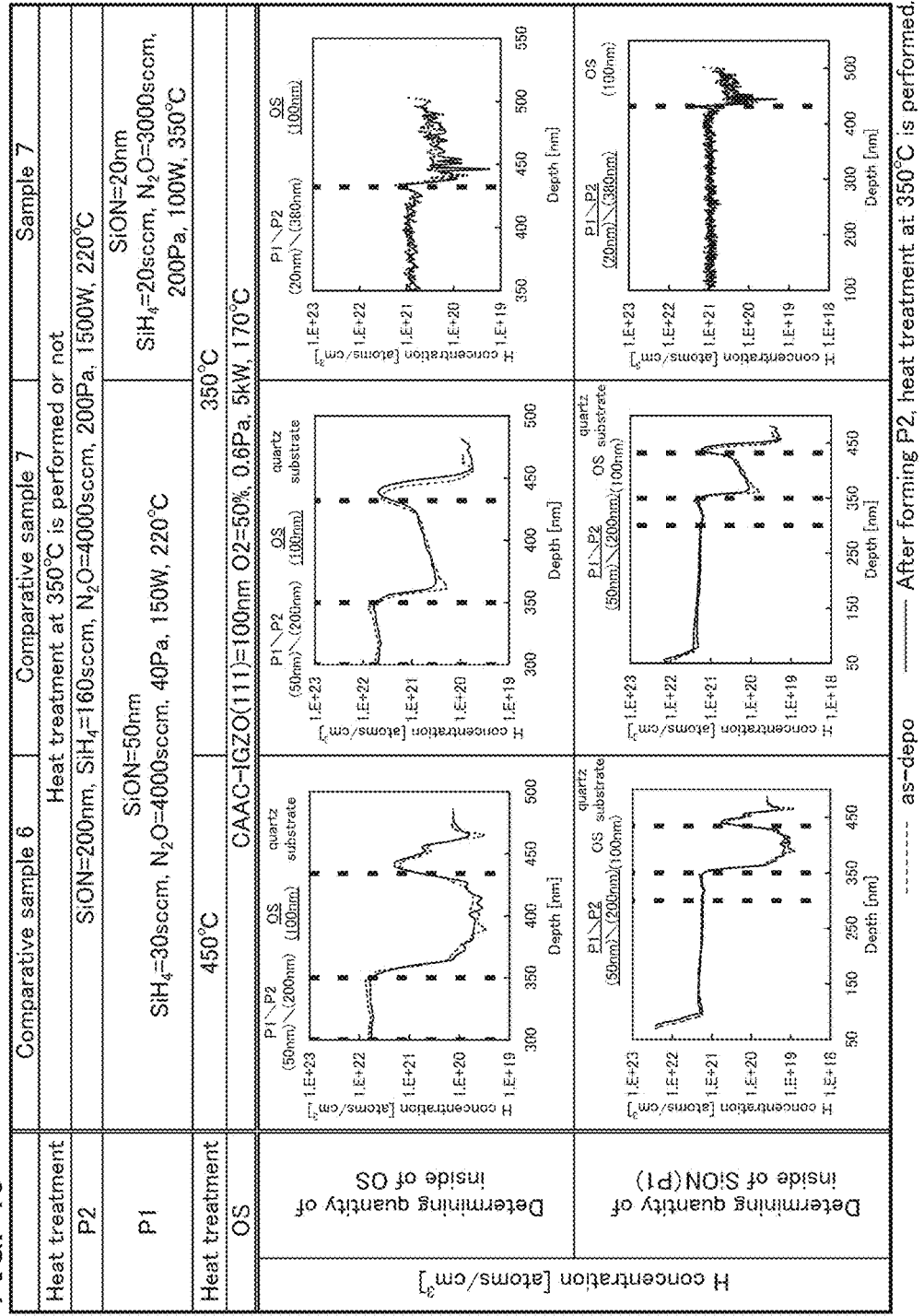
FIG. 46 is a diagram showing SIMS measurement results.

Note that here, SIMS measurement was performed on the sample before and after heat treatment to determine change in hydrogen concentration due to heat treatment. In FIG. 46, a dashed line indicates the result of measurement before heat treatment, and a solid line indicates the result of measurement after heat treatment at 350° C.

First, the hydrogen concentrations in the oxide semiconductor films (OS) are compared. The hydrogen concentrations of the sample 7 and the comparative sample 7 which were heated at 350° C. in the heat treatment after the formation of the oxide semiconductor films (OS) are higher than hydrogen concentration of the comparative sample 6. However, when compared with the comparative sample 7, the sample 7 has a low hydrogen concentration in the oxide semiconductor film, particularly in a region of the oxide semiconductor film on the silicon oxynitride film (P1) side. Further, it is shown that the hydrogen concentration is reduced by performing heat treatment after the formation of the silicon oxynitride film (P2).

Thus, by using the conditions for forming the oxide insulating film 23 described in Embodiment 1 in a manner similar to that of the silicon oxynitride film (P1) included in the sample 7, a dense silicon oxynitride film is formed, and a hydrogen blocking effect is obtained. As a result, hydrogen contained in the silicon oxynitride film (P2) is less likely to be moved to the oxide semiconductor film even when heat treatment is performed after the formation of the silicon oxynitride film (P2).

Next, the hydrogen concentrations in the silicon oxynitride films (P1) are compared. The hydrogen concentration of the sample 7 is lower than the hydrogen concentrations of the comparative samples 6 and 7. Thus, by using the conditions for forming the oxide insulating film 23 described in Embodiment 1, a silicon oxynitride film with a low hydrogen concentration can be formed.

These results show that, when the oxide insulating film is formed over the oxide semiconductor film using the conditions for forming the oxide insulating film 23 described in Embodiment 1, the hydrogen concentration in the oxide semiconductor film can be reduced and an oxide insulating film with a low hydrogen concentration can be formed without performing heat treatment after the oxide semiconductor film is formed. As a result, generation of carriers in the oxide semiconductor film can be reduced, and a transistor having excellent electrical characteristics in which the threshold voltage is less changed can be manufactured.

Next, in a sample in which the oxide insulating film 23 described in Embodiment 1 is formed without performing heat treatment after the formation of the oxide semiconductor film (OS), the hydrogen concentrations in the oxide semiconductor film and the oxide insulating film was measured. The results of the measurement are described below.

First of all, a process for manufacturing the sample is described.

After a 200-nm-thick silicon oxynitride film (SiON) was formed on a silicon wafer, a 100-nm-thick oxide semiconductor film (OS) was formed over the silicon oxynitride film (SiON) by a sputtering method.

Here, a silicon oxynitride film (SiON) was formed under conditions similar to those for the gate insulating film 17 included in the sample 1 in Example 1. Further, an oxide semiconductor film (OS) was formed under conditions similar to those for the oxide semiconductor film (S1) included in the sample 1 in Example 1.

Next, a 50-nm-thick silicon oxynitride film (P1) was formed under the conditions for forming the oxide insulating film 23 in Embodiment 1 without performing heat treatment, and then, a 400-nm-thick silicon oxynitride film (P2) was formed under the conditions for forming the oxide insulating film 24 in Embodiment 1.

Here, a silicon oxynitride film (P1) was formed under conditions similar to those for the oxide insulating film 23 included in the sample 1 in Example 1. Further, a silicon oxynitride film (P2) was formed under conditions similar to those for the oxide insulating film 24 included in the sample 1 in Example 1 (i.e. the film formation temperature was 350° C.).

Through the above process, the sample 8 was formed.

A comparative sample 8 was formed in such a manner that, instead of the silicon oxynitride film (P1) in the sample 8, a silicon oxynitride film (P1) was formed under conditions similar to those for forming the silicon oxynitride film included in the comparative sample 4 in Example 2 (i.e., the film formation temperature was 220° C.).

<SIMS Measurement>

Next, SIMS measurement was performed on the sample 8 and the comparative sample 8 to measure the hydrogen concentrations in the oxide semiconductor film (OS) and the silicon oxynitride film (P1).

Further, SIMS measurement was performed on the sample 8 and the comparative sample 8 after heat treatment was performed at 350° C. in an atmosphere containing nitrogen and oxygen for one hour.

Figure 50A:
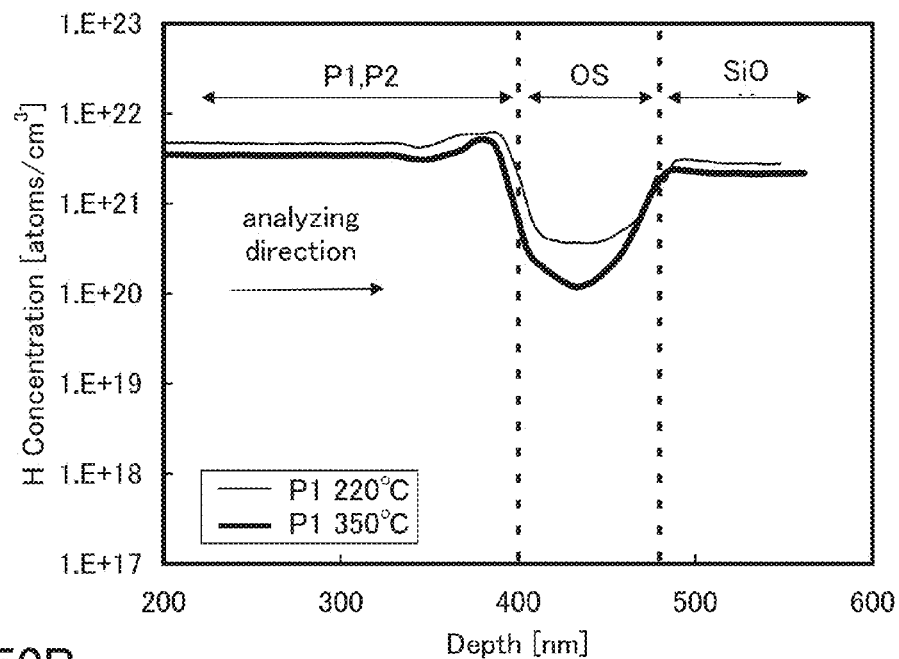
FIGS. 50A and 50B show SIMS measurement results.
Figure 50B:
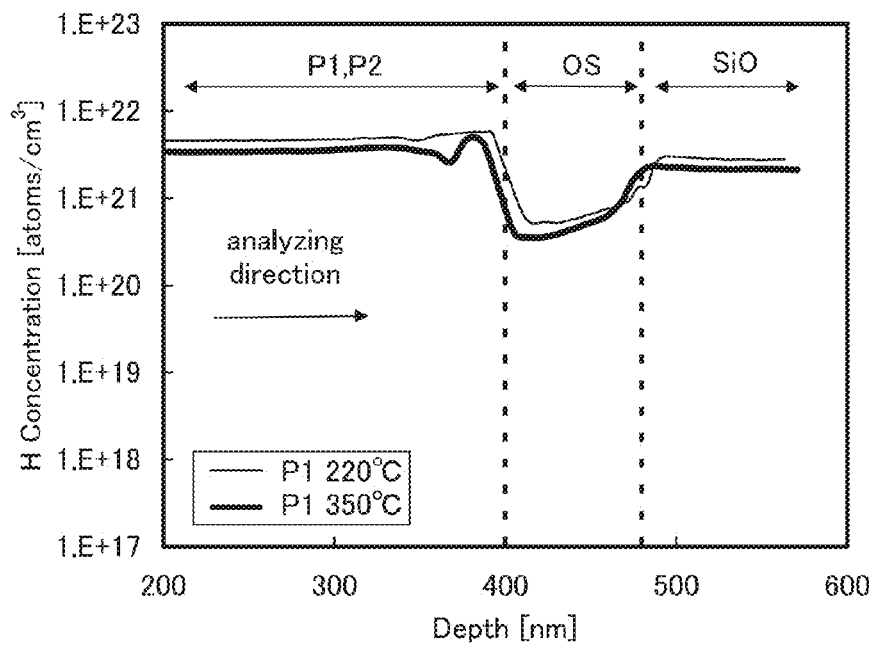
Figure 51A:
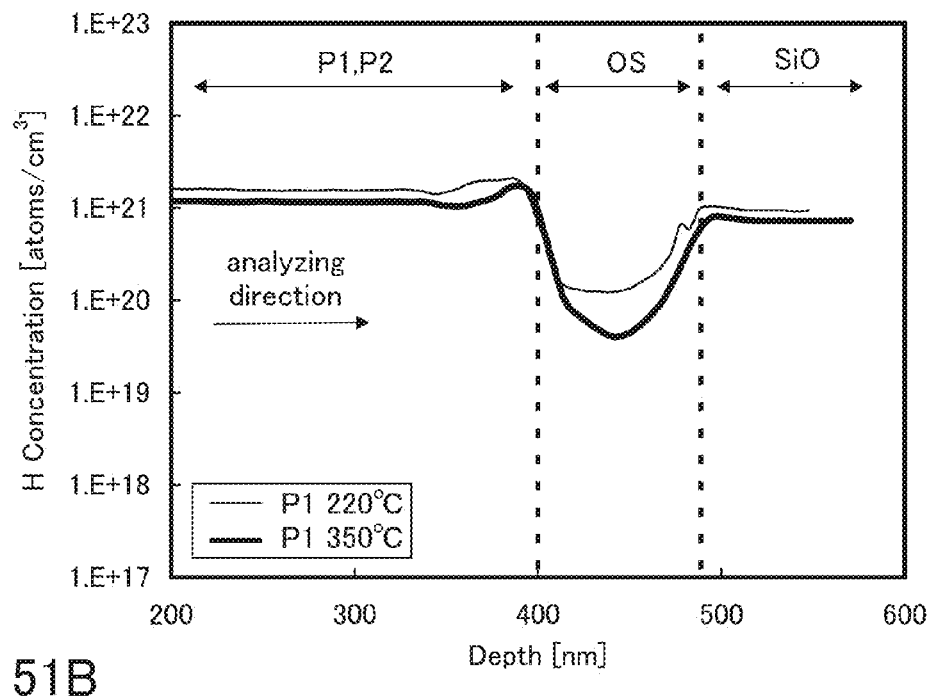
FIGS. 51A and 51B show SIMS measurement results.
Figure 51B:
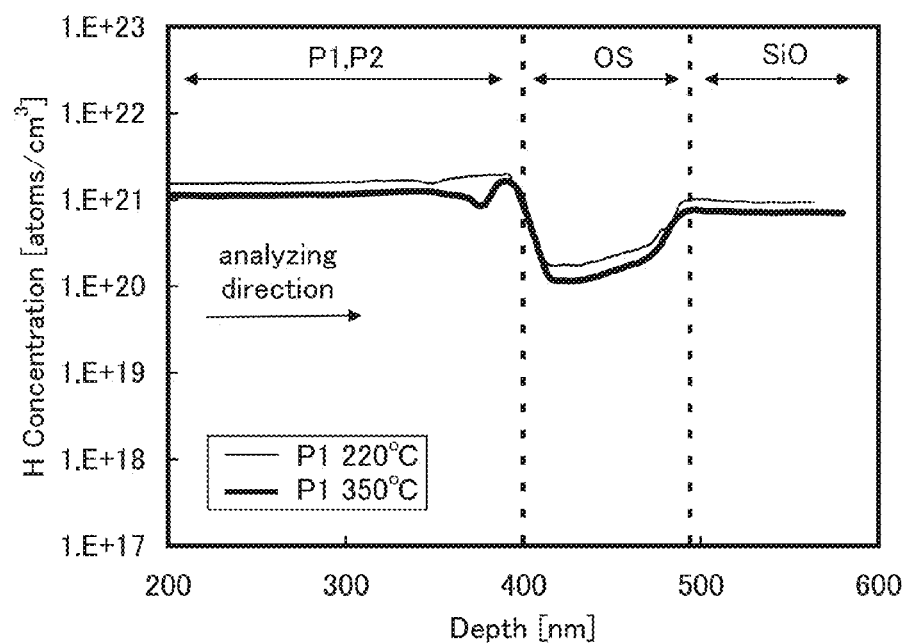

FIGS. 50A and 50B show comparison between the H concentrations before and after heat treatment in the oxide semiconductor films (OS) of the sample 8 and the comparative sample 8. FIGS. 51A and 51B show comparison between H concentrations before and after heat treatment in the silicon oxynitride films (P1) of the sample 8 and the comparative sample 8. In FIGS. 50A and 51A, the H concentrations in the sample 8 and the comparative sample 8 before heat treatment are shown. In FIGS. 50B and 51B, the H concentrations in the sample 8 and the comparative sample 8 after heat treatment are shown. Note that in FIGS. 50A and 50B and FIGS. 51A and 51B, thick solid lines indicate measurement results of the sample 8, and thin solid lines indicate measurement results of the comparative sample 8.

It is shown from FIGS. 50A and 50B that, in the oxide semiconductor film (OS), hydrogen concentration of the sample 8 whose silicon oxynitride film (P1) was formed at 350° C. is lower than that of the comparative sample 8 whose silicon oxynitride film (P1) was formed at 220° C.

It is shown from FIGS. 51A and 51B that, in the silicon oxynitride film (P1), hydrogen concentration of the sample 8 whose silicon oxynitride film (P1) was formed at 350° C. is lower than that of the comparative sample 8 whose silicon oxynitride film (P1) was formed at 220° C.

In terms of the hydrogen concentration, FIGS. 50A and 51A show the same result, and FIGS. 50B and 51B show the same result. That is, the same results can be obtained whether or not heat treatment is performed after the formation of the silicon oxynitride film (P2).

These results show that, when the silicon oxynitride film is formed at 350° C., the hydrogen concentration in the oxide semiconductor film can be reduced without performing heat treatment after the oxide semiconductor film is formed.

EXAMPLE 4

In Example 4, the relation between plasma treatment performed on a surface of the oxide semiconductor film and the hydrogen concentration in the oxide semiconductor film is described with reference to FIGS. 52A and 52B.

First of all, a process for manufacturing a sample is described.

A 35-nm-thick oxide semiconductor film was formed over a quartz substrate by a sputtering method. Next, the oxide semiconductor film was exposed to oxygen plasma generated in a dinitrogen monoxide atmosphere.

The oxide semiconductor film was formed in such a manner that a sputtering target where In:Ga:Zn=1:1:1 (atomic ratio) was used, argon with a flow rate of 100 sccm and oxygen with a flow rate of 100 sccm were supplied as the sputtering gas into a treatment chamber of the sputtering apparatus, the pressure in the treatment chamber was controlled to 0.6 Pa, and a direct-current power of 3 kW was supplied. Note that the oxide semiconductor film was formed at a substrate temperature of 200° C.

Next, oxygen plasma was generated in such a manner that dinitrogen monoxide with a flow rate of 10000 sccm was supplied to the treatment chamber of the plasma CVD apparatus, the pressure in the treatment chamber was controlled to 200 Pa, and a DC power of 150 W was supplied. Further, the oxide semiconductor film was exposed to the oxygen plasma for 300 seconds. The substrate temperature at this time was 350° C.

Through the above process, a sample 9 was formed.

A comparative sample 9 was formed in such a manner that oxygen plasma treatment was not performed in the sample 9.

A comparative sample 10 was formed in such a manner that, instead of the oxygen plasma treatment, heat treatment was performed in a vacuum atmosphere in the sample 9.

In the comparative sample 10, nitrogen with a flow rate of 10000 sccm was supplied to a treatment chamber of a plasma CVD apparatus, the pressure in the treatment chamber was controlled to 175 Pa, the substrate temperature was 350° C., and heat treatment was performed for 600 seconds.

<TDS Measurement>

Next, TDS measurement was performed on the sample 9, the comparative sample 9, and the comparative sample 10. FIGS. 52A and 52B show the measurement results. FIG. 52A is a chart showing the results of TDS measurement performed on the sample 9, the comparative sample 9, and the comparative sample 10. FIG. 52B is a chart where part of FIG. 52A (the range of $2\times10^{-11}$ to $6\times10^{-11}$ on the vertical axis indicating intensity in FIG. 52A) is enlarged. In FIGS. 52A and 52B, thick solid lines indicate TDS measurement results of the sample 9, dashed lines indicate TDS measurement results of the comparative sample 9, and thin solid lines indicate TDS measurement results of the comparative sample 10. In FIGS. 52A and 52B, the vertical axis represents intensity corresponding to the amount of released water, and the horizontal axis represents heat treatment temperature.

Figure 52A:
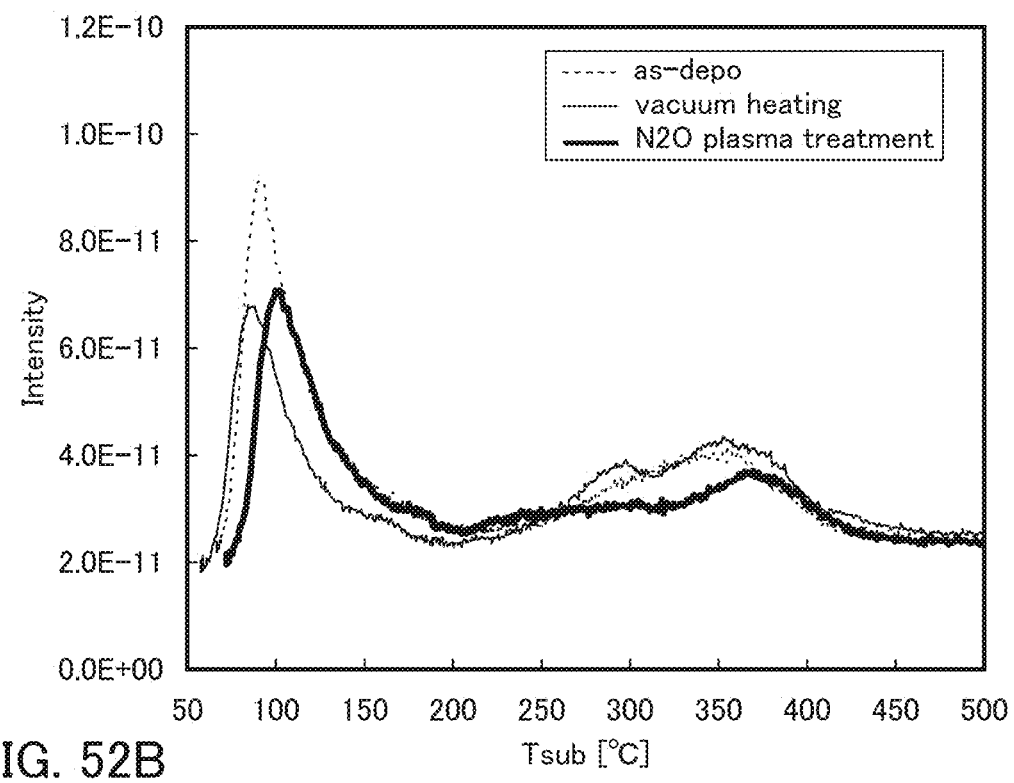
FIGS. 52A and 52B show TDS measurement results.
Figure 52B:
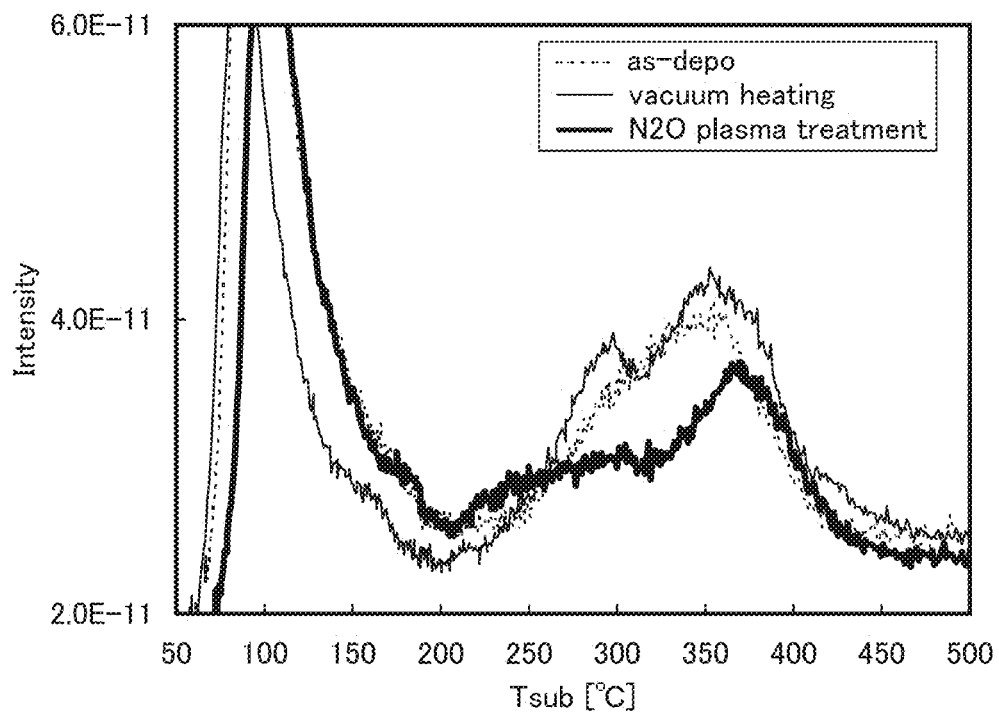

It is shown from FIGS. 52A and 52B that, at a temperature of 100° C. and at temperatures from 250° C. to 370° C., the amount of water released from the sample 9 is smaller than that released from the comparative sample 9. It is also shown that, at temperatures from 250° C. to 400° C., the amount of water released from the sample 9 is smaller than that released from the comparative sample 10.

Thus, when the oxide semiconductor film is exposed to oxygen plasma generated in a dinitrogen monoxide atmosphere, the amount of water released from the oxide semiconductor film can be reduced. This is probably because, by exposure of the oxide semiconductor film to oxygen plasma generated in a dinitrogen monoxide, hydrogen contained in the oxide semiconductor film reacts with oxygen in the oxygen plasma, and thus, water is formed and released.

EXAMPLE 5

Example 5 describes the relation between whether or not plasma treatment is performed on the surface of the oxide semiconductor film and the Vg-Id characteristics of the transistor.

First of all, a manufacturing process of a transistor included in a sample 10 is described. In this example, the process is described with reference to FIGS. 2A to 2D and Example 1.

As shown in FIG. 2A, a glass substrate was used as the substrate 11, and the gate electrode 15 was formed over the substrate 11 under conditions similar to those for the sample 1 in Example 1.

Next, the gate insulating film 17 was formed over the gate electrode 15 under conditions similar to those for the sample 2 in Example 1.

Next, the oxide semiconductor film 18 was formed to overlap with the gate electrode 15 with the gate insulating film 17 provided therebetween.

Here, a 35-nm-thick oxide semiconductor film was formed over the gate insulating film 17 by a sputtering method. Then, a mask was formed over the oxide semiconductor film by a photolithography process, and the oxide semiconductor film was partly etched using the mask to form the oxide semiconductor film 18.

Note that the oxide semiconductor film was formed under the following conditions: a sputtering target where In:Ga:Zn=1:1:1 (atomic ratio) was used; argon with a flow rate of 60 sccm and oxygen with a flow rate of 140 sccm were supplied as a sputtering gas into the treatment chamber of the sputtering apparatus; the pressure in the treatment chamber was controlled to 0.6 Pa; and a direct-current power of 3 kW was supplied. Note that the oxide semiconductor film was formed at a substrate temperature of 200° C.

For the structure obtained through the steps up to here, FIG. 2B can be referred to.

Next, the gate electrode was exposed by partly etching the gate insulating film 17 (not illustrated). Then, as shown in FIG. 2C, the pair of electrodes 21 and 22 in contact with the oxide semiconductor film 18 was formed under conditions similar to those for the sample 1 in Example 1. After that, a surface of the oxide semiconductor film was subjected to cleaning treatment using a phosphoric acid solution in which 85% phosphoric acid was diluted by 100 times.

Next, without exposure of the oxide semiconductor film 18 to oxygen plasma, the oxide insulating film 23 and the oxide insulating film 24 were formed over the oxide semiconductor film 18 and the pair of electrodes 21 and 22 in a manner similar to that of the sample 1 in Example 1.

Next, heat treatment was performed under conditions similar to those for the sample 1 in Example 1 to release water, nitrogen, hydrogen, or the like from the oxide insulating film 23 and the oxide insulating film 24 and supply part of oxygen contained in the oxide insulating film 24 to the oxide semiconductor film 18.

Next, the nitride insulating film 25 was formed under conditions similar to those for the sample 2 in Example 1 (see FIG. 2D).

Next, with the use of conditions similar to those for the sample 1 in Example 1, the following were performed: formation of the opening for exposing part of the pair of electrodes 21 and 22; formation of the planarization film; formation of the conductive film connected to part of the pair of electrodes; and heat treatment. Thus, the sample 10 having a transistor was formed.

A sample 11 was formed in the following manner: in the sample 10, the pair of electrodes 21 and 22 was formed, and after the surface of the oxide semiconductor film was subjected to cleaning treatment using a phosphoric acid solution in which 85% phosphoric acid was diluted by 100 times, the oxide semiconductor film was exposed to oxygen plasma generated in a dinitrogen monoxide atmosphere.

The conditions for generating oxygen plasma were similar to those for the sample 9 described in Example 4. Further, the oxide semiconductor film was exposed to the oxygen plasma for 300 seconds. The substrate temperature at this time was 350° C.

A transistor included in each sample has a channel length (L) of 6 µm and a channel width (W) of 50 µm.

<Vg-Id Characteristics>

Next, initial Vg-Id characteristics of the transistors included in the sample 10 and the sample 11 were measured. Here, change in characteristics of current flowing between a source electrode and a drain electrode (hereinafter referred to as the drain current), that is, Vg-Id characteristics were measured under the following conditions: the substrate temperature was 25° C., the potential difference between the source electrode and the drain electrode (hereinafter referred to as the drain voltage) was 1 V or 10 V, and the potential difference between the source electrode and the gate electrode (hereinafter referred to as the gate voltage) were changed from −15 V to +20 V.

Figure 53A:
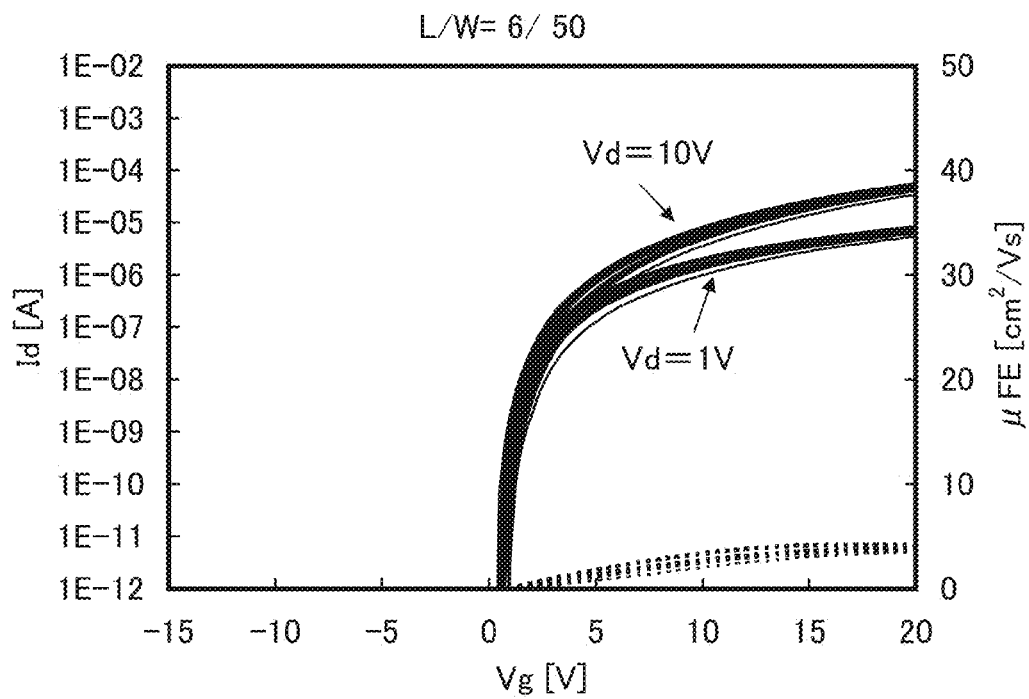
FIGS. 53A and 53B show Vg-Id characteristics of transistors.
Figure 53B:
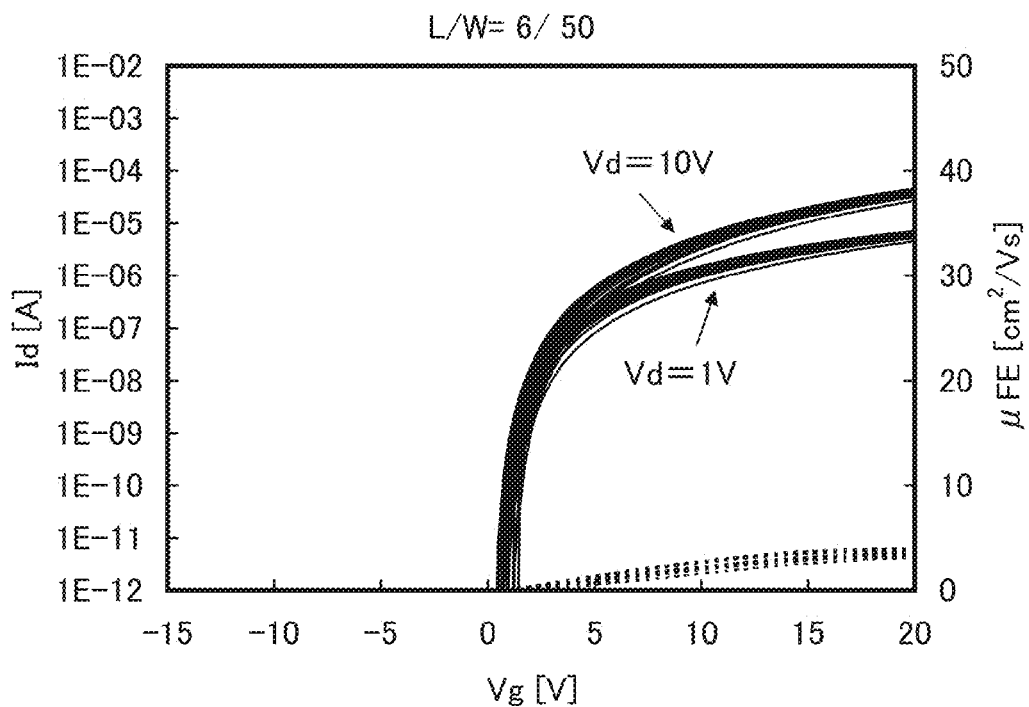

FIGS. 53A and 53B show the Vg-Id characteristics of the transistors included in the samples. In each graph in FIGS. 53A and 53B, the horizontal axis indicates gate voltage Vg, the left vertical axis indicates drain current Id, and the right vertical axis indicates field-effect mobility. Further, the solid lines indicate the Vg-Id characteristics at the drain voltages Vd of 1 V and 10 V, and the dashed lines indicate the field-effect mobility with respect to the gate voltages at the drain voltage Vd of 10 V. Note that the field effect mobility was obtained by operation of each sample in a saturation region.

Further, in each of the samples, 20 transistors having the same structure were formed on the substrate.

It is shown from FIGS. 53A and 53B that the samples 10 and 11 have favorable switching characteristics. Further, the threshold voltages of the sample 11 are shifted in the positive direction as compared with those of the sample 10. From the results shown in FIGS. 53A and 53B and the results of measuring the amount of released water by TDS in Example 4, the following is suggested: by exposure of the surface of the oxide semiconductor film to oxygen plasma generated in a dinitrogen monoxide atmosphere, the amount of oxygen supplied to the oxide semiconductor film is increased, and water contained in the oxide semiconductor film is released, whereby the transistor can have more excellent Vg-Id characteristics.

Note that when the oxide insulating film 23 was formed by a plasma CVD method, part of dinitrogen monoxide in a source gas became an oxygen radical in plasma and the radical was supplied to the oxide semiconductor film. Thus, the sample 10 has excellent Vg-Id characteristics without plasma treatment for exposure of the surface of the oxide semiconductor film to oxygen plasma generated in a dinitrogen monoxide atmosphere.

This application is based on Japanese Patent Application serial no. 2013-008628 filed with Japan Patent Office on Jan. 21, 2013, and Japanese Patent Application serial no. 2013-053192 filed with Japan Patent Office on Mar. 15, 2013, the entire contents of which are hereby incorporated by reference.

What is claimed is:

1. A semiconductor device comprising:
a gate electrode over a substrate;
a gate insulating film over the gate electrode;
an oxide semiconductor film over the gate insulating film, the oxide semiconductor film including In, M, and Zn, wherein M represents Al, Ti, Ga, Y, Zr, La, Ce, Nd, or Hf;
a pair of electrodes over the oxide semiconductor film, the pair of electrodes including copper; and
an oxide film between the oxide semiconductor film and the pair of electrodes, the oxide film including In, M, and Zn,
wherein the oxide semiconductor film includes a region serving as a channel region,
wherein the oxide film has a non-single-crystal structure and includes a c-axis aligned crystal,
wherein a proportion of M atoms in the oxide film is higher than a proportion of M atoms in the oxide semiconductor film, and
wherein an atomic ratio of metal element in the oxide film satisfies M>In and Zn >M.

2. The semiconductor device according to claim 1, wherein the pair of electrodes is electrically connected to the region serving as the channel region through the oxide film.

3. The semiconductor device according to claim 1, wherein the gate electrode includes copper and titanium.

4. The semiconductor device according to claim 1, wherein the pair of electrodes further includes titanium.

5. The semiconductor device according to claim 1, wherein a concentration of silicon of the oxide semiconductor film is lower than or equal to $2 \times 10^{18}$ atoms/cm$^3$.

6. A semiconductor device comprising:
a gate electrode over a substrate;
a gate insulating film over the gate electrode;
an oxide semiconductor film over the gate insulating film, the oxide semiconductor film including In, Ga, and Zn;
a pair of electrodes over the oxide semiconductor film, the pair of electrodes including copper; and
an oxide film between the oxide semiconductor film and the pair of electrodes, the oxide film including In, Ga, and Zn,
wherein the oxide semiconductor film includes a region serving as a channel region,
wherein the oxide film has a non-single-crystal structure and includes a c-axis aligned crystal,
wherein a proportion of Ga atoms in the oxide film is higher than a proportion of Ga atoms in the oxide semiconductor film, and
wherein an atomic ratio of metal element in the oxide film satisfies Ga>In and Zn>Ga.

7. The semiconductor device according to claim 6, wherein the pair of electrodes is electrically connected to the region serving as the channel region through the oxide film.

8. The semiconductor device according to claim 6, wherein the gate electrode includes copper and titanium.

9. The semiconductor device according to claim 6, wherein the pair of electrodes further includes titanium.

10. The semiconductor device according to claim 6, wherein a concentration of silicon of the oxide semiconductor film is lower than or equal to $2 \times 10^{18}$ atoms/cm$^3$.

11. A semiconductor device comprising:
a gate electrode over a substrate;
a gate insulating film over the gate electrode;
an oxide semiconductor film over the gate insulating film;

a pair of electrodes over the oxide semiconductor film, the pair of electrodes including copper; and an oxide film between the oxide semiconductor film and the pair of electrodes, wherein the oxide semiconductor film includes a region serving as a channel region, wherein the oxide film has a non-single-crystal structure and includes a c-axis aligned crystal, wherein an energy at a conduction band bottom of the oxide film is closer to a vacuum level than an energy at a conduction band bottom of the oxide semiconductor film, and wherein a difference between an energy at the conduction band bottom of the oxide film and an energy at the conduction band bottom of the oxide semiconductor film is 0.05 eV or more and 2 eV or less.

12. The semiconductor device according to claim 11, wherein the pair of electrodes is electrically connected to the region serving as the channel region through the oxide film.

13. The semiconductor device according to claim 11, wherein the gate electrode includes copper and titanium.

14. The semiconductor device according to claim 11, wherein the pair of electrodes further includes titanium.

15. The semiconductor device according to claim 11, wherein a concentration of silicon of the oxide semiconductor film is lower than or equal to $2 \times 10^{18}$ atoms/cm$^3$.

16. A semiconductor device comprising:
a gate electrode over a substrate;
a gate insulating film over the gate electrode;
an oxide semiconductor film over the gate insulating film, the oxide semiconductor film including In, Ga and Zn;
a pair of electrodes over the oxide semiconductor film, the pair of electrodes including copper; and
an oxide film between the oxide semiconductor film and the pair of electrodes, the oxide film including In, Ga, and Zn, wherein the oxide semiconductor film includes a region serving as a channel region, wherein the oxide film has a non-single-crystal structure and includes a c-axis aligned crystal, wherein an energy at a conduction band bottom of the oxide film is closer to a vacuum level than an energy at a conduction band bottom of the oxide semiconductor film, and wherein a difference between an energy at the conduction band bottom of the oxide film and an energy at the conduction band bottom of the oxide semiconductor film is 0.05 eV or more and 2 eV or less.

17. The semiconductor device according to claim 16, wherein the pair of electrodes is electrically connected to the region serving as the channel region through the oxide film.

18. The semiconductor device according to claim 16, wherein the gate electrode includes copper and titanium.

19. The semiconductor device according to claim 16, wherein the pair of electrodes further includes titanium.

20. The semiconductor device according to claim 16, wherein a concentration of silicon of the oxide semiconductor film is lower than or equal to $2 \times 10^{18}$ atoms/cm$^3$.

* * * * *